(12) United States Patent
Hong et al.

(10) Patent No.: US 10,748,774 B2
(45) Date of Patent: Aug. 18, 2020

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Ming-Hwei Hong, Hsinchu County (TW); Juei-Nai Kwo, Hsinchu County (TW); Yen-Hsun Lin, Changhua County (TW); Keng-Yung Lin, Tainan (TW); Bo-Yu Yang, New Taipei (TW); Hsien-Wen Wan, Kaohsiung (TW)

(73) Assignees: TAIWAN SEMICONDUCTOR MANUFACTURING CO., LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 0 days.

(21) Appl. No.: 16/191,268

(22) Filed: Nov. 14, 2018

(65) Prior Publication Data
US 2019/0164767 A1     May 30, 2019

Related U.S. Application Data

(60) Provisional application No. 62/593,139, filed on Nov. 30, 2017.

(51) Int. Cl.
*H01L 21/28*     (2006.01)
*H01L 29/51*     (2006.01)
(Continued)

(52) U.S. Cl.
CPC ...... *H01L 21/28264* (2013.01); *H01L 21/022* (2013.01); *H01L 21/0228* (2013.01); *H01L 21/02178* (2013.01); *H01L 21/02181* (2013.01); *H01L 21/02189* (2013.01); *H01L 21/02192* (2013.01); *H01L 21/02318* (2013.01); *H01L 21/02337* (2013.01); *H01L 29/513* (2013.01); *H01L 29/517* (2013.01); *H01L 29/66439* (2013.01); *H01L 29/66522* (2013.01); *H01L 29/66568* (2013.01); *H01L 29/66977* (2013.01); *H01L 29/775* (2013.01);
(Continued)

(58) Field of Classification Search
CPC .......... H01L 21/0228; H01L 21/02192; H01L 21/02178; H01L 21/022; H01L 21/02318; H01L 29/517
See application file for complete search history.

(56) References Cited

U.S. PATENT DOCUMENTS

| | | | |
|---|---|---|---|
| 8,383,484 B2* | 2/2013 | Haneda | ............. H01L 21/28088 257/E21.409 |
| 8,962,400 B2 | 2/2015 | Tsai et al. | |

(Continued)

*Primary Examiner* — Hsien Ming Lee
(74) *Attorney, Agent, or Firm* — Maschoff Brennan

(57) ABSTRACT

A method for manufacturing a semiconductor device includes forming a first high-k dielectric layer on a semiconductor substrate; forming a second high-k dielectric layer on the first high-k dielectric layer, in which the second high-k dielectric layer includes a material different from a material of the first high-k dielectric layer; annealing the first and second high-k dielectric layers, such that the first and second high-k dielectric layers are inter-diffused; and forming a gate electrode over the second high-k dielectric layer.

20 Claims, 57 Drawing Sheets

(51) Int. Cl.
  *H01L 21/02* (2006.01)
  *H01L 29/66* (2006.01)
  *H01L 29/775* (2006.01)
  *H01L 29/78* (2006.01)
  *H01L 29/06* (2006.01)
  *H01L 21/265* (2006.01)
  *H01L 29/423* (2006.01)
  *H01L 29/24* (2006.01)

(52) U.S. Cl.
  CPC ...... *H01L 29/785* (2013.01); *H01L 21/26546* (2013.01); *H01L 29/0673* (2013.01); *H01L 29/24* (2013.01); *H01L 29/42392* (2013.01); *H01L 29/66742* (2013.01); *H01L 29/66795* (2013.01)

(56) References Cited

U.S. PATENT DOCUMENTS

| | | | |
|---|---|---|---|
| 9,093,514 B2 | 7/2015 | Tsai et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,613,866 B2 * | 4/2017 | Ando | H01L 21/2636 |
| 9,812,363 B1 | 11/2017 | Liao et al. | |
| 9,859,380 B2 | 1/2018 | Lee et al. | |
| 2005/0269634 A1 * | 12/2005 | Bojarczuk, Jr. | H01L 21/28079 257/338 |
| 2008/0087890 A1 * | 4/2008 | Ahn | C23C 16/405 257/43 |
| 2013/0122720 A1 * | 5/2013 | Takebayashi | C23C 16/40 438/763 |
| 2015/0035085 A1 * | 2/2015 | Ahmed | H01L 21/02181 257/410 |
| 2017/0005175 A1 * | 1/2017 | Song | H01L 21/28185 |

* cited by examiner

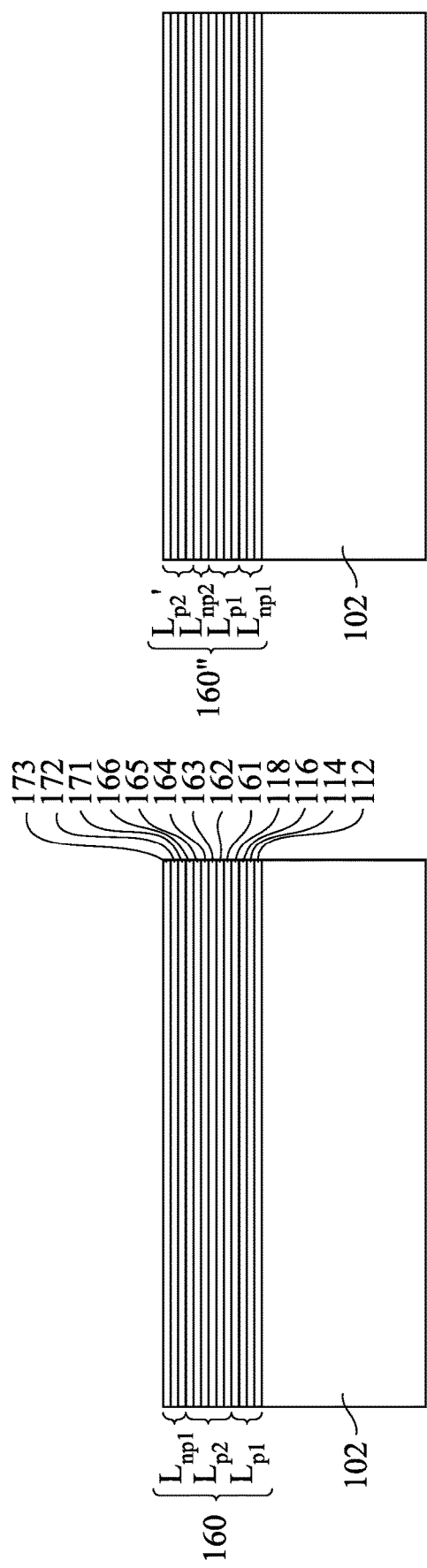
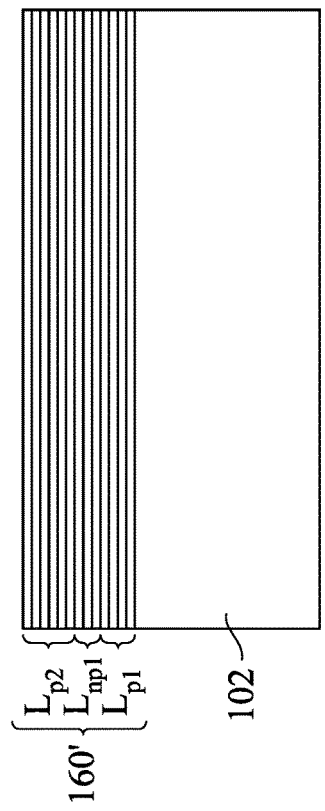
Fig. 1G
Fig. 1H
Fig. 1I

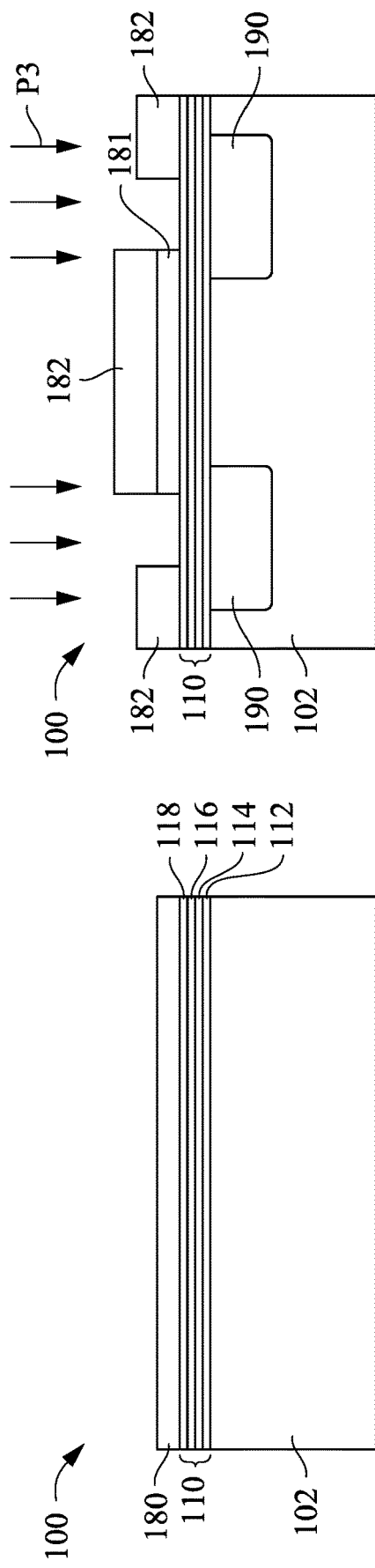
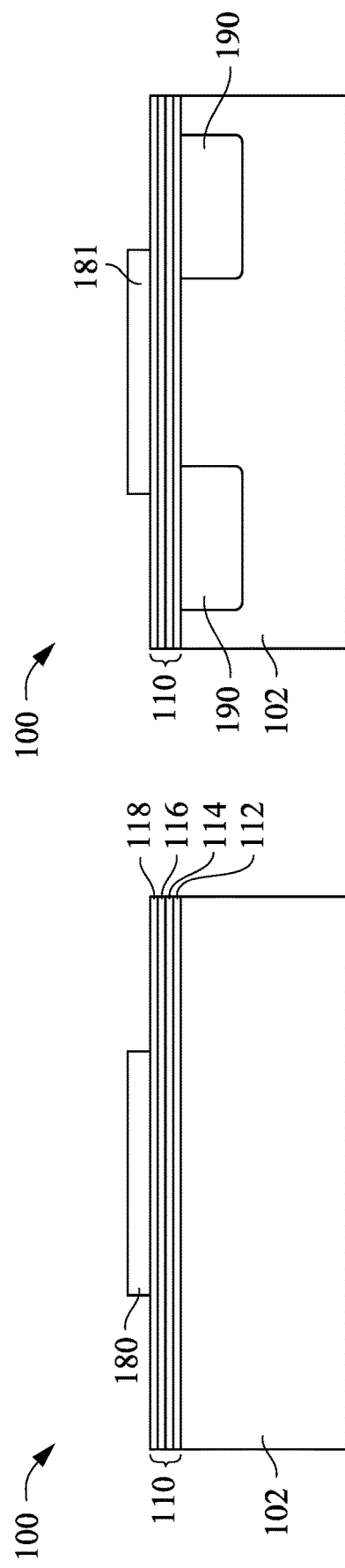
Fig. 4
Fig. 5
Fig. 2
Fig. 3

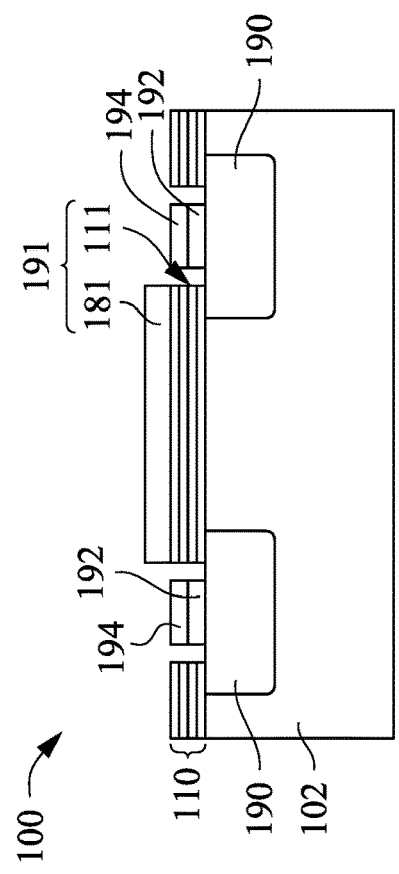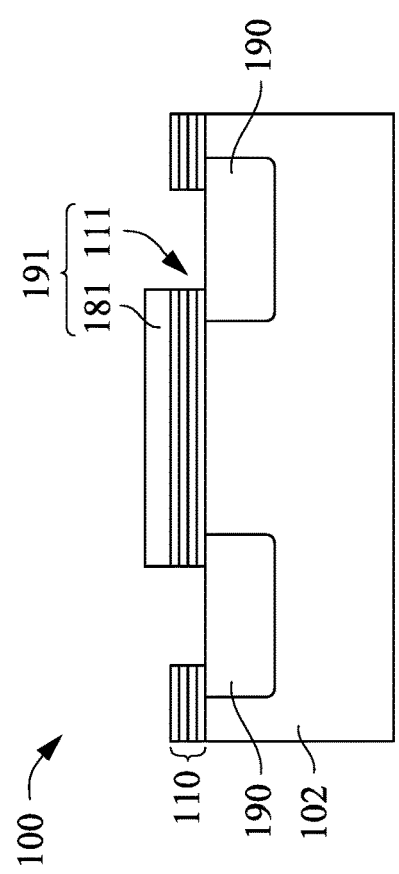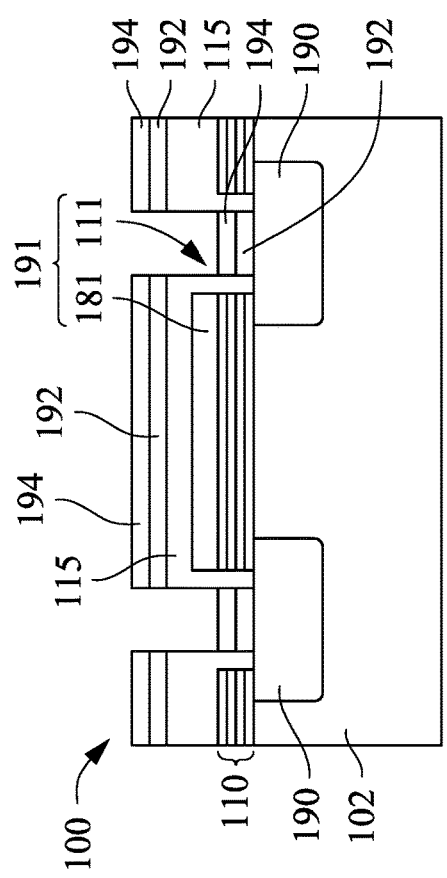

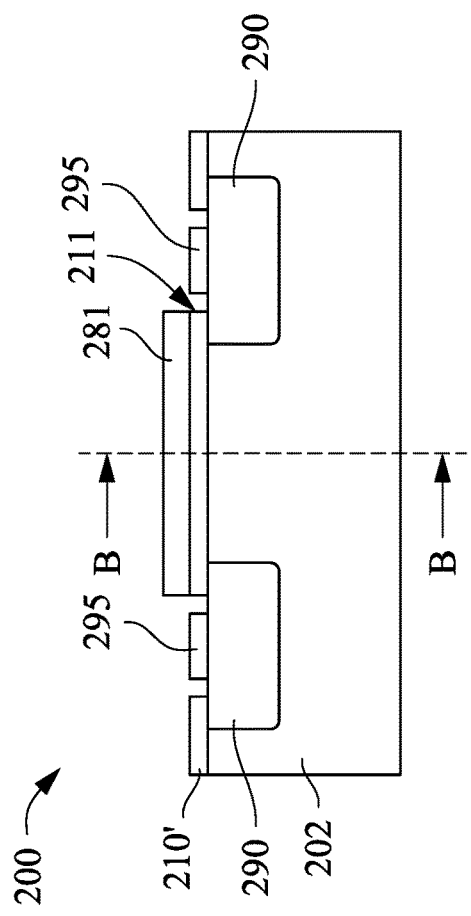
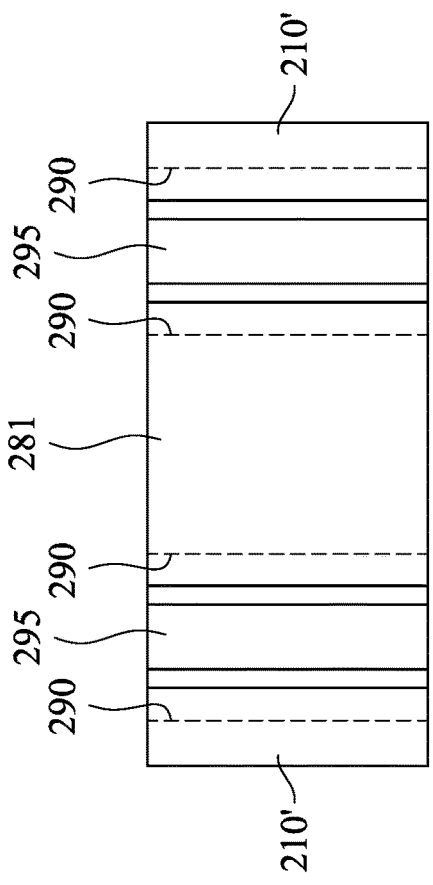
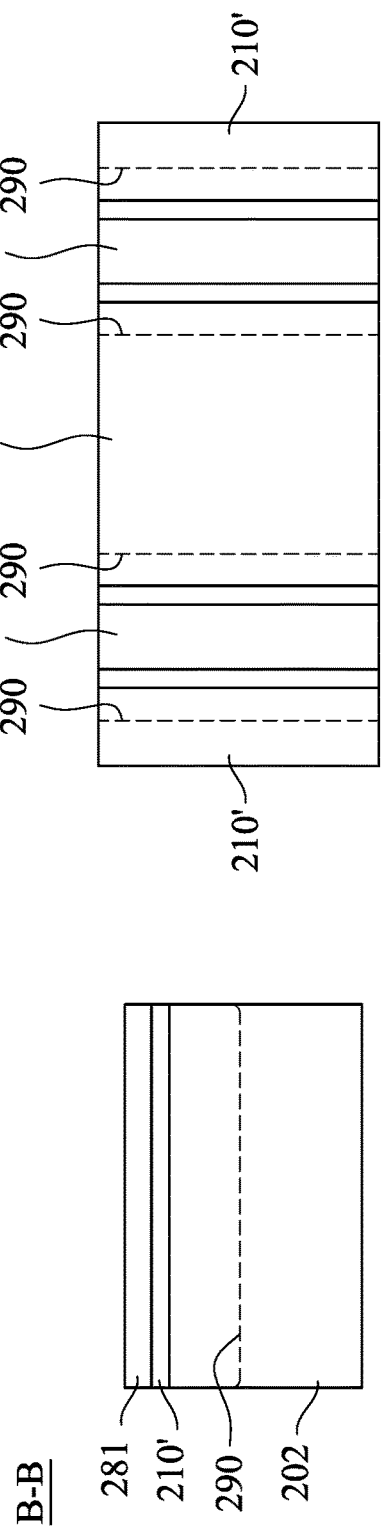
Fig. 12A
Fig. 12B
Fig. 12C

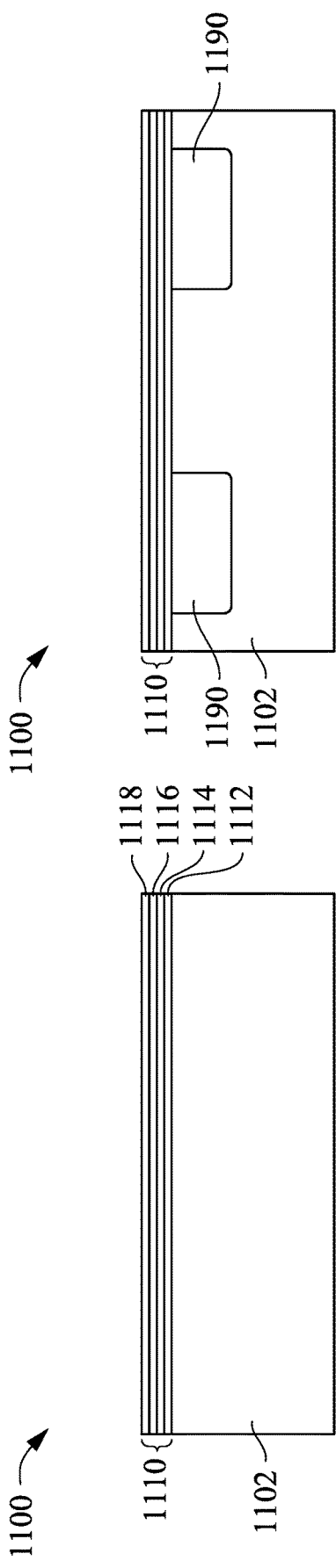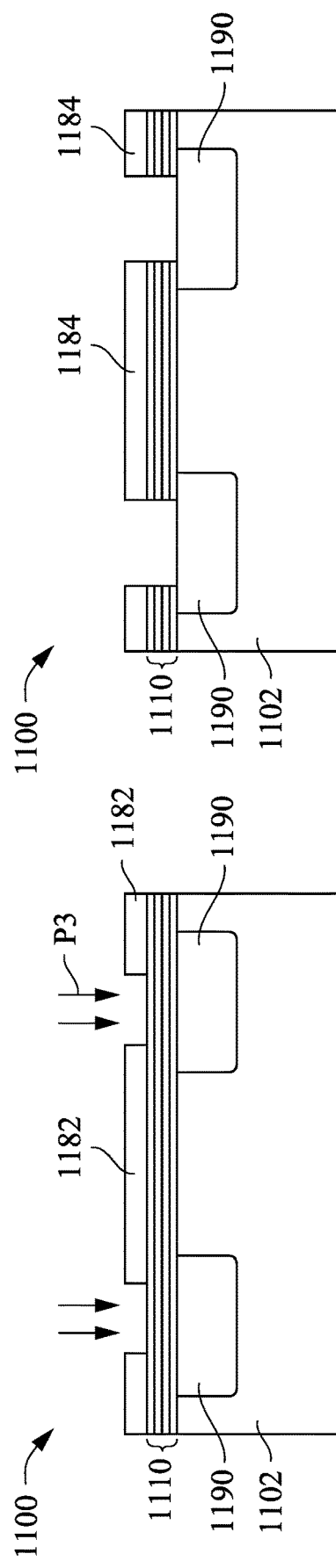
Fig. 13A
Fig. 13B
Fig. 13C
Fig. 13D

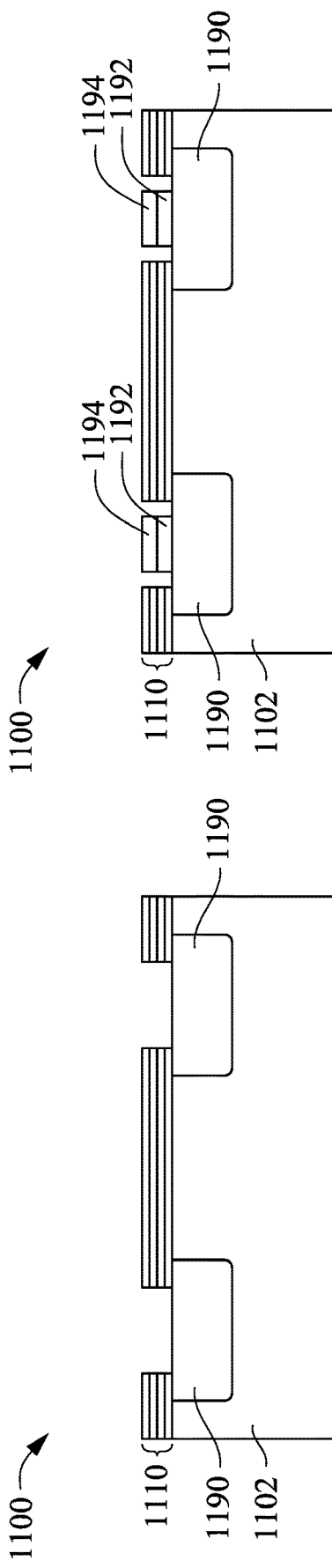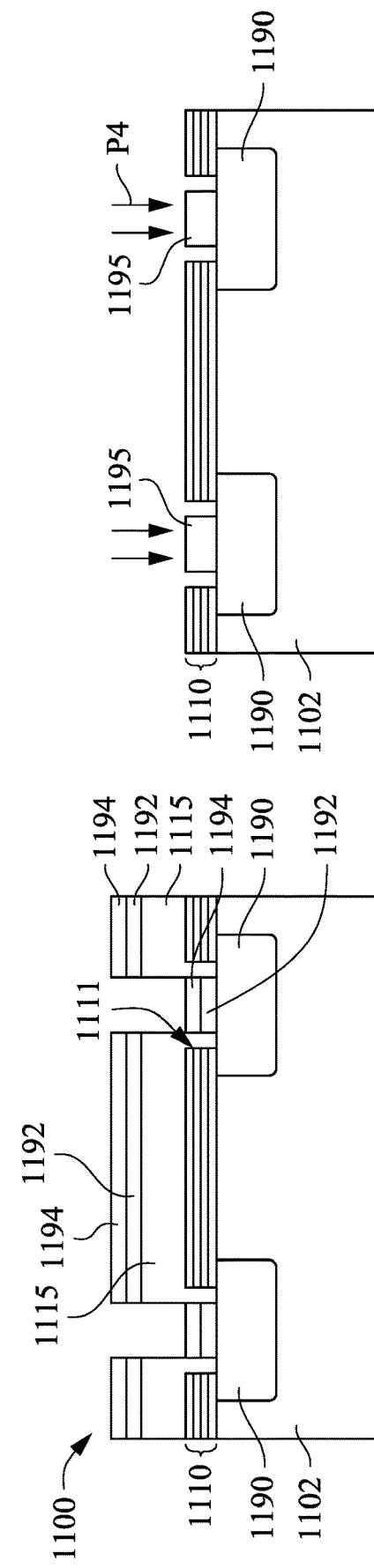

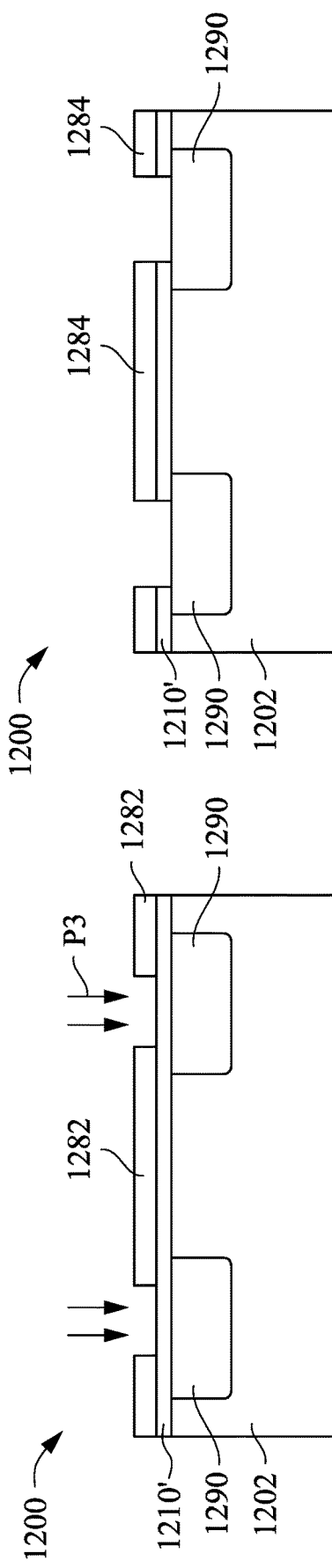
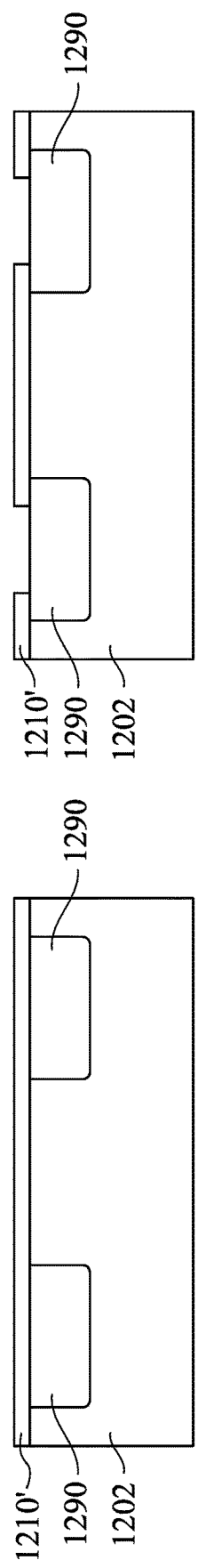
Fig. 14C
Fig. 14E
Fig. 14D
Fig. 14F

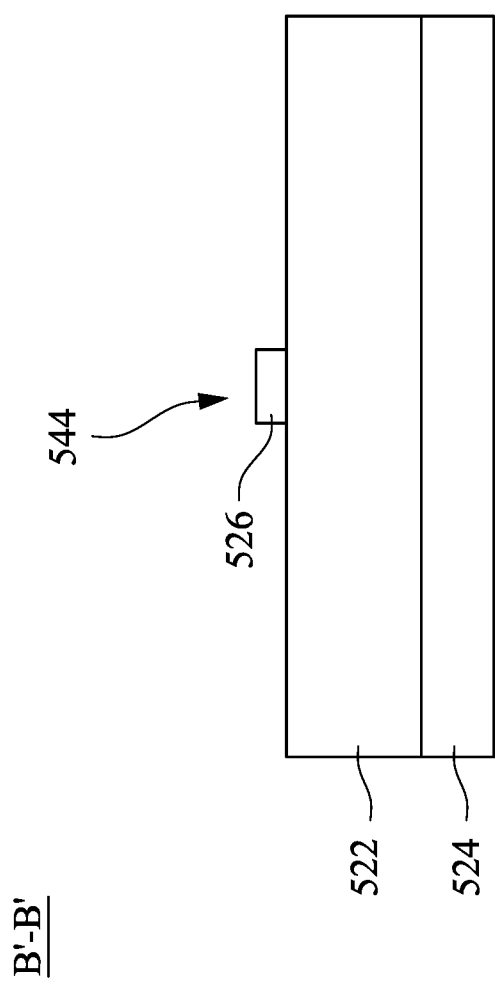

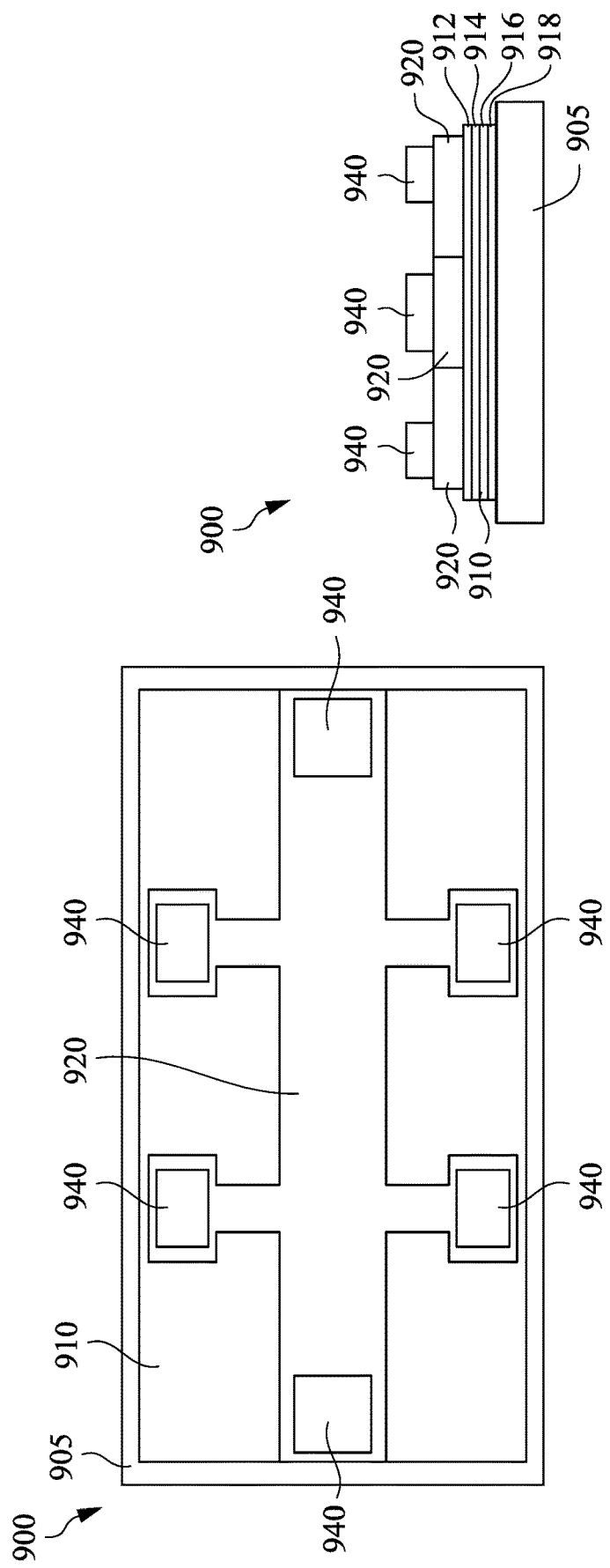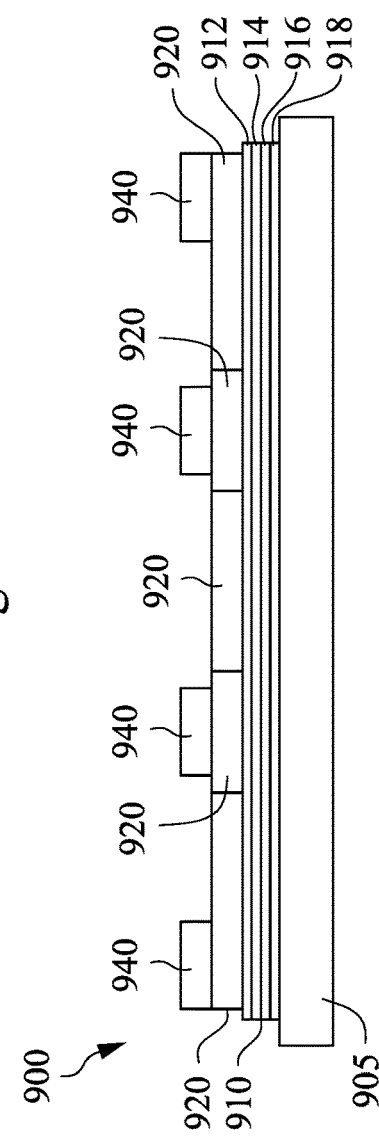

SEMICONDUCTOR DEVICE AND MANUFACTURING METHOD THEREOF

PRIORITY CLAIM AND CROSS-REFERENCE

This application claims priority to U.S. Provisional Application Ser. No. 62/593,139, filed Nov. 30, 2017, which is herein incorporated by reference.

BACKGROUND

Manufacturing of an integrated circuit (IC) has been driven by increasing the density of the IC formed in a semiconductor device. This is accomplished by implementing more aggressive design rules to allow a larger density of the IC device to be formed. Nonetheless, the increased density of IC devices, such as transistors, has also increased the complexity of processing semiconductor devices with decreased feature sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2, 3, 4, 5, 6, 7, 8, and 9A are cross-section views of a semiconductor device at various stages of fabrication in accordance with some embodiments of the present disclosure. FIGS. 1C-1I are cross-section views of some other semiconductor devices at the stage of fabrication substantially the same as FIG. 1A in accordance with some embodiments of the present disclosure.

FIGS. 10, 11A, and 12A are cross-section views of a semiconductor device at various stages of fabrication in accordance with some embodiments of the present disclosure. FIG. 12B is a cross-section view along line B-B in FIG. 12A. FIG. 12C is a top view of the semiconductor device 200 in FIG. 12A.

FIGS. 13A-13J are cross-section views of a semiconductor device at various stages of fabrication in accordance with some embodiments of the present disclosure.

FIGS. 14A-14K are cross-section views of a semiconductor device at various stages of fabrication in accordance with some embodiments of the present disclosure.

FIGS. 19B, 20B, 21B, 22B, 23B, and 24B are cross-section views along line B'-B' in FIGS. 19A, 20A, 21A, 22A, 23A, and 24A respectively.

FIG. 31A is a top view of a back gate TI FET in accordance with some embodiments of the present disclosure. FIGS. 31B and 31C are different side views of the back gate TI FET in accordance with some embodiments of the present disclosure.

DETAILED DESCRIPTION

Figure 1B:
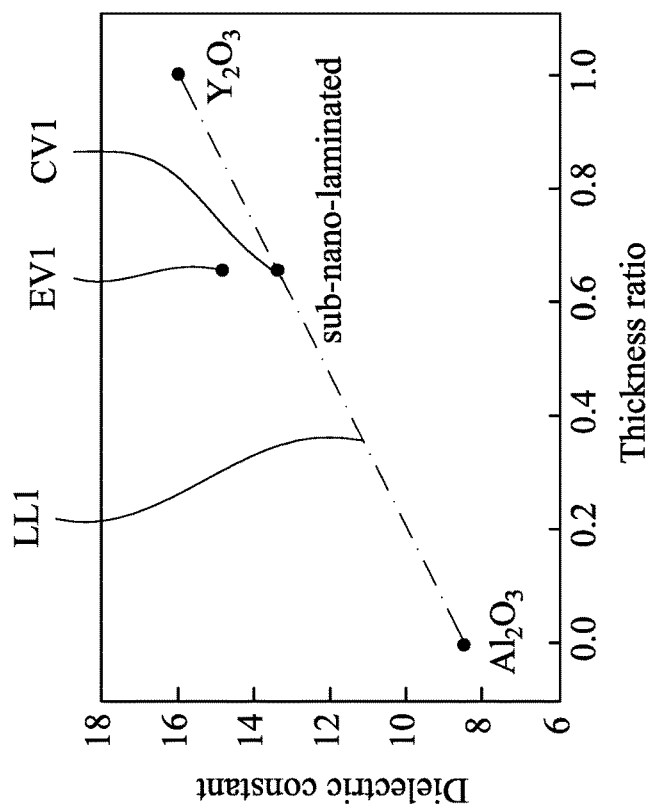
FIG. 1B is a graph showing a dielectric constant as a function of a thickness ratio between two different high-k dielectric layers for the exemplary structure of FIG. 1A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure provide an improved high-k dielectric layer, which may be employed in any of a variety of device types. For example, embodiments of the present disclosure may be used to form gate stacks suitable for use in planar bulk metal-oxide-semiconductor field-effect transistors (MOSFETs), multi-gate transistors (planar or vertical) such as Fin Field-effect transistor (Fin-FET) devices, gate-all-around (GAA) devices, Omega-gate (Q-gate) devices, or Pi-gate (Π-gate) devices, as well as strained-semiconductor devices, silicon-on-insulator (SOI) devices, partially-depleted SOI devices, fully-depleted SOI devices, or the like. In addition, embodiments disclosed herein may be employed in the formation of P-type and/or N-type devices.

Figure 9B:
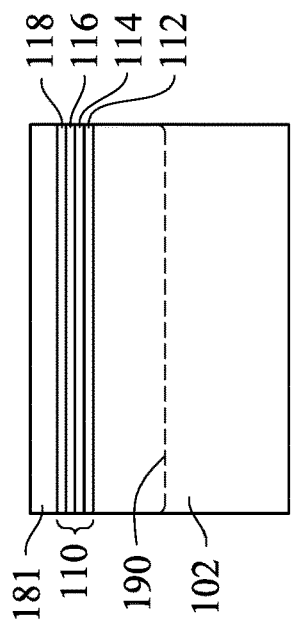
FIG. 9B is a cross-section view along line B-B in FIG. 9A.
Figure 9C:
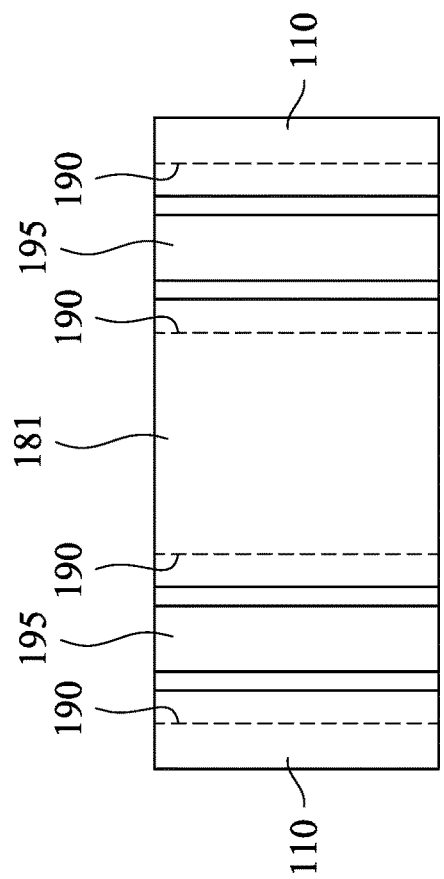
FIG. 9C is a top view of the semiconductor device in FIG. 9A.
Figure 9A:
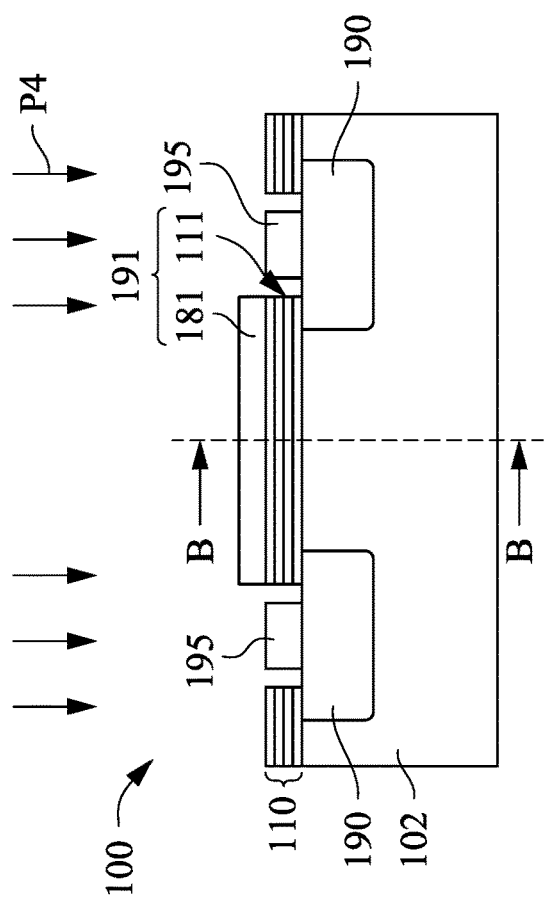

FIGS. 1A, 2, 3, 4, 5, 6, 7, 8, and 9A are cross-section views of a semiconductor device 100 at various stages of fabrication in accordance with some embodiments of the present disclosure. FIG. 1B is a graph showing a dielectric constant as a function of a thickness ratio between two different high-k dielectric layers for the exemplary structure of FIG. 1A. FIGS. 1C-1I are cross-section views of some other semiconductor devices at the stage of fabrication substantially the same as FIG. 1A in accordance with some embodiments of the present disclosure. FIG. 9B is a cross-section view along line B-B in FIG. 9A, and FIG. 9C is a top view of the semiconductor device 100 in FIG. 9A.

Figure 1A:
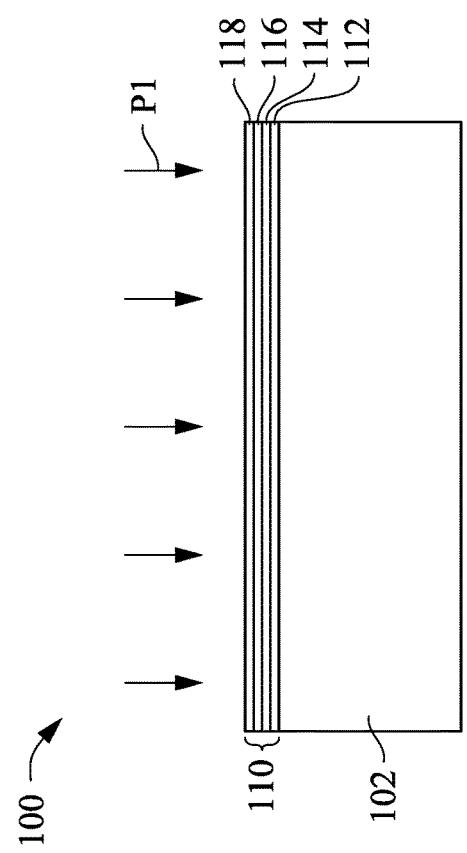

Reference is made to FIG. 1A. A dielectric stack 110 is formed over a substrate 102. The substrate 102 may be a bulk silicon substrate. In some embodiments, the substrate 102 may include an elementary semiconductor, such as silicon (Si) or germanium (Ge) in a crystalline structure; a compound semiconductor, such as silicon germanium (SiGe), silicon carbide (SIC), gallium arsenic (GaAs), gallium phosphide (GaP), indium phosphide (InP), indium arsenide (InAs), and/or indium antimonide (InSb); or combinations thereof. In some embodiments, the substrate 102 has a (001) surface orientation. For example, the substrate 102 is a GaAs substrate with the (001) surface orientation. Possible substrates 102 also include a silicon-on-insulator (SOI) substrate. The SOI substrate is fabricated using separation by implantation of oxygen (SIMOX), wafer bonding, and/or other suitable methods. Some exemplary substrates 102 also include an insulator layer. The insulator layer includes suitable materials such as silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor substrates 102, the insulator layer is a component (e.g., layer) of a silicon-on-insulator substrate.

The substrate 102 may also include various doped regions. The doped regions may be doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, and/or using a raised structure. The substrate 102 may further include various active regions, such as regions configured for an N-type metal-oxide-semiconductor transistor device and regions configured for a P-type metal-oxide-semiconductor transistor device.

In some embodiments, the dielectric stack 110 is a multilayered structure. In some embodiments, the layers in the dielectric stack 110 are high-k dielectric with a dielectric constant higher than that of silicon oxide (about 3.9). For example, in some embodiments, at least one of the layers of the dielectric stack 110 is made of metal oxide, such as $Al_2O_3$, $Ga_2O_3$, $In_2O_3$, or the like. In some embodiments, at least one of the layers of the dielectric stack 110 is made of transition metal oxide, such as $HfO_2$, $ZrO_2$, $TiO_2$, or the like. In some embodiments, at least one of the layers of the dielectric stack 110 is made of rare-earth metal oxide, such as $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3Yb_2O_3$, $Lu_2O_3$, or the like. In some embodiments, at least one of the layers of the dielectric stack 110 is made of a mixed oxide with the formula $A_xB_{2-x}O_3$, where A could be either non rare-earth metal or rare-earth metal, B could be either non rare-earth metal or rare-earth metal that is different from A.

In some embodiments, the arrangement of the layers in the dielectric stack 110 is periodic and expressed as:

$$(L_1/L_2/ \ldots /L_N)/(L_1/L_2/ \ldots /L_N)/ \ldots /(L_1/L_2/ \ldots /L_N);$$

where $L_1, L_2, \ldots, L_N$ represent layers in the dielectric stack 110 respectively, at least two of the layers $L_1, L_2, \ldots, L_N$ may be made of materials different from each other or may be made of the same material, a combination of N layers $(L_1/L_2/ \ldots /L_N)$ is referred to as a periodic unit of the dielectric stack 110, and N is an integer (>1) and represents a number of the layers in the periodic unit. It is noted that the number of layers in the dielectric stack 110 may vary depending on the actual design of the semiconductor device 100.

For example, parameters for the aforementioned periodic rule of the dielectric stack 110 may be N=2, $L_1=Y_2O_3$, and $L_2=Al_2O_3$. In this case, the dielectric stack 110 is a stack of $Y_2O_3$ layer/$Al_2O_3$ layer/$Y_2O_3$ layer/$Al_2O_3$ layer/ . . . /$Y_2O_3$ layer/$Al_2O_3$ layer. Take FIG. 1A as an exemplary embodiment, the dielectric stack 110 includes four layers 112, 114, 116, and 118. In the embodiment, the layer 112 is made of $Y_2O_3$, the layer 114 is made of $Al_2O_3$, the layer 116 is made of $Y_2O_3$, and the layer 118 is made of $Al_2O_3$. That is, an $Al_2O_3$ layer and an $Y_2O_3$ layer next to the $Al_2O_3$ layer are in combination serve as a periodic unit for the dielectric stack 110. In the depicted embodiments, two periodic units are present in the dielectric stack 110, but the present disclosure is not limited thereto. Due to more than one periodic unit in the dielectric stack 110, the $Al_2O_3$ layers and the $Y_2O_3$ layers are arranged in an alternating manner. In some embodiments, thicknesses of the layers 112, 114, 116, and 118 are substantially the same, but the present disclosure is not limited thereto. In some embodiments, the bottommost layer (e.g., layer 112) in the dielectric stack 110 is made of $Y_2O_3$, so that the $Al_2O_3$ layers in the dielectric stack 110 are separated from the substrate 102. In some embodiments where the substrate 102 is a GaAs substrate having a (001) surface, if an $Al_2O_3$ layer is formed directly on the (001) surface of the GaAs substrate 102, aluminum may be diffused from the $Al_2O_3$ layer into the GaAs substrate 102. However, in the present embodiments, the aluminum diffusion can be mitigated because the $Al_2O_3$ layers in the dielectric stack 110 are separated from the substrate 102. In other words, the aluminum-free high-k dielectric layer 112 is interposed between the GaAs substrate 102 and the aluminum-containing high-k dielectric layer 114, so that the aluminum-containing high-k dielectric layer 114 can be separated from the GaAs substrate 102.

In some embodiments, the dielectric stack 110 is formed using one or more atomic layer deposition (ALD) processes P1. The ALD process P1 employs a precursor material which can react with or chemisorb on a surface in process to build up successively deposited layers, each of which layers being characterized with thickness about an atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles. In FIG. 1A, the layer 112 is deposited using an ALD process P1 and thus has a thickness based on the deposition cycles of ALD processes P1. The precursor (and/or the reactant) in every cycle can be the same or different.

The ALD process P1 may include plural reaction cycles to form a desired thickness of the layer 112. As a result, the thickness of the layer 112 can be controlled using cycle times of the ALD process P1. In some embodiments, the ALD process P1 may include three cycles to form the layer 112 with a thickness ranging from about 1 Å to about 5 Å. If the thickness of the layer 112 is greater than about 5 Å, the dielectric constant might not be improved, which will be discussed in greater detail below with respect to FIG. 1B. If the thickness of the layer 112 is less than about 1 Å, the isolation between the substrate 102 and a subsequently formed gate electrode 181 (as shown in FIG. 4) might be unsatisfactory, thus resulting in an increased gate leakage current.

In some embodiments, the ALD process P1 for forming the layer 112 is performed in a temperature range from about 250° C. to about 300° C., in a pressure range from about 4 to about 6 torr, and utilizes $Y(EtCp)_3$ as a precursor and $H_2O$ as a co-reactant. In some embodiments, the ALD process P1 for forming the layer 112 is performed in a temperature range from about 200° C. to about 400° C., in a pressure range from about 4 to about 6 torr, and utilizes $Y(Cp)_3$ as a precursor and $H_2O$ as a co-reactant. In some embodiments, the ALD process P1 for forming the layer 112 is performed in a temperature range from about 150° C. to about 300° C., in a pressure range from about 4 to about 6 torr, and utilizes $Y(iPr_2\ amd)_3$ as a precursor and $H_2O$ as a co-reactant. In some embodiments, the ALD process P1 for forming the layer 112 is performed in a temperature range from about 250° C. to about 350° C., in a pressure range from about 4 to about 6 torr, and utilizes $Y(thd)_3$ as a precursor and $H_2O$ as a co-reactant. If the conditions of the ALD process P1 for forming the layer 112 are out of the above ranges, the thickness of the layer 112 might fall out of the range from about 1 Å to about 5 Å, which in turn might lead to reduced dielectric constant or increased gate leakage current, as discussed previously. In some embodiments, precursors of the ALD process P1 for the $Y_2O_3$ may include $(iPrCp)_2Y(iPr-amd)$, $Y(MeCp)_3$, $Y(iPrCp)_3$, or combinations thereof. In some embodiments, co-reactants of the ALD process P1 for the $Y_2O_3$ may include $O_2$, $O_2$ plasma, O, $H_2O_2$, other oxygen-containing compound, or combinations thereof.

After the deposition of the $Y_2O_3$ layer 112, the layer 114, if made of $Al_2O_3$, may be deposited on the layer 112 using another ALD process P1. In some embodiments, the ALD process P1 may include three cycles to form the layer 114 with a thickness ranging from about 1 Å to about 5 Å. If the thickness of the layer 114 is greater than about 5 Å, the dielectric constant might not be improved, which will be discussed in greater detail below with respect to FIG. 1B. If the thickness of the layer 112 is less than about 1 Å, the isolation between the substrate 102 and a subsequently formed gate electrode 181 (as shown in FIG. 4) might be unsatisfactory, thus resulting in an increased gate leakage current.

Figure 33:
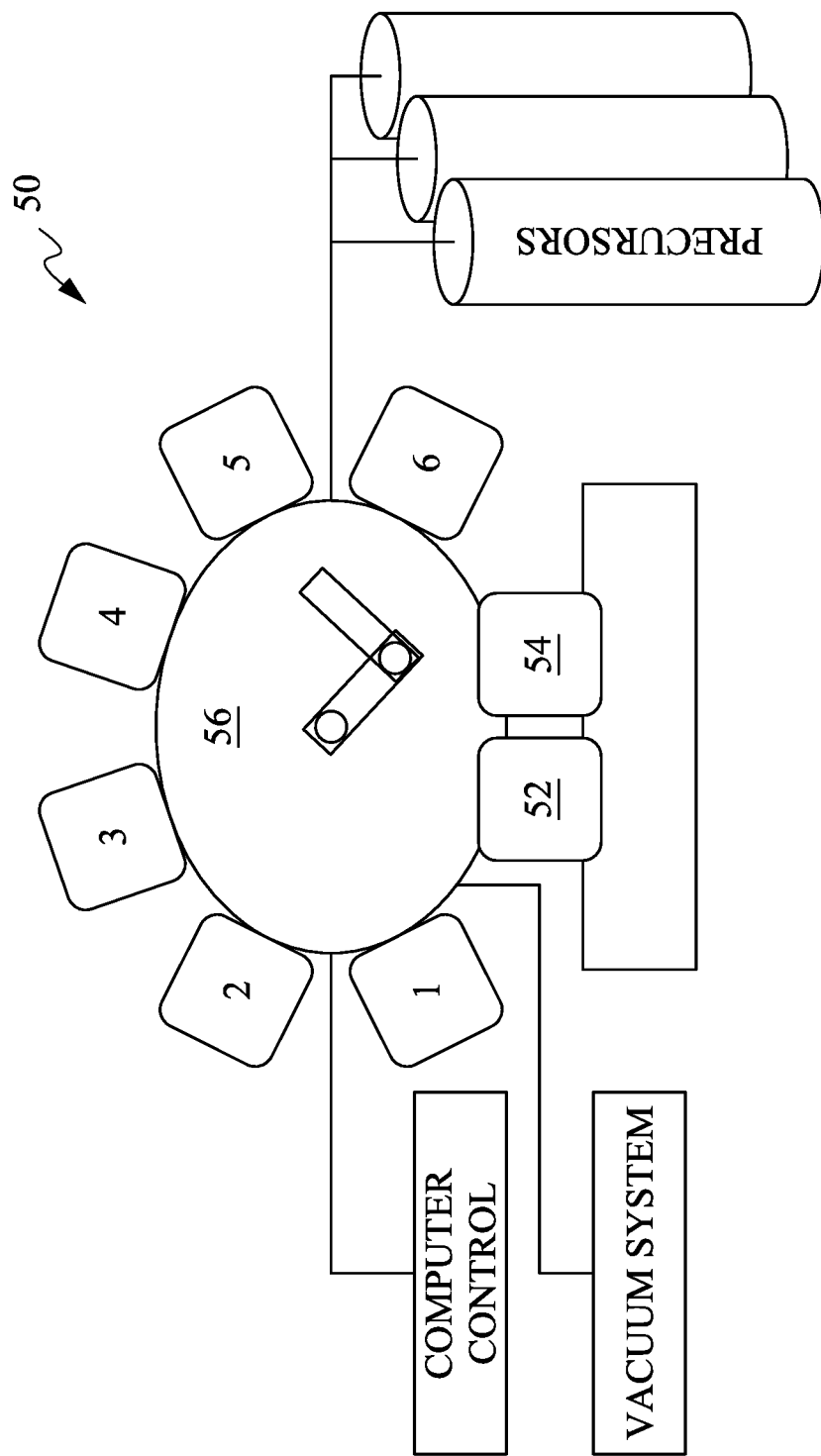
FIG. 33 is a schematic top-view diagram of an exemplary multi-chamber processing system in accordance with some embodiments of the present disclosure.

In some embodiments, the layers 112 and 114 are in-situ deposited in the same process apparatus (i.e., performed in the same ALD chamber). In some embodiments, the layers 112 and 114 are ex-situ formed in different process apparatuses (i.e., performed in different ALD chambers). For example, referring to FIG. 33, illustrated is a schematic top-view diagram of an exemplary multi-chamber processing system 50. In some embodiments, as shown in FIG. 33, the system 50 may be equivalently referred to as a "cluster tool." The system 50 may generally include load lock chambers 52 and 54, a wafer handling chamber 56, and a plurality of processing chambers 1-6. In various embodiments, the load lock chambers 52 and 54 provide for the transfer of substrates into and out of the system 50. In various embodiments, the system 50 is under vacuum, and the load lock chambers 52 and 54 may "pump down" the substrates introduced into the system 50 (e.g., by way of a mechanical pump and/or a turbomolecular pump). In some embodiments, the load lock chambers 52 and 54 may be adapted to receive a single wafer or a plurality of wafers (e.g., loaded into a cassette). By way of example, the load lock chambers 52 and 54 may be separated from the wafer handling chamber 56 by way of a gate valve, allowing the wafer handling chamber 56 to remain under vacuum when one or both of the load lock chambers 52 and 54 are vented.

In various embodiments, the wafer handling chamber 56 is equipped with an automated, robotic arm that may move smoothly along any of a horizontal, vertical, and/or rotational axis so as to transfer substrates between the load lock chambers 52 and 54 and any of the substrate processing chambers 1-6. Each processing chamber 1-6 may be configured to perform a number of substrate processing operations such as ALD, CVD, PVD, epitaxy, etching, pretreatment/pre-soak, de-gassing, annealing, as well as a number of metrology operations such as XPS analysis, AFM analysis, and/or other suitable processing or metrology operations. In various embodiments, the system 50 may have more or less processing chambers.

In some embodiments, at least two of the layers 112, 114, 116 and 118 are in-situ formed using ALD processes. By way of example, the ALD process of forming the layer 112, the ALD process of forming the layer 114, the ALD process of forming the layer 116, and the ALD process of forming the layer 118 are performed in the same processing chamber (e.g., one of the processing chamber 1-6 that is an ALD processing chamber), In greater detail, the layer 112 is not exposed to an external environment external to the processing chamber (e.g., the one of the processing chamber 1-6) after deposition of the layer 112 and before deposition of the layer 114. Similarly, the layer 114 is not exposed to an external environment external to the processing chamber (e.g., the one of the processing chamber 1-6) after deposition of the layer 114 and before deposition of the layer 116, and the layer 116 is not exposed to an external environment external to the processing chamber (e.g., the one of the processing chamber 1-6) after deposition of the layer 116 and before deposition of the layer 118.

In some embodiments, the ALD process P1 for depositing the layer 114 is performed in a temperature range from about 150° C. to about 350° C., in a pressure range from about 8 to about 10 torr, and utilizes TMA as a precursor and $H_2O$ as a co-reactant. In some embodiments, the ALD process P1 for depositing the layer 114 is performed in a temperature from range about 25° C. to about 150° C., in a pressure range from about 8 to about 10 torr, and utilizes TMA as a precursor and $O_2$ as a co-reactant. In some embodiments, the ALD process P1 for depositing the layer 114 is performed in a temperature range from about 150° C. to about 300° C., in a pressure range from about 8 to about 10 torr, and utilizes TMA as a precursor and $O_3$ as a co-reactant. If the conditions of the ALD process P1 for forming the layer 114 are out of the above ranges, the thickness of the layer 114 might fall out of the range from about 1 Å to about 5 Å, which in turn might lead to reduced dielectric constant or increased gate leakage current, as discussed previously. In some embodiments, precursors of the ALD process P1 for the $Al_2O_3$ layer may include DMA, AlCl$_3$, Al(OiPr)$_3$, or combinations thereof. In some embodiments, co-reactants of the ALD process P1 for the Al$_2$O$_3$ layer may include O$_2$, O, H$_2$O$_2$, other oxygen-containing compound, or combinations thereof.

After the deposition of the layer 114, the layers 116 and 118 respectively made of Y$_2$O$_3$ and Al$_2$O$_3$ are deposited on the layer 114 in sequence, so as to form the dielectric stack 110. In some embodiment, the layers 116 and 118 are formed by the methods substantially the same as that of the layers 112 and 114 and thus are not repeatedly described for the sake of brevity. In some embodiments, at least one of the layers of the dielectric stack 110 is formed by using vapor phase deposition methods. In some embodiments, at least one of the layers of the dielectric stack 110 is formed using a deposition technique such as molecular layer deposition (MLD), chemical vapor deposition (CVD), sputtering, molecular beam epitaxy (MBE), chemical beam epitaxy (CBE), or the like. In some embodiments where the substrate 102 is GaAs, the substrate 102 can be epitaxially grown on a semiconductor wafer (not shown) using an MBE process. In some embodiments, the MBE process and the ALD processes P1 are performed in different process chambers (e.g., two of the processing chambers 1-6 as shown in FIG. 33).

Reference is made to FIG. 1B. FIG. 1B is a graph showing a dielectric constant as a function of a thickness ratio of Y$_2$O$_3$ layer to Al$_2$O$_3$ layer under Vegard's law, in which the function is represented as a linear line LL1. The dielectric constant of Y$_2$O$_3$ is in a range from about 14 to about 18 and the dielectric constant of Al$_2$O$_3$ is in a range from about 7 to about 10. In general, the dielectric constant of a dielectric stack composed of Y$_2$O$_3$ layer and Al$_2$O$_3$ layer substantially satisfies Vegard's law and thus is on the linear line LL1 between about 8.5 and about 16. For example, the dielectric constant of the multi-layered dielectric stack may be the value CV1 on the linear line LL1.

However, if each layer of the dielectric stack (e.g., each layer 112, 114, 116, 118 of the dielectric stack 110) has a thickness less than about 5 Å, the polarizability of the dielectric stack can be enhanced, which in turn will improve the dielectric constant of the dielectric stack. For example, if the dielectric stack is made of alternatingly stacked Y$_2$O$_3$ layers and Al$_2$O$_3$ layers, and each layer has a thickness less than about 5 Å, the dielectric constant of the dielectric stack can be enhanced to an enhanced value EV1 higher than the corresponding value CV1 on the linear line LL1.

On the contrary, if an Y$_2$O$_3$ layer or an Al$_2$O$_3$ layer of the dielectric stack is greater than about 5 Å, the dielectric constant of the as-deposited dielectric stack might not be enhanced and thus remains on the linear line LL1. In such cases, the dielectric constant of the dielectric stack can be improved using an anneal process, which will be discussed in detail with respect to FIGS. 11A and 11B.

Figure 1E:
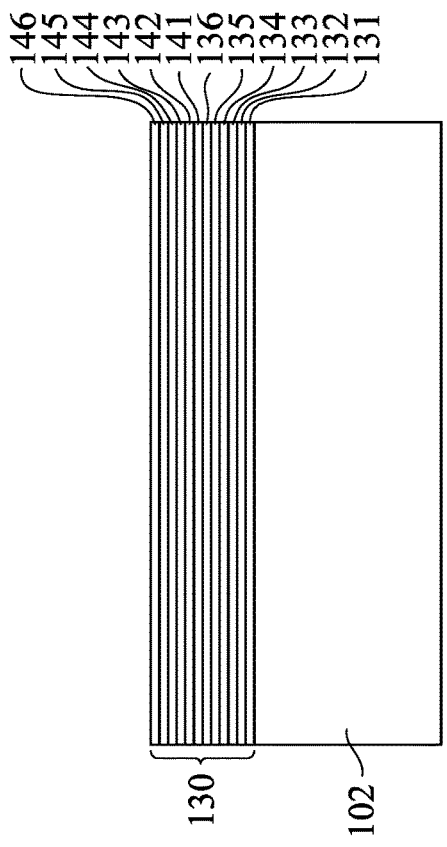
Figure 1F:
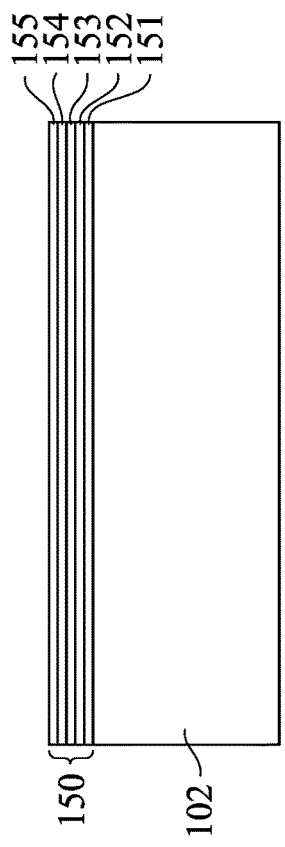
Figure 1C:
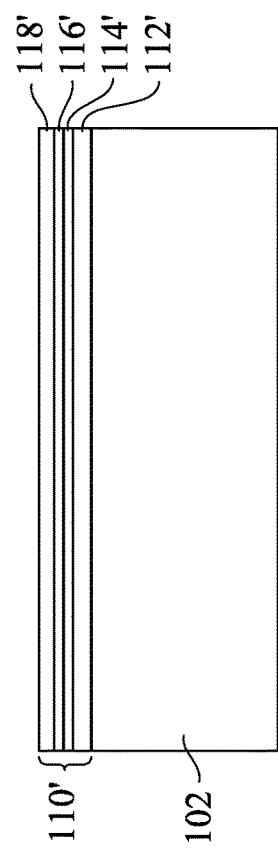
Figure 1D:
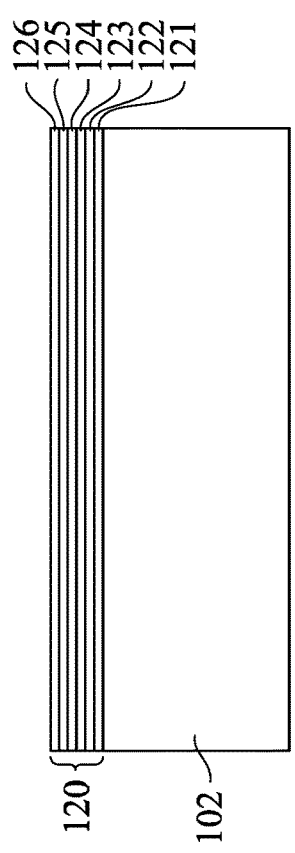

In some embodiments, the dielectric stack 110 may be replaced with one of dielectric stacks shown in FIGS. 1C-1H. In some embodiments, as shown in FIG. 1C, at least two layers in the dielectric stack 110' have different materials. In FIG. 1C, the layers 112', 114', 116', and 118' in the dielectric stack 110' have a thickness ratio of about 5:3:3:6. For example, the thicknesses of layers Y$_2$O$_3$/Al$_2$O$_3$/Y$_2$O$_3$/Al$_2$O$_3$ substantially are about 5 nm/3 nm/3 nm/6 nm respectively, but the present disclosure in not limited thereto.

In some embodiments, parameters for the aforementioned periodic rule of the dielectric stack 120 may be N=3, L$_1$=Y$_2$O$_3$, L$_2$=Al$_2$O$_3$, and L$_3$=HfO$_2$. In this case, the dielectric stack 120 is a stack of Y$_2$O$_3$ layer/Al$_2$O$_3$ layer/HfO$_2$ layer/Y$_2$O$_3$ layer/Al$_2$O$_3$ layer/HfO$_2$ layer/ . . . /Y$_2$O$_3$ layer/Al$_2$O$_3$ layer/HfO$_2$ layer. Take FIG. 1D as an exemplary embodiment, the dielectric stack 120 includes six layers 121, 122, 123, 124, 125, and 126. In the embodiment, the layer 121 is made of Y$_2$O$_3$, the layer 122 is made of Al$_2$O$_3$, the layer 123 is made of HfO$_2$, the layer 124 is made of Y$_2$O$_3$, the layer 125 is made of Al$_2$O$_3$, and the layer 126 is made of HfO$_2$. That is, the sequentially arranged Al$_2$O$_3$ layer, Y$_2$O$_3$ layer, and HfO$_2$ layer are in combination serve as a periodic unit for the dielectric stack 120. In the depicted embodiments, two periodic units are present in the dielectric stack 120, but the present disclosure is not limited thereto. In some embodiments, the dielectric stack 120 may be a stack of (Y$_2$O$_3$ layer/Al$_2$O$_3$ layer/Y$_2$O$_3$ layer/HfO$_2$ layer) and (Y$_2$O$_3$ layer/Al$_2$O$_3$ layer/Y$_2$O$_3$ layer/HfO$_2$ layer), with L$_1$=L$_3$=Y$_2$O$_3$ in the periodic rule as aforementioned. In some embodiments, thicknesses of the layers 121, 122, 123, 124, 125, and 126 are substantially the same, but the present disclosure is not limited thereto. In some embodiments, one of the layers in the dielectric stack 120 made of Y$_2$O$_3$ is in contact with the substrate 102, and the layers in the dielectric stack 120 made of Al$_2$O$_3$ or HfO$_2$ are separated from the substrate 102.

In some embodiments, as shown in FIG. 1E, the arrangement of the layers in the dielectric stack 130 is periodic and expressed as:

(L$_1$/L$_2$/ . . . /L$_N$)*A(L'$_1$/L'$_2$/ . . . /L'$_M$)*B; where L$_1$, L$_2$, . . . , L$_N$ represent layers of a first periodic layered structure in the dielectric stack 140 respectively, the layers L$_1$, L$_2$, . . . , L$_N$ are made of materials different from each other, a combination of N layers (L$_1$/L$_2$/ . . . /L$_N$) is referred to as a first periodic unit of the first periodic layered structure, L'$_1$, L'$_2$, . . . , L$_M$' represent layers of a second periodic layered structure in the dielectric stack 140 respectively, the layers L'$_1$, L'$_2$, . . . , L'$_M$ are made of materials different from each other, a combination of M layers (L'$_1$, L'$_2$, . . . , L'$_M$) is referred to as a second periodic unit of the second periodic layered structure, N is an integer (>1) and represents a number of the layers in the first periodic unit, M is an integer (>1) and represents a number of the layers in the second periodic unit; A is an integer (>1) represents the number of repetitions of the first periodic unit; and B is an integer (>1) represents the number of repetitions of the second periodic unit.

For example, parameters for the aforementioned periodic rule of the dielectric stack 130 may be N=3, A=2, M=2, B=3, L$_1$=Y$_2$O$_3$, L$_2$=Al$_2$O$_3$, L$_3$=HfO$_2$, L'$_1$=La$_2$O$_3$, L'$_2$=ZrO$_2$. In this case, the dielectric stack 130 includes layers 131, 132, 133, 134, 135, 136, 141, 142, 143, 144, 145, and 146 and is divided into two types of periodic layered structure adjacent to each other, i.e., first and second periodic layered structures. The first periodic layered structure includes layers 131, 132, 133, 134, 135, and 136 and has a first periodic unit that composed of the sequentially arranged Y$_2$O$_3$ layer, Al$_2$O$_3$ layer, and HfO$_2$ layer. In the depicted embodiments, two first periodic units are present in the first periodic layered structure, but the present disclosure is not limited thereto. Hence, the first periodic layered structure may be a stack of Y$_2$O$_3$ layer/Al$_2$O$_3$ layer/HfO$_2$ layer/Y$_2$O$_3$ layer/Al$_2$O$_3$ layer/HfO$_2$ layer. The second periodic layered structure includes layers 141, 142, 143, 144, 145, and 146 and has a second periodic unit composed of adjacent La$_2$O$_3$ layer and ZrO$_2$ layer. The number of repetitions of the second periodic unit in the second periodic layered structure is three, but the present disclosure is not limited thereto. Hence, the second periodic layered structure may be a stack of La$_2$O$_3$/ZrO$_2$/La$_2$O$_3$/ZrO$_2$/La$_2$O$_3$/ZrO$_2$. Then, the dielectric stack 130 is a stack of Y$_2$O$_3$ layer (layer 131)/Al$_2$O$_3$ layer (layer 132)/HfO$_2$ layer (layer 133)/Y$_2$O$_3$ layer (layer 134)/Al$_2$O$_3$ layer (layer 135)/HfO$_2$ layer (layer 136)/La$_2$O$_3$ layer (layer 141)/ZrO$_2$ layer (layer 142)/La$_2$O$_3$ layer (layer 143)/ZrO$_2$ layer (layer 144)/La$_2$O$_3$ layer (layer 145)/ZrO$_2$ layer (layer 146).

In some embodiments, as shown in FIG. 1F, the arrangement of the layers in the dielectric stack 150 is non-periodic layered structure and expressed as:

$L''_1/L''_2/\ldots/L''_K$; where $L''_1, L''_2, \ldots, L''_K$ represent layers of the dielectric stack 150, the layers $L''_1, L''_2, \ldots, L''_K$ are made of materials different from each other, and K is an integer and represents a number of the layers in the non-periodic layered structure. Take FIG. 1F as an exemplary embodiment, parameters for the aforementioned periodic rule of the dielectric stack 150 may be K=5, $L''_1=Y_2O_3$, $L''_2=Al_2O_3$, $L''_3=HfO_2$, $L''_4=La_2O_3$, $L''_5=ZrO_2$. The dielectric stack 150 includes layers 151, 152, 153, 154, and 155 and is a stack of Y$_2$O$_3$ layer (layer 151)/Al$_2$O$_3$ layer (layer 152)/HfO$_2$ layer (layer 153)/La$_2$O$_3$ layer (layer 154)/ZrO$_2$ layer (layer 155).

In some embodiments, as shown in FIG. 1G, the arrangement of the layers in the dielectric stack 160 is a layered structure with at least one periodic layered portion and at least one non-periodic layered portion, and expressed as:

$(L_p/L_{np})$;

$(L_{np}/L_p)$;

$(L_p/L_{np}/L_p/L_{np}/\ldots/L_p \text{ or } L_{np})$; and $(L_{np}/L_p/L_{np}/L_p/\ldots/L_p \text{ or } L_{np})$; where $L_p$ represents a periodic layered portion in the dielectric stack 160, such as that shown in FIGS. 1A, 1B, 1C, and 1D; and $L_{np}$ represents a non-periodic layered portion in the dielectric stack 160, such as that shown in FIG. 1E. However, the arrangement of the periodic layered portions and the non-periodic layered portions is not limited thereto. In some embodiments, the dielectric stack 160 could be any combination of the periodic layered portions and the non-periodic layered portions. In some embodiments, the periodic layered portions $L_p$ in the dielectric stack 160 are the same. In some embodiments, at least two of the periodic layered portions $L_p$ in the dielectric stack 160 are different from each other. In some embodiments, the non-periodic layered portions $L_{np}$ in the dielectric stack 160 are the same. In some embodiments, at least two of the non-periodic layered portions $L_p$ in the dielectric stack 160 are different from each other.

Take FIG. 1G as an exemplary embodiment, parameters for the aforementioned periodic rule of the dielectric stack 160 may be $L_{p1}=Y_2O_3/Al_2O_3/Y_2O_3/Al_2O_3$, $L_{p2}=HfO_2/ZrO_2/HfO_2/ZrO_2/HfO_2/ZrO_2$, and $L_{np}=La_2O_3/Lu_2O_3/Eu_2O_3$. Then, the dielectric stack 160 may be a stack of In this case, the dielectric stack 160 includes an Y$_2$O$_3$ layer 112, an Al$_2$O$_3$ layer 114, an Y$_2$O$_3$ layer 116, an Y$_2$O$_3$ layer 118, an HfO$_2$ layer 161, a ZrO$_2$ layer 162, an HfO$_2$ layer 163, a ZrO$_2$ layer 164, an HfO$_2$ layer 165, a ZrO$_2$ layer 166, an La$_2$O$_3$ layer 171, an Lu$_2$O$_3$ layer 172, and an Eu$_2$O$_3$ layer 173 and is divided into first and second periodic layered portion $L_p$ and $L_{p2}$ and a first non-periodic layered portion $L_{np1}$. The first periodic layered portion $L_p$ includes layers 112, 114, 116, and 118 and has a first periodic unit composed of adjacent Y$_2$O$_3$ layer and Al$_2$O$_3$ layer. The number of repetitions of the first periodic unit in the first periodic layered portion $L_p$ is two, but the present disclosure is not limited thereto. The second periodic layered portion $L_{p2}$ includes layers 161, 162, 163, 164, 165, and 166 and has a second periodic unit composed of adjacent HfO$_2$ layer and ZrO$_2$ layer. The number of repetitions of the second periodic unit in the second periodic layered portion $L_{p2}$ is three, but the present disclosure is not limited thereto. The first non-periodic layered portion $L_{np1}$ includes layers 171, 172, and 173 that made of La$_2$O$_3$, Lu$_2$O$_3$, and Eu$_2$O$_3$ respectively, but the present disclosure is not limited thereto. In some embodiments, the first periodic layered portion $L_p$ is adjacent to the second periodic layered portion $L_{p2}$ and is in contact with the substrate 102. The first non-periodic layered portion $L_{np1}$ is spaced apart the first periodic layered portion $L_p$ by the second periodic layered portion $L_{p2}$.

In some embodiments, in FIG. 1H, a dielectric stack 160' is similar to the dielectric stack 160 shown in FIG. 1G, with a difference in that the arrangement of the first and second periodic layered portions $L_{p1}$ and $L_{p2}$ and the first non-periodic layered portion $L_{np1}$ in the dielectric stack 160' are different from that in the dielectric stack 160. As shown in FIG. 1H, the dielectric stack 160' is arranged in a manner, such as

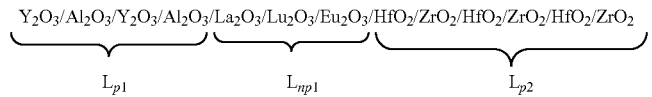

In some embodiments, the first non-periodic layered portion $L_{np1}$ is disposed between the first and second periodic layered portions $L_{p1}$ and $L_{p2}$. The first periodic layered portion is spaced apart the second periodic layered portion by the first non-periodic layered portion $L_{np1}$.

In some embodiments, in FIG. 1I, a dielectric stack 160" is similar to the dielectric stack 160' shown in FIG. 1G, with a difference in that the dielectric stack 160" further includes a second non-periodic layered portion $L_{np2}$. As shown in FIG. 1I, the dielectric stack 160" is a stack of

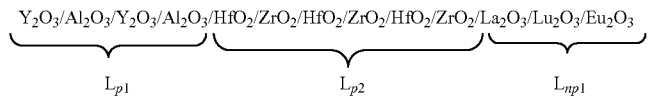

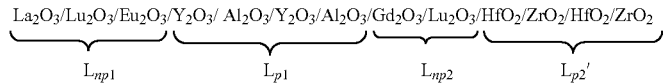

In some embodiments, the second periodic layered portion $L_{p2}'$ in the dielectric stack 160" has a second periodic unit composed of $HfO_2$ layer and $ZrO_2$ layer. The second periodic unit in the second periodic layered portion $L_{p2}'$ is repeated twice rather than three times as that shown in FIG. 1G, but the present disclosure is not limited thereto. In addition, the second non-periodic layered portion $L_{np2}$ includes layers that made of $Gd_2O_3$ and $Lu_2O_3$ respectively, but the present disclosure is not limited thereto.

As shown in FIG. 1I, the periodic layered portions and the non-periodic layered portions are arranged in an alternating manner. In other words, the first periodic layered portion $L_{p1}$ is disposed between the first and second non-periodic layered portions $L_{np1}$ and $L_{np2}$. The second non-periodic layered portion $L_{np2}$ is disposed between the first and second periodic layered portions $L_{p1}$ and $L_{p2}$. The dielectric stack 160" is in contact with the substrate 102 by the first non-periodic layered portion $L_{np1}$.

Reference is made to FIG. 2. After the dielectric stack 110 (as shown in FIG. 1A) is formed, a metal layer 180 is formed over the dielectric stack 110 and in contact with the layer 118 of the dielectric stack 110. The metal layer 180 is made metals, such as Mo, Ru, Ti, Ta, W, Hf, or combinations thereof; metal nitride, such as MoN, WN, TiN, TaN, TaAlN, TaSiN, or combinations thereof. Formation of the metal layer 180 include, for example, CVD, PVD, ALD, the like, or combinations thereof.

Reference is made to FIG. 3. The metal layer 180 is patterned, forming openings in the metal layer 180, so that regions of the layer 118 of the dielectric stack 110 are exposed. In some embodiments, the metal layer 180 is patterned using lithography and etching techniques.

Reference is made to FIGS. 4 and 5. After the metal layer 180 is patterned, source/drain regions 190 are formed in the substrate 102 using an implantation process P3. In the illustrative embodiments, a patterned photoresist 182 is formed on the patterned metal layer 180 (can be also referred to as a gate electrode 181) before the implantation process P3. The source/drain regions 190 are then formed by an ion implantation process P3 using the patterned photoresist 182 as a mask. In some embodiments, source/drain regions 190 are implanted with n-type dopants. In some embodiments, source/drain regions 190 are implanted with p-type dopants. After the implantation process P3, the patterned photoresist 182 is removed using acetone, and the resulting structure is shown in FIG. 5. In some embodiments, after removing the photoresist 182, the dopants in the source/drain regions 190 can be activated using, for example, an anneal process.

Reference is made to FIG. 6. The dielectric stack 110 is patterned using suitable lithography and etching techniques, and a portion of the patterned dielectric stack 110 under the gate electrode 181 can serve as a gate dielectric stack 111. A combination of the gate dielectric stack 111 and the gate electrode 181 thereon can be equivalently referred to as a gate structure 191. Furthermore, a portion of the patterned dielectric stack 110 is remained on the substrate 102 and not covered by the gate electrode 181.

Reference is made to FIGS. 7 and 8. Source/drain contact layers 192 and 194 are formed on the source/drain regions 190. In some embodiments, formation of the source/drain contact layers 192 and 194 involve lift-off techniques, as described below.

As shown in FIG. 7, a resist 115 is coated on the patterned dielectric stack 110 and the gate structure 191. In some embodiments, the resist 115 may include polymethyl methacrylate (PMMA) or other polymer with proper optimization to achieve planarization. In some embodiments, the resist 115 may include $SiO_2$ or Si which is deposited by any of plasma enhanced chemical vapor deposition (PECVD) or physical vapor deposition (PVD) or spin coating techniques and may serve as the hard mask for pattern transfer. Other materials that may be employed for the resist 115 include $Si_3N_4$, silicon oxy-nitride, sputtered silicon, amorphous silicon (e.g., by the CVD method), and amorphous carbon (e.g., by the PVD or CVD methods). In some embodiments, the resist 115 may include photo resistive material.

The source/drain contact layers 192 and 194, specifically, a low resistance metal such as copper, gold, silver, platinum or other noble metal, are deposited in sequence by resistive heat evaporation or low temperature deposition techniques.

Thereafter, the semiconductor device 100 is immersed into a tank of appropriate solvent that will react with the resist 115. The resist 115 swells, dissolves, and lifts off the source/drain contact layers 192 and 194 on the surface of the resist 115, leaving portions of the source/drain contact layers 192 and 194 over the source/drain regions 19. The resulting structure is shown in FIG. 8.

Any residual resist 115 is optionally cleaned by another solvent or by appropriate plasma chemistry to control defect density. Examples of suitable solvents include xylene and methyl iso-butyl ketone (MIBK). In some embodiments, this process be carded out in an ultrasonic bath with agitation to enhance the lift-off of undesirable metalization.

Reference is made to FIGS. 9A, 9B, and 9C. After the source/drain contact layers 192 and 194 are formed, an anneal process P4 is performed on the source/drain contact layers 192 and 194 and thus results in forming an ohmic contact between the source/drain contact layers 192 and 194. The resulting source/drain contact layers 192 and 194 can be in combination referred to as source/drain contacts 195 over the souce/drain regions 190.

Figure 10:
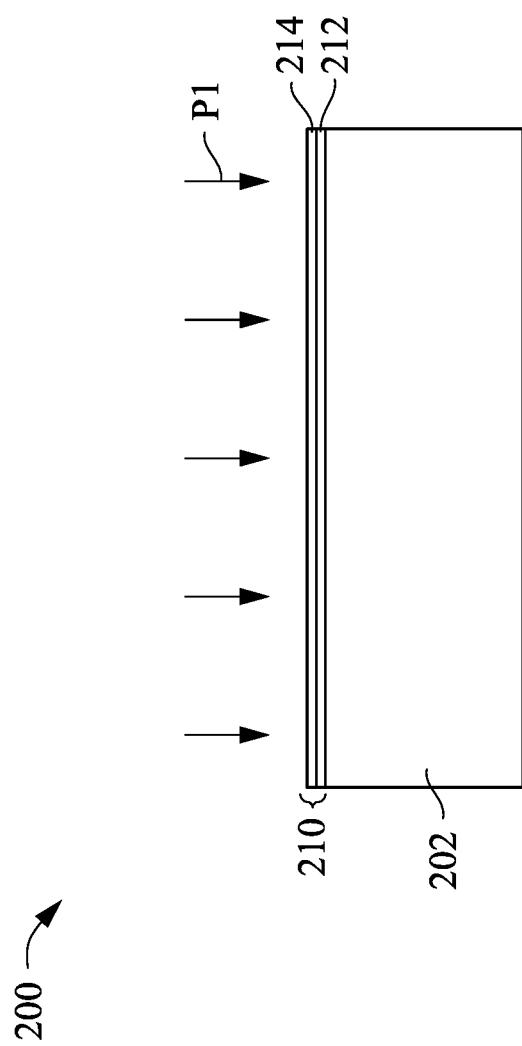
Figure 11B:
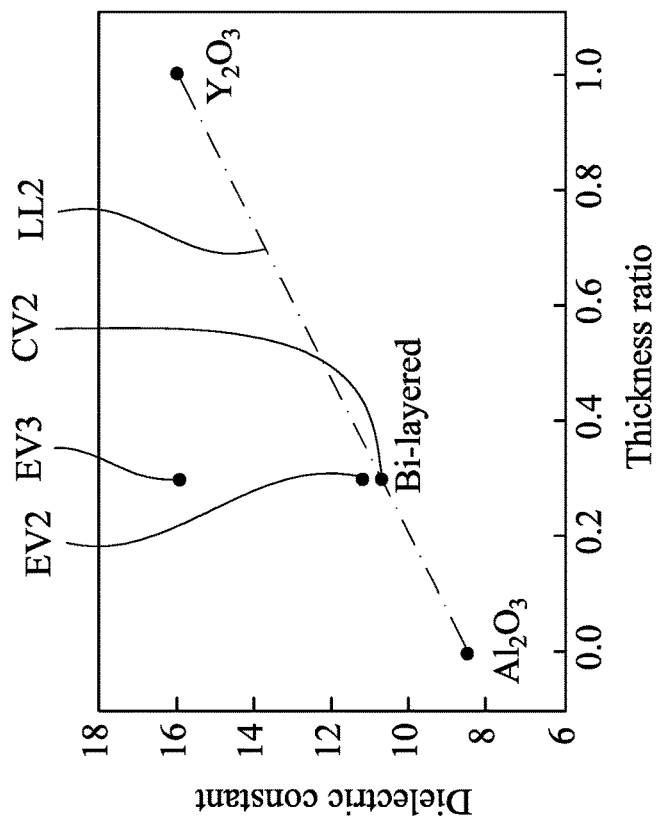
FIG. 11B is a graph showing dielectric constant as a function of a thickness ratio between two different high-k dielectric layers for the exemplary structure of FIG. 11A.
Figure 11A:
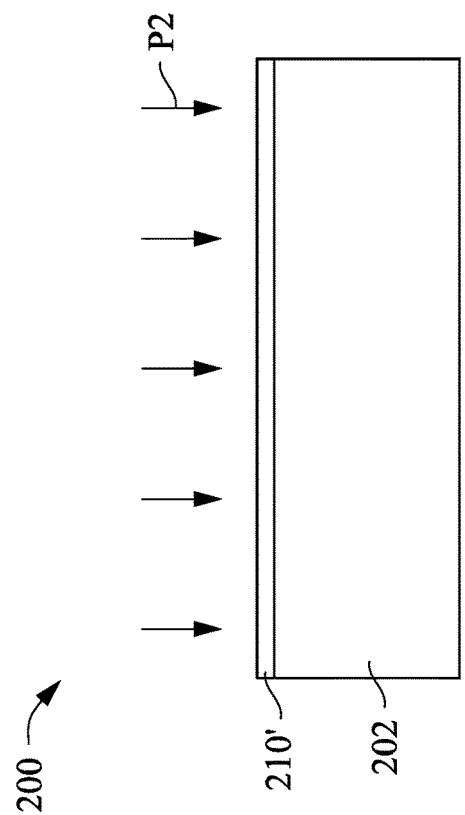

FIGS. 10, 11A, and 12A are cross-section views of a semiconductor device 200 at various stages of fabrication in accordance with some embodiments of the present disclosure. FIG. 11B is a graph showing dielectric constant as a function of a thickness ratio between two different high-k dielectric layers for the exemplary structure of FIG. 11A. FIG. 12B is a cross-section view along line B-B in FIG. 12A. FIG. 12C is a top view of the semiconductor device 200 in FIG. 12A.

Reference is made to FIG. 10. A dielectric stack 210 is formed over a substrate 202. The substrate 202 is made of a material that substantially the same as the substrate 102 shown in FIG. 1A and thus is not repeatedly described for the sake of brevity. In some embodiments, the dielectric stack 210 is a bi-layered structure and includes a first layer 212 and a second layer 214 which are made of different high-k dielectric materials. For example, in some embodiments, the first and/or second layers of the dielectric stack 210 are made of metal oxide, such as $Al_2O_3$, $Ga_2O_3$, $In_2O_3$, or the like. In some embodiments, the first and/or second layers of the dielectric stack 210 are made of transition metal oxide, such as $HfO_2$, $ZrO_2$, $TiO_2$, or the like. In some embodiments, the first and/or second layers of the dielectric stack 210 is made of rare-earth metal oxide, such as $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3 Yb_2O_3$, $Lu_2O_3$, or the like. In some embodiments, the first and/or second layers of the dielectric stack 210 are made of a mixed oxide with the formula $A_xB_{2-x}O_3$, where A could be either non rare-earth metal oxide or rare-earth metal oxide, B could be either non rare-earth metal oxide or rare-earth metal oxide that is different from A.

As shown in FIG. 10, the first layer 212 in the dielectric stack 210 is made of $Y_2O_3$ and the second layer 214 is made of $Al_2O_3$. In some embodiments, the first layer 212 is disposed between the substrate 202 and the second layer 214 and is in contact with the substrate 202. The second layer 214 is separated from the substrate 202 and is in contact with the first layer 212.

In some embodiments, an atomic layer deposition (ALD) process P1 is employed to form the first layer 212. As a result, the thickness of the layer 212 can be controlled using cycle times of the ALD process P1. In some embodiments, the ALD process P1 may include a plurality of cycles (e.g., about 10 cycles to about 20 cycles) to form the first layer 212 with a thickness ranging from about 2.1 nm to about 2.5 nm, but the present disclosure is not limited thereto. For example, the ALD process P1 may include about 16 cycles. After the deposition of the first layer 212 made of $Y_2O_3$, the second layer 214, if made of $Al_2O_3$, is deposited on the first layer 212 using another ALD process P1. In some embodiments, the ALD process P1 may include a plurality of cycles (e.g., about 50 cycles to about 60 cycles) to form the second layer 214 with a thickness ranging from about 4.8 nm to about 5.2 nm, but the present disclosure is not limited thereto. For example, the ALD process P1 may include about 56 cycles. Although the thicknesses of the first and second layers 212 and 214 are different, they are both less than about 10 nm, which in turn will be advantageous for dielectric enhancement using an annealing process P2 performed in a following stage (as shown in FIG. 11A). For example, if the thickness of the layer 212 or 214 is greater than about 10 nm, annealing duration for enhancing the dielectric constant might be lengthy, which in turn would result in an undesired inter-diffusion between the dielectric layer 210' (as shown in FIG. 11A) and the substrate 202. In some embodiments, the first and second layers 212 and 214 are in-situ formed in the same process apparatus (i.e., performed in the same ALD chamber). In some embodiments, the first and second layers 212 and 214 are ex-situ formed in different process apparatuses (i.e., performed in different ALD chambers).

Reference is made to FIG. 11A. After the dielectric stack 210 shown in FIG. 10 is formed, an annealing process P2 is performed on the dielectric stack 210 to enhance the dielectric constant of the dielectric stack 210. In this way, the resulting dielectric layer 210' can have a higher dielectric constant than the un-annealed dielectric stack 210. Moreover, the annealing process P2 will result in inter-diffusion between the first and second dielectric layers 212 and 214. In some embodiments, the inter-diffusion may result in merging the first and second dielectric layers 212 and 214 as the dielectric layer 210' without a distinguishable interface. In some embodiments, the annealing process P2 is performed in a temperature range from about 200° C. to about 1200° C. For example, if the temperature of the annealing process P2 is lower than about 200° C., the $Y_2O_3$ concentration and/or the $Al_2O_3$ concentration of the dielectric layer 210' would not be evenly distributed, which in turn might lead to non-uniform dielectric constant distribution in the dielectric layer 210'. If the temperature of the annealing process P2 is greater than about 1200° C., an undesired inter-diffusion would occur between the dielectric layer 210' and the substrate 202. In some embodiments, the annealing process P2 is carried out in air. In some embodiments, the annealing process P2 is carried out in noble gases, such as $N_2$, He, Ar, or combinations thereof. In some embodiments, the annealing process P2 is carried out in gases, such as $O_2$, $H_2$, or combinations thereof. In FIG. 11A, the annealing process P2 is performed on the dielectric stack 210 shown in FIG. 10 with an annealing temperature ranging from about 800° C. to about 1100° C. and in a helium-containing atmosphere.

Because the $Y_2O_3$ concentration and/or the $Al_2O_3$ concentration of the dielectric layer 210' are evenly distributed, the $Y_2O_3$ concentration at the top portion of the dielectric layer 210' is substantially equal to the $Y_2O_3$ concentration at the bottom portion of the dielectric layer 210', and/or the $Al_2O_3$ concentration at the top portion of the dielectric layer 210' is substantially equal to the $Al_2O_3$ concentration at the bottom portion of the dielectric layer 210'. Hence, an entirety of the dielectric layer 210' has a substantially uniform dielectric constant.

Reference is made to FIG. 11B. FIG. 11B is a graph showing dielectric constant as a function of a thickness ratio of $Y_2O_3$ layer to $Al_2O_3$ layer under Vegard's law, in which the function is represented as a linear line DL2. The dielectric constant of $Y_2O_3$ is in a range from about 14 to about 18 and the dielectric constant of $Al_2O_3$ is in a range from about 7 to about 10. If a dielectric stack comprising $Y_2O_3$ and $Al_2O_3$ layers each thicker than about 5 Å does not undergo the annealing process, the dielectric constant of the dielectric stack substantially satisfies Vegard's law and thus is on the linear line LL2 between about 8.5 and about 16. For example, the dielectric constant of the bi-layered dielectric stack may be the value CV2 on the linear line LL2.

However, if an annealing process P2 is performed on the dielectric stack (e.g., the dielectric stack 210), inter-diffusion between different dielectric layers occurs and the polarizability of the dielectric stack can be enhanced, which in turn will improve the dielectric constant of the dielectric stack. For example, if the dielectric stack is made of alternatingly stacked $Y_2O_3$ layers and $Al_2O_3$ layers, the annealing process P2 is performed on the dielectric stack at a temperature from about 800° C. to about 1100° C. to form a dielectric layer, and the dielectric constant of the resulting dielectric layer can be enhanced to an enhanced value EV2 higher than the corresponding value CV2 on the linear line LL2. In some embodiments, if the dielectric stack is made of alternatingly stacked $Y_2O_3$ layers and $Al_2O_3$ layers, the annealing process P2 is performed on the dielectric stack at a temperature from about 850° C. to about 1150° C., and the dielectric constant of the dielectric stack can be enhanced to an enhanced value EV3 higher than either the enhanced value EV2 or the corresponding value CV2 on the linear line LL2.

On the contrary, if an annealing process P2 is not performed on the dielectric stack comprising $Y_2O_3$ and $Al_2O_3$ layers each thicker than about 5 Å, the dielectric constant of the dielectric stack might not be enhanced and thus follows Vegard's law and remains on the linear line LL2.

Reference is made to FIGS. 12A, 12B, and 12C. After the dielectric layer 210' is formed, a metal layer is formed over the dielectric layer 210'. The metal layer is made of materials that substantially the same as the metal layer 180 shown in FIG. 2 and thus is not repeatedly described for the sake of brevity. After the forming of the metal layer, a gate electrode 281 and a gate dielectric 211 are formed by patterning the metal layer and the dielectric layer 210', and the resulting structure is shown in FIGS. 12A, 12B, and 12C. Furthermore, a portion of the patterned dielectric layer 210' is remained on the substrate 202 and not covered by the gate electrode 281.

After the forming of the gate electrode 281 and the gate dielectric 211, source/drain regions 290 are formed in the substrate 202 using an implantation process P3. After the forming of the source/drain regions 290, source/drain contacts 295 including metal are formed on the source/drain regions 290, and the resulting semiconductor device 200 is shown in FIGS. 12A, 12B, and 12C.

FIGS. 13A-13J are cross-section views of a semiconductor device 1100 at various stages of fabrication in accordance with some embodiments of the present disclosure. FIG. 13K is a cross-section view along line K-K in FIG. 13J. FIG. 13L is a top view of the semiconductor device 1100 in FIG. 13J. Fabrication of the semiconductor device 1100 differs from fabrication of the semiconductor device 100 (as shown in FIGS. 1A and 2-9C) in that the source/drain regions of the semiconductor device 1100 are formed prior to forming a gate structure, which will be described in greater detail below.

Reference is made to FIG. 13A. A dielectric stack 1110 is formed over a substrate 1102. In some embodiments, the substrate 1102 and the dielectric stack 1110 can be substantially the same as the substrate 102 and the dielectric stack 110 shown in FIG. 1A respectively and thus are not repeatedly described for the sake of brevity. Each dielectric layer 1112, 1114, 1116, 1118 of the dielectric stack 110 has a thickness less than about 5 Å, so that the polarizability of the dielectric stack can be enhanced, which in turn will improve the dielectric constant of the dielectric stack 1110, as discussed previously.

Reference is made to FIGS. 13B and 13C. After the dielectric stack 1110 is formed, source/drain regions 1190 are formed in the substrate 1102 using an implantation process P3. In the illustrative embodiments, a patterned photoresist 1182 is formed on the dielectric stack 1110 prior to the implantation process P3. The source/drain regions 1190 are then formed by an ion implantation process P3 using the patterned photoresist 1182 as a mask. In some embodiments, the source/drain regions 1190 are implanted with n-type dopants. In some embodiments, the source/drain regions 1190 are implanted with p-type dopants. After the performing of the implantation process P3, the patterned photoresist 1182 is removed using acetone, and the resulting structure is shown in FIG. 13C. In some embodiments, after removing the photoresist 1182, the dopants in the source/drain regions 1190 can be activated using, for example, an anneal process.

Reference is made to FIGS. 13D and 13E. After the source/drain regions 1190 are formed, the dielectric stack 1110 is patterned, forming openings in the dielectric stack 1110, so that regions of the source/drain regions 1190 are exposed. The gate dielectric stack 1110 is patterned using suitable lithography and etching techniques.

For example, a hard mask layer 1184 is formed over the dielectric stack 1110 and patterned using photolithographic and etching techniques. The dielectric stack 1110 is then patterned using the hard mask layer 1184 as an etch mask. After patterning the dielectric stack 1110, the hard mask layer 1184 is removed using, for example, an selective etching process. The resulting structure is shown in FIG. 13E.

Reference is made to FIGS. 13F and 13G. Source/drain contact layers 1192 and 1194 are formed on the source/drain regions 1190 using a lift-off process. As shown in FIG. 13F, a resist 1115 is coated on the dielectric stack 1110. The source/drain contact layers 1192 and 1194 are deposited over the resist 1115 and on the source/drain regions 1190. In some embodiments, the resist 1115 and source/drain contact layers 1192 and 1194 may be substantially the same as the resist 115 and source/drain contact layers 192 and 194 shown in FIG. 7, and hence descriptions thereof are not repeated for the sake of brevity.

In some embodiments, the semiconductor device 1100 is then immersed into a tank of appropriate solvent that will react with the resist 1115. The resist 1115 swells, dissolves, and lifts off the source/drain contact layers 1192 and 1194 on the surface of the resist 1115, leaving portions of the source/drain contact layers 1192 and 1194 over the source/drain regions 1190. The resulting structure is shown in FIG. 13G.

Reference is made to FIG. 13H. After the source/drain contact layers 1192 and 1194 are formed, an anneal process P4 is performed on the source/drain contact layers 1192 and 1194, thus resulting in forming an ohmic contact between the source/drain contact layers 1192 and 1194. The resulting source/drain contact layers 1192 and 1194 can be in combination referred to source/drain contacts 1195 over the souce/drain regions 1190.

Figure 13K:
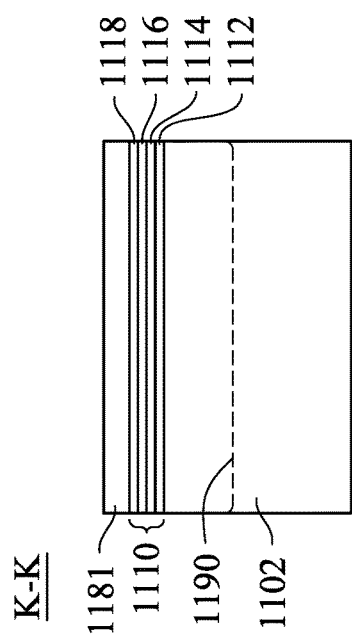
FIG. 13K is a cross-section view along line K-K in FIG. 13J.
Figure 13I:
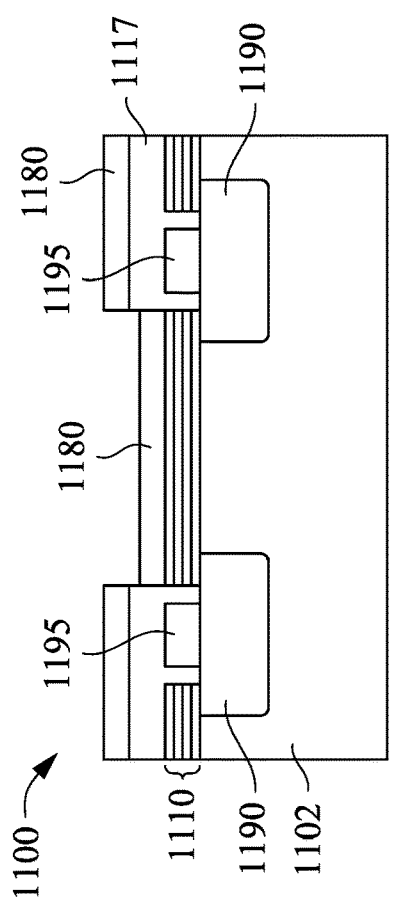
Figure 13L:
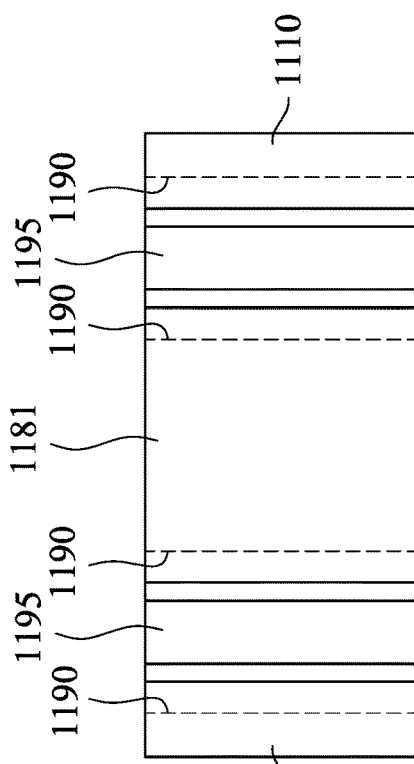
FIG. 13L is a top view of the semiconductor device in FIG. 13J.
Figure 13J:
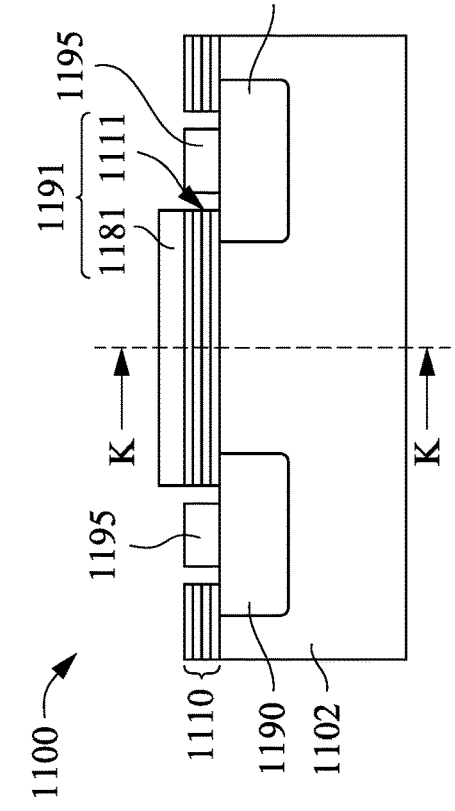

Reference is made to FIGS. 13I, 13J, 13K, and 13L. After the source/drain contacts 1195 are formed on the source/drain regions 1190, a gate electrode 1181 is form on the dielectric stack 1110 between the source/drain contacts 1195 using a lift-off process. As shown in FIG. 13I, a resist 1117 is coated over the dielectric stack 1110 and the source/drain contacts 1195 and is patterned to expose a portion of the dielectric stack 1110 between the source/drain contacts 1195. Thereafter, a gate electrode material 1180 is deposited over the resist 1117 and on the dielectric stack 1110 between the source/drain contacts 1195. Thereafter, the semiconductor device 1100 is immersed into a tank of appropriate solvent that will react with the resist 1117. The resist 1117 swells, dissolves, and lifts off the gate electrode material 1180 on the surface of the resist 1117, leaving a portion of the gate electrode material 1180 contacting the dielectric stack 1110, and the resulting structure is shown in FIG. 13J. After the lift-off process, the remaining gate electrode material 1180 can serve as a gate electrode 1181, and the gate electrode 1181 and the underlying portion of the dielectric stack 1111 can be in combination referred to as a gate structure 1191.

FIGS. 14A-14K are cross-section views of a semiconductor device 1200 at various stages of fabrication in accordance with some embodiments of the present disclosure. FIG. 14L is a cross-section view along line L-L in FIG. 14K. FIG. 14M is a top view of the semiconductor device 1200 in FIG. 14K. Fabrication of the semiconductor device 1200 differs from fabrication of the semiconductor device 200 (as shown in FIGS. 10, 11A and 12A-C) in that the source/drain regions of the semiconductor device 1200 are formed prior to forming a gate structure, which will be described in greater detail below.

Figure 14A:
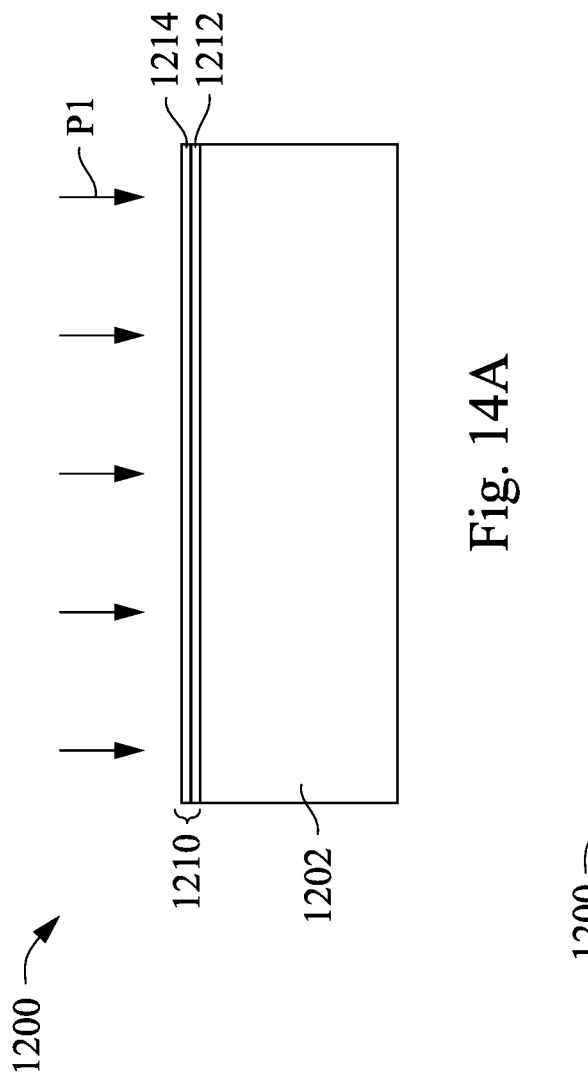

Reference is made to FIG. 14A. A dielectric stack 1210 is formed over a substrate 1202. The substrate 1202 is made of a material that substantially the same as the substrate 102 shown in FIG. 1A and thus is not repeatedly described for the sake of brevity. In some embodiments, the dielectric stack 1210 is a bi-layered structure and includes a first layer 1212 and a second layer 1214 which are made of different high-k dielectric materials. For example, the first layer 1212 in the dielectric stack 1210 is made of $Y_2O_3$ and the second layer 1214 is made of $Al_2O_3$. In some embodiments, the dielectric stack 1210 may be substantially the same as the dielectric stack 210 shown in FIG. 10 and thus is not repeatedly described for the sake of brevity.

Figure 14B:
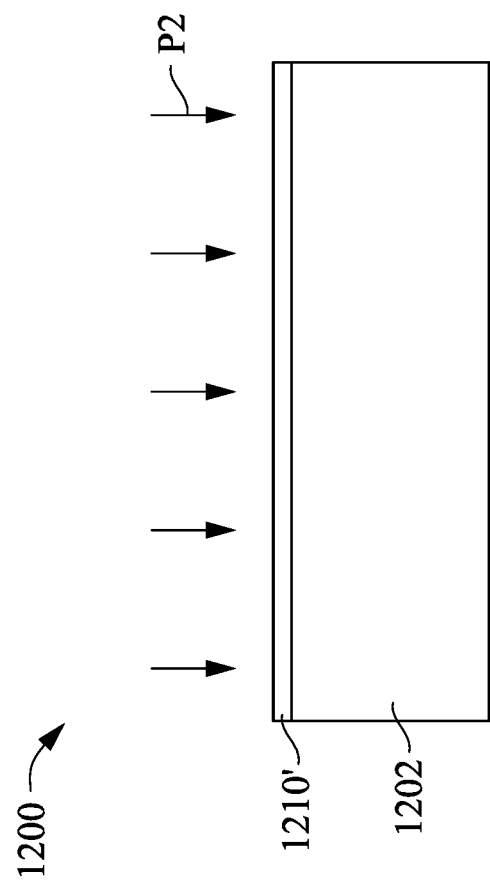

In some embodiments, an atomic layer deposition (ALD) process P1 is employed to form the first layer 1212. As a result, the thickness of the layer 1212 can be controlled using cycle times of the ALD process P1. In some embodiments, the ALD process P1 may include a plurality of cycles (e.g., about 10 cycles to about 20 cycles) to form the first layer 1212 with a thickness ranging from about 2.1 nm to about 2.5 nm, but the present disclosure is not limited thereto. For example, the ALD process P1 may include about 16 cycles. After the deposition of the first layer 1212 made of $Y_2O_3$, the second layer 1214, if made of $Al_2O_3$, is deposited on the first layer 1212 using another ALD process P1. In some embodiments, the ALD process P1 may include a plurality of cycles (e.g., about 50 cycles to about 60 cycles)

to form the second layer 1214 with a thickness ranging from about 4.8 nm to about 5.2 nm, but the present disclosure is not limited thereto. For example, the ALD process P1 may include about 56 cycles. Although the thicknesses of the first and second layers 1212 and 1214 are different, they are both less than about 10 nm, which in turn will be advantageous for dielectric enhancement using an annealing process P2 performed in a following stage (as shown in FIG. 14B). In some embodiments, the first and second layers 1212 and 1214 are in-situ formed in the same process apparatus (i.e., performed in the same ALD chamber). In some embodiments, the first and second layers 1212 and 1214 are ex-situ formed in different process apparatuses (i.e., performed in different ALD chambers).

Reference is made to FIG. 14B. After the dielectric stack 1210 shown in FIG. 14A is formed, an annealing process P2 is performed on the dielectric stack 1210 to enhance the dielectric constant of the dielectric stack 1210. In this way, the resulting dielectric layer 1210' can have a higher dielectric constant than the un-annealed dielectric stack 1210. Moreover, the annealing process P2 will result in inter-diffusion between the first and second dielectric layers 1212 and 1214. In some embodiments, the inter-diffusion may result in merging the first and second dielectric layers 1212 and 1214 as the dielectric layer 1210' without a distinguishable interface. Detailed conditions of the annealing process P2 and the resultant dielectric constant enhancement are discussed previous with respect to FIGS. 11A and 11B, and thus not repeated for the sake of brevity.

Reference is made to FIGS. 14C and 14D. After the dielectric layer 1210' is formed, source/drain regions 1290 are formed in the substrate 1202 using an implantation process P3. In the illustrative embodiments, a patterned photoresist 1282 is formed on the dielectric layer 1210' prior to performing the implantation process P3. The source/drain regions 1290 are then formed by an ion implantation process P3 using the patterned photoresist 1282 as a mask. In some embodiments, the source/drain regions 1290 are implanted with n-type dopants. In some embodiments, the source/drain regions 1290 are implanted with p-type dopants. After the performing of the implantation process P3, the patterned photoresist 1282 is removed using acetone, and the resulting structure is shown in FIG. 14D. In some embodiments, after removing the photoresist 1282, the dopants in the source/drain regions 1290 can be activated using, for example, an anneal process.

Reference is made to FIGS. 14E and 14F. After the source/drain regions 1290 are formed, the dielectric layer 1210' is patterned, forming openings in the dielectric layer 1210', so that regions of the source/drain regions 1290 are exposed. The gate dielectric layer 1210' is patterned using suitable lithography and etching techniques. For example, a hard mask layer 1284 is formed over the dielectric layer 1210' and patterned using photolithographic and etching techniques. The dielectric layer 1210' is then patterned using the hard mask layer 1284 as an etch mask. After patterning the dielectric layer 1210', the hard mask layer 1284 is removed using, for example, an selective etching process. The resulting structure is shown in FIG. 14F.

Figure 14G:
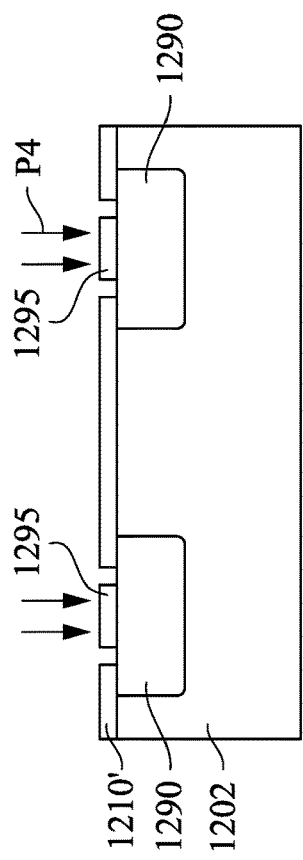
Figure 14I:
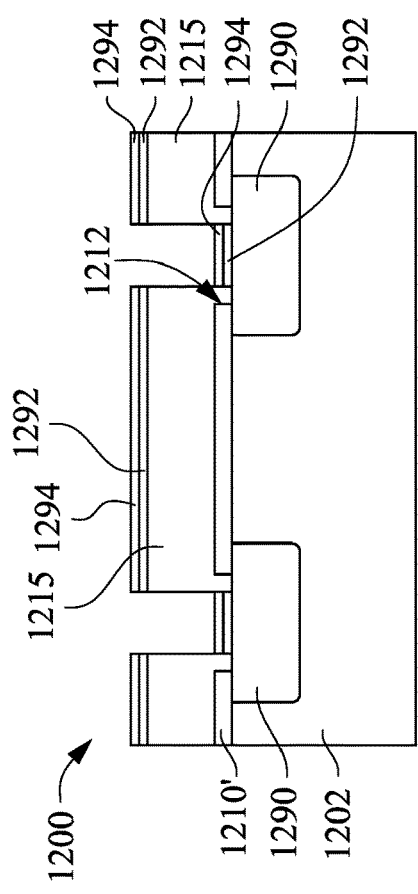
Figure 14H:
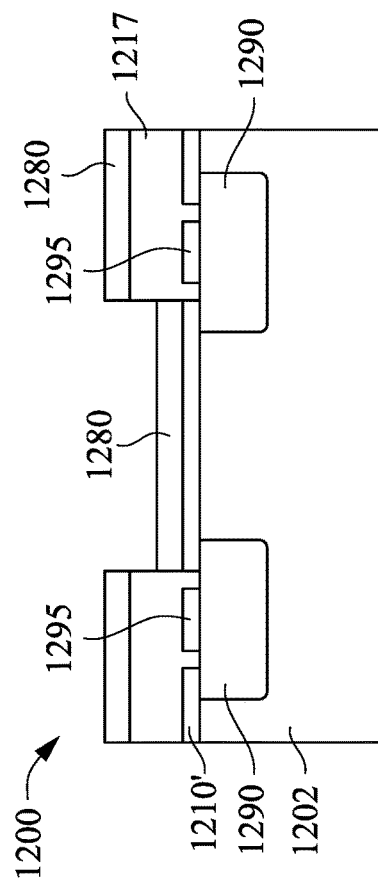

Reference is made to FIGS. 14G and 14H. Source/drain contact layers 1292 and 1294 are formed on the source/drain regions 1290 using a lift-off process. As shown in FIG. 14G, a resist 1215 is coated on the dielectric layer 1210'. The source/drain contact layers 1292 and 1294 are deposited over the resist 1215 and on the source/drain regions 1290. In some embodiments, the resist 1215 and source/drain contact layers 1292 and 1294 may be substantially the same as the resist 115 and source/drain contact layers 192 and 194 shown in FIG. 7, and hence descriptions thereof are not repeated for the sake of brevity.

In some embodiments, the semiconductor device 1200 is then immersed into a tank of appropriate solvent that will react with the resist 1215. The resist 1215 swells, dissolves, and lifts off the source/drain contact layers 1292 and 1294 on the surface of the resist 1215, leaving portions of the source/drain contact layers 1292 and 1294 over the source/drain regions 1290. The resulting structure is shown in FIG. 14H.

Reference is made to FIG. 14I. After the source/drain contact layers 1292 and 1294 are formed, an anneal process P4 is performed on the source/drain contact layers 1292 and 1294, thus resulting in forming an ohmic contact between the source/drain contact layers 1292 and 1294. The resulting source/drain contact layers 1292 and 1294 can be in combination referred to source/drain contacts 1295 over the souce/drain regions 1290.

Figure 14J:
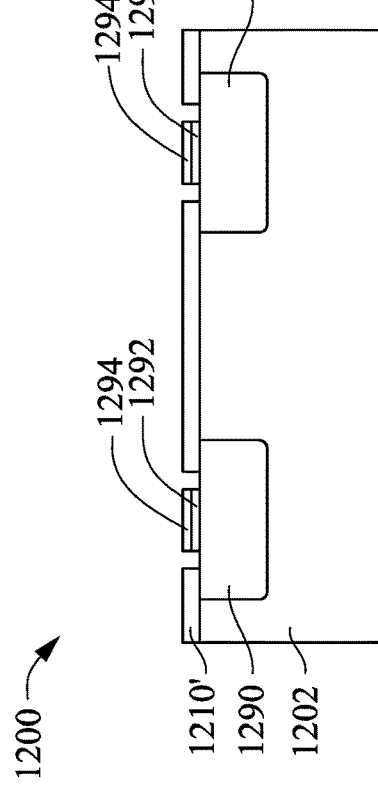
Figure 14M:
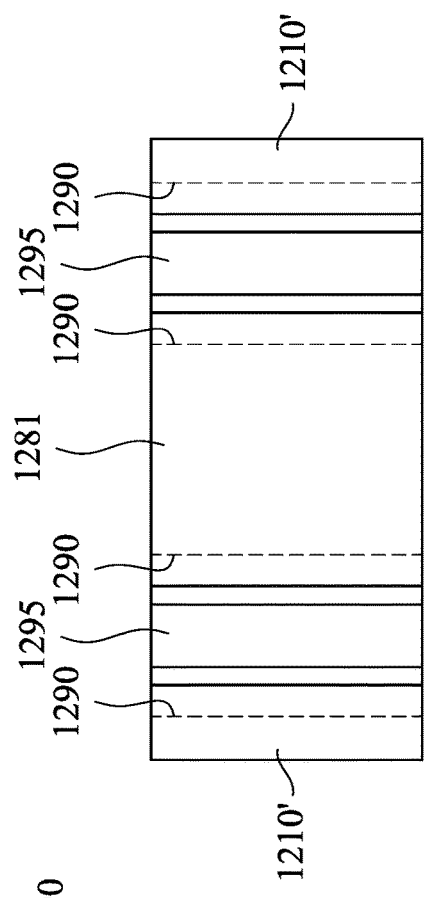
FIG. 14M is a top view of the semiconductor device in FIG. 14K.
Figure 14K:
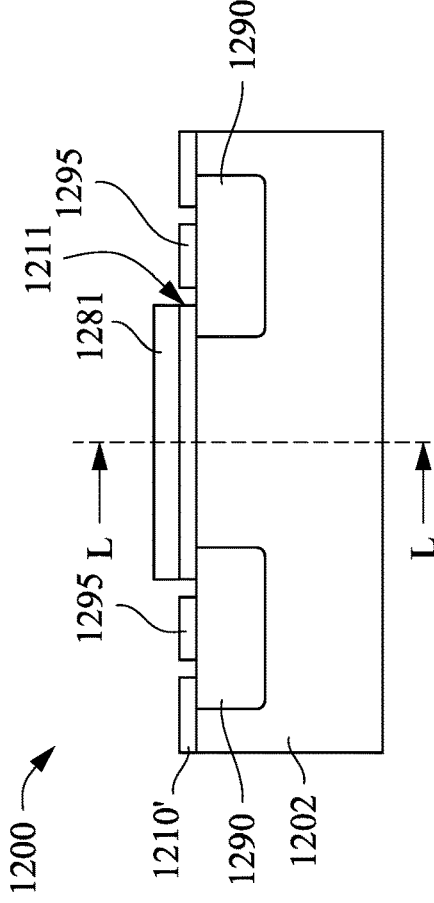
Figure 14L:
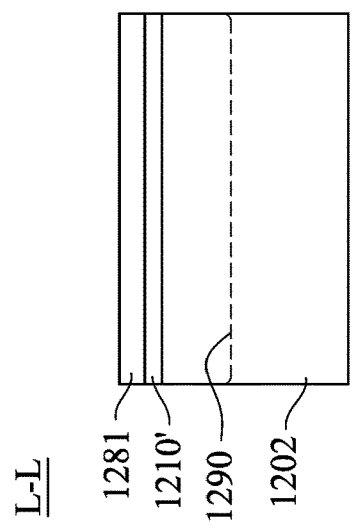
FIG. 14L is a cross-section view along line L-L in FIG. 14K.

Reference is made to FIGS. 14J, 14K, 14L, and 14M. After the dielectric layer 1210' is formed, a gate electrode 1281 is form on the dielectric layer 1210' between the source/drain contacts 1295 using a lift-off process. As shown in FIG. 14J, a resist 1217 is coated over the dielectric layer 1210' and the source/drain contacts 1295 and is patterned to expose a portion of the dielectric layer 1210' between the source/drain contacts 1295. Thereafter, a gate electrode material 1280 is deposited over the resist 1217 and on the dielectric layer 1210' between the source/drain contacts 1295. Thereafter, the semiconductor device 1200 is immersed into a tank of appropriate solvent that will react with the resist 1217. The resist 1217 swells, dissolves, and lifts off the gate electrode material 1280 on the surface of the resist 1217, leaving a portion of the gate electrode material 1280 contacting the dielectric layer 1210', and the resulting structure is shown in FIG. 14K. After the lift-off process, the remaining gate electrode material 1180 can serve as a gate electrode 1281, and the gate electrode 1281 and the underlying portion of the dielectric layer 1210' can be in combination referred to as a gate structure.

Following Embodiments are associated with FinFETs comprising gate dielectrics with improved dielectric constant as discussed previously. The fins of the FinFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 15A-15G are perspective views of a FinFET device 300 at various stages of fabrication in accordance with some embodiments of the present disclosure.

Figure 15A:
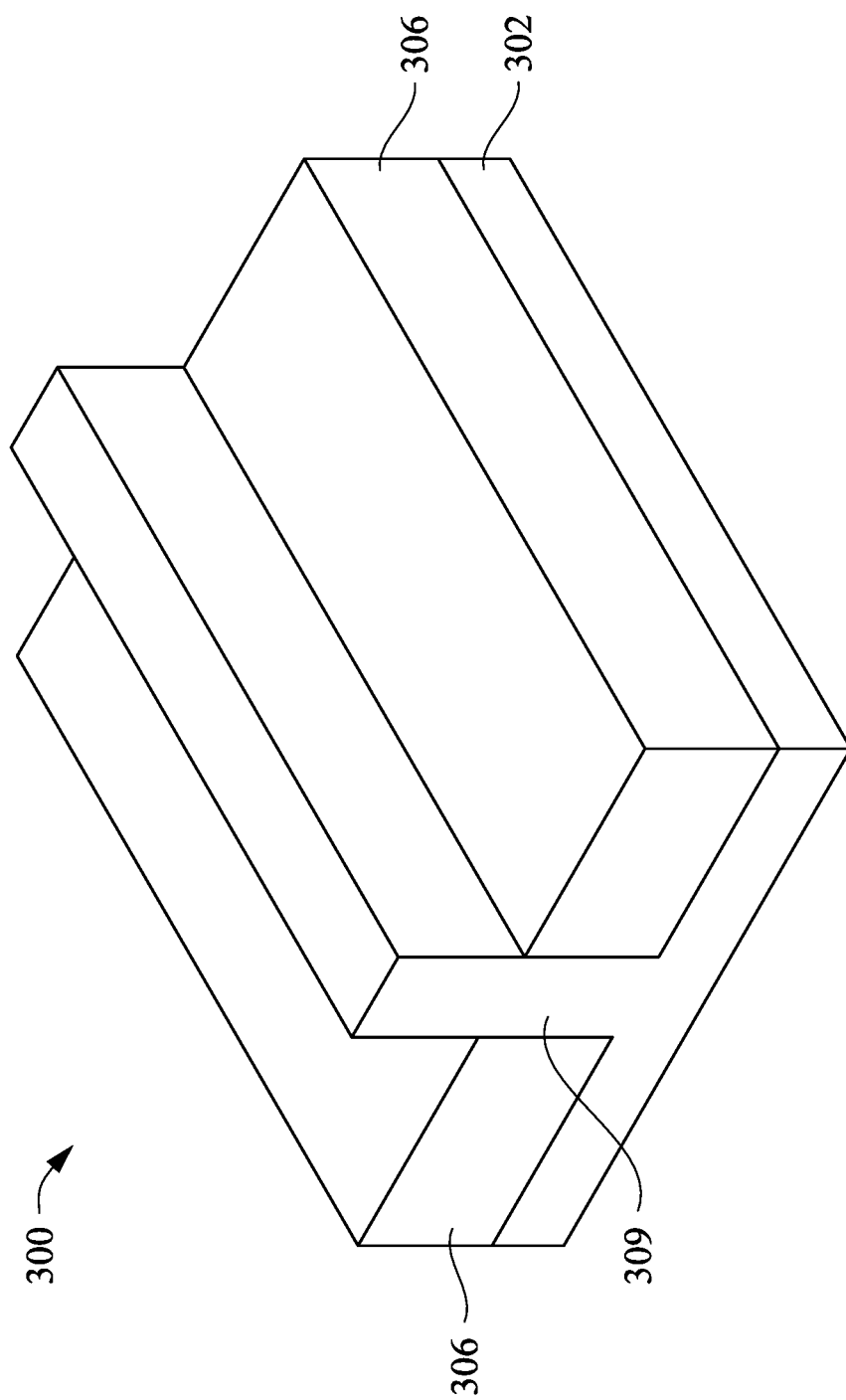
FIGS. 15A-15G are perspective views of a FinFET (Fin Field-effect transistor) device at various stages of fabrication in accordance with some embodiments of the present disclosure.

Reference is made to FIG. 15A. One or more semiconductor fins 309 are formed over a substrate 302. The substrate 302 may comprise various doped regions. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

In some embodiments, the substrate 302 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 302 may include an epitaxial layer (epi-layer), which may be strained for performance enhancement, and/or may include a silicon-on-insulator (SOI) structure.

The semiconductor fin 309 may be formed using, for example, a patterning process to form trenches such that a trench is formed between adjacent semiconductor fins 309. As discussed in greater detail below, the semiconductor fin 309 will be used to form a FinFET.

Isolation regions, such as shallow trench isolations (STI) 306, are disposed in the trenches over the substrate 302. The isolation region can be equivalently referred to as an isolation insulating layer in some embodiments. The isolation insulating layer 306 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 306 is formed through a process such as CVD, flowable CVD (FCVD), or a spin-on-glass process, although any acceptable process may be utilized. Subsequently, portions of the isolation insulating layer 306 extending over the top surface of the semiconductor fin 309, are removed using, for example, an etch back process, chemical mechanical polishing (CMP), or the like.

In some embodiments, the isolation insulating layer 306 is recessed to expose an upper portion of the semiconductor fin 309 as illustrated in FIG. 15A. In some embodiments, the isolation insulating layer 306 is recessed using a single etch processes, or multiple etch processes. In some embodiments in which the isolation insulating layer 306 is made of silicon oxide, the etch process may be, for example, a dry etch, a chemical etch, or a wet cleaning process. For example, the chemical etch may employ fluorine-containing chemical such as dilute hydrofluoric (dHF) acid.

Figure 15B:
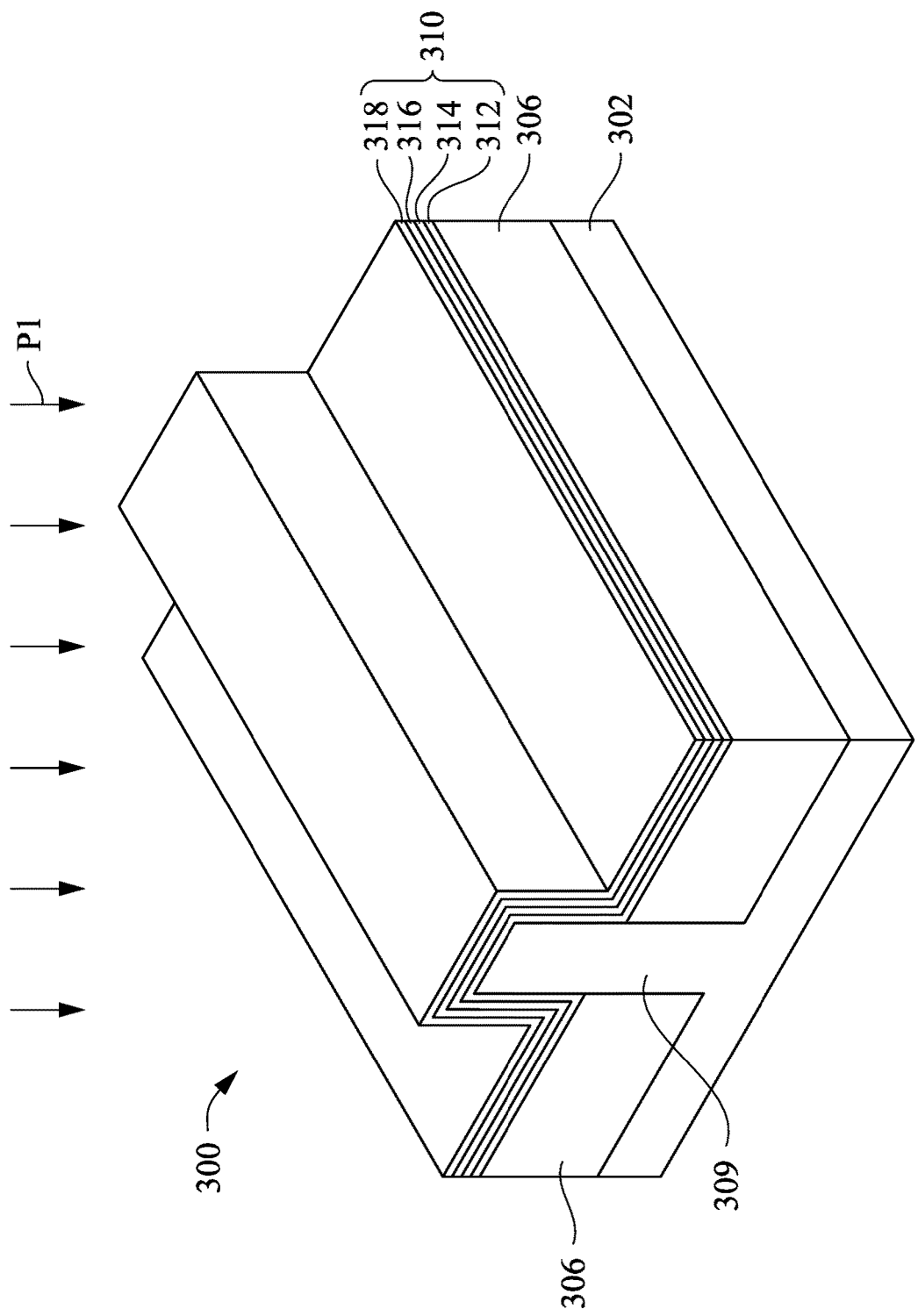

Reference is made to FIG. 15B. After the semiconductor fin 309 is formed, a dielectric stack 310 is conformally formed over the semiconductor fin 309 and the STI 306 using ALD processes P1. In some embodiments, the dielectric stack 310 is a multilayered structure.

In some embodiments, the layers in the dielectric stack 310 are high-k dielectric. For example, in some embodiments, at least one of the layers of the dielectric stack 310 is made of metal oxide, such as $Al_2O_3$, $Ga_2O_3$, $In_2O_3$, or the like. In some embodiments, at least one of the layers of the dielectric stack 310 is made of transition metal oxide, such as $HfO_2$, $ZrO_2$, $TiO_2$, or the like. In some embodiments, at least one of the layers of the dielectric stack 310 is made of rare-earth metal oxide, such as $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3Yb_2O_3$, $Lu_2O_3$, or the like. In some embodiments, at least one of the layers of the dielectric stack 310 is made of a mixed oxide with the formula $A_xB_{2-x}O_3$, where A could be either non rare-earth metal or rare-earth metal, B could be either non rare-earth metal or rare-earth metal that is different from A.

In some embodiments, as shown in FIG. 15B, the arrangement of the layers in the dielectric stack 310 is periodic. It is noted that a number of layers in the dielectric stack 310 may vary depending on the actual design of the semiconductor device 300. Take FIG. 15B as an exemplary embodiment, the dielectric stack 310 includes high-k dielectric layers 312, 314, 316, and 318. In the embodiment, the layer 312 is made of $Y_2O_3$, the layer 314 is made of $Al_2O_3$, the layer 316 is made of $Y_2O_3$, and the layer 318 is made of $Al_2O_3$. Each dielectric layer 312, 314, 316, 318 of the dielectric stack 310 has a thickness less than about 5 Å, so that the polarizability of the dielectric stack 310 can be enhanced, which in turn will improve the dielectric constant of the dielectric stack 310, as discussed previously with respect to FIGS. 1A and 1B.

Figure 15C:
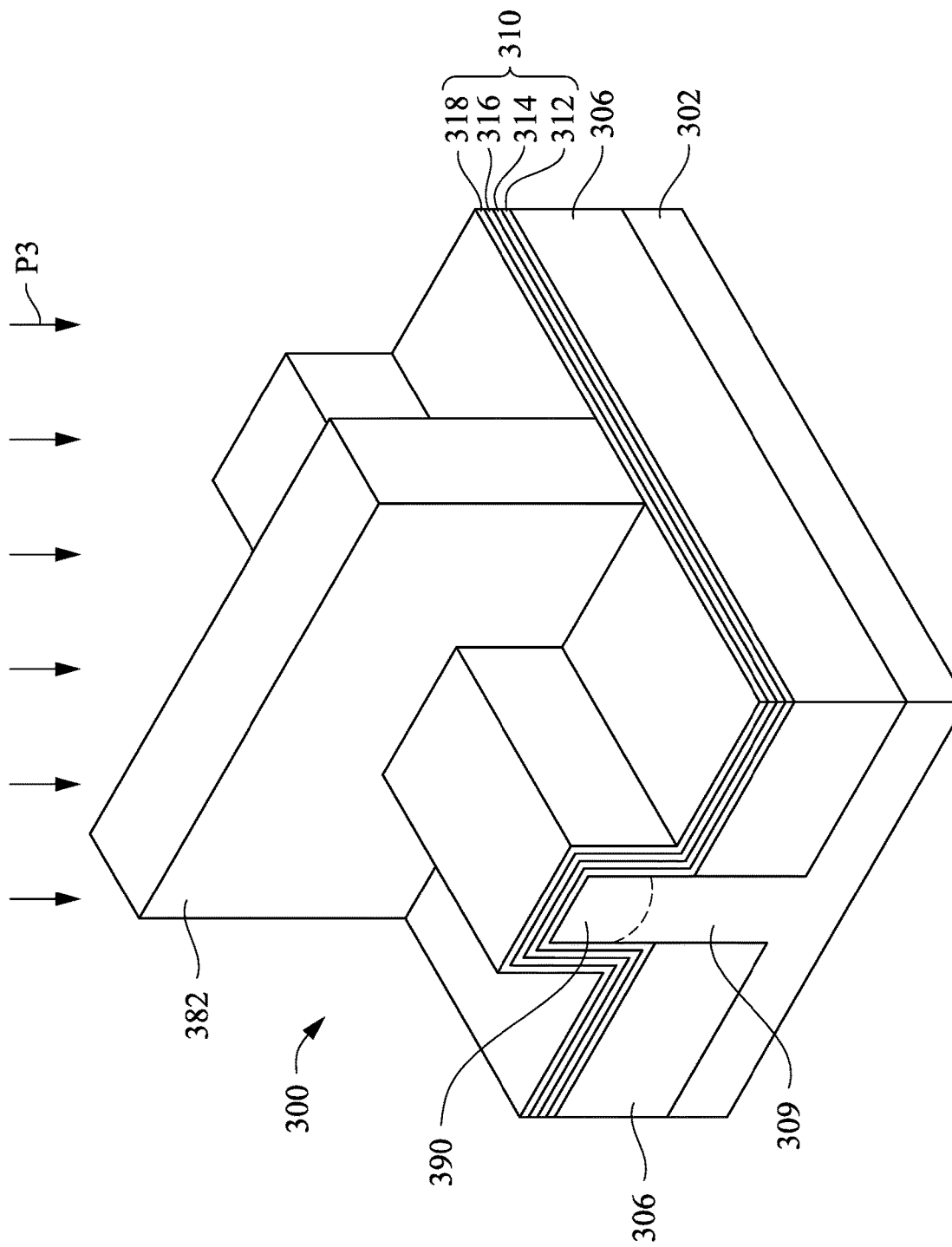
Figure 15D:
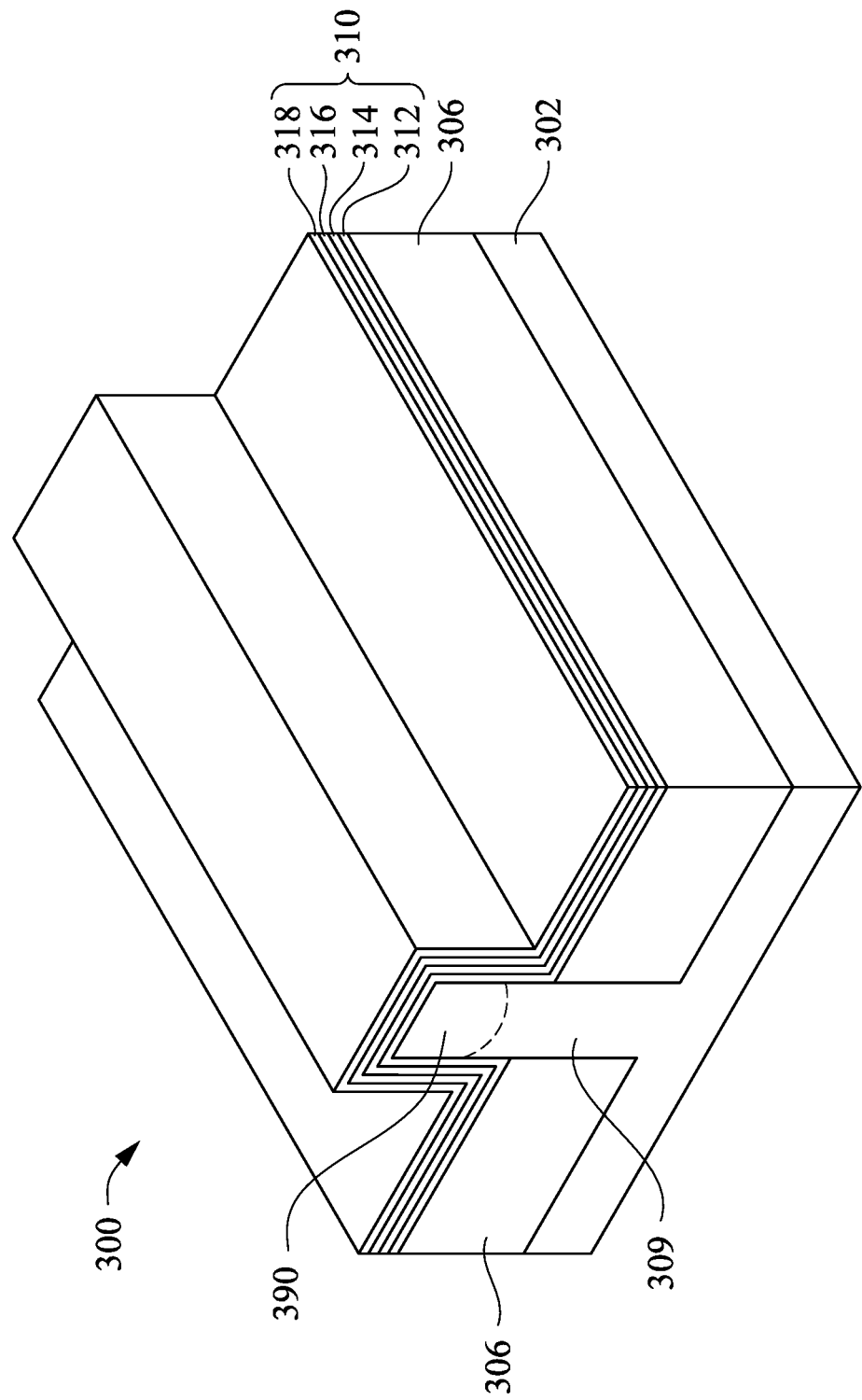

Reference is made to FIGS. 15C and 15D. After the dielectric stack 310 is formed, source/drain regions 390 are formed in the semiconductor fin 309 using an implantation process P3. In the illustrative embodiments, a patterned photoresist 382 is formed on the dielectric stack 310 prior to the implantation process P3. The source/drain regions 390 are then formed by an ion implantation process P3 using the patterned photoresist 382 as a mask. In some embodiments, the source/drain regions 390 are implanted with n-type dopants. In some embodiments, the source/drain regions 390 are implanted with p-type dopants. After the performing of the implantation process P3, the patterned photoresist 382 is removed using acetone, and the resulting structure is shown in FIG. 15D. In some embodiments, after removing the photoresist 382, the dopants in the source/drain regions 390 can be activated using, for example, an anneal process.

Figure 15E:
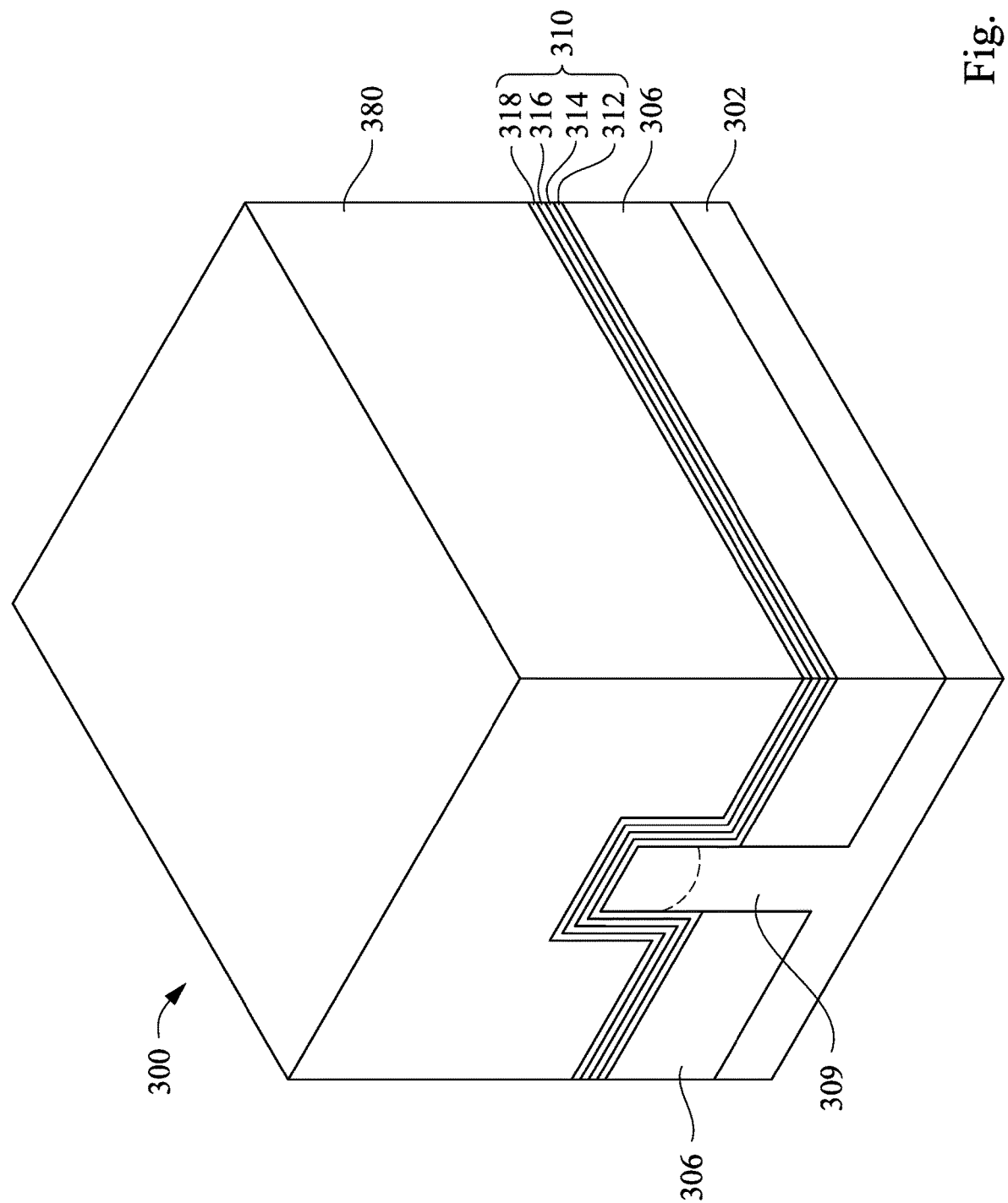
Figure 15F:
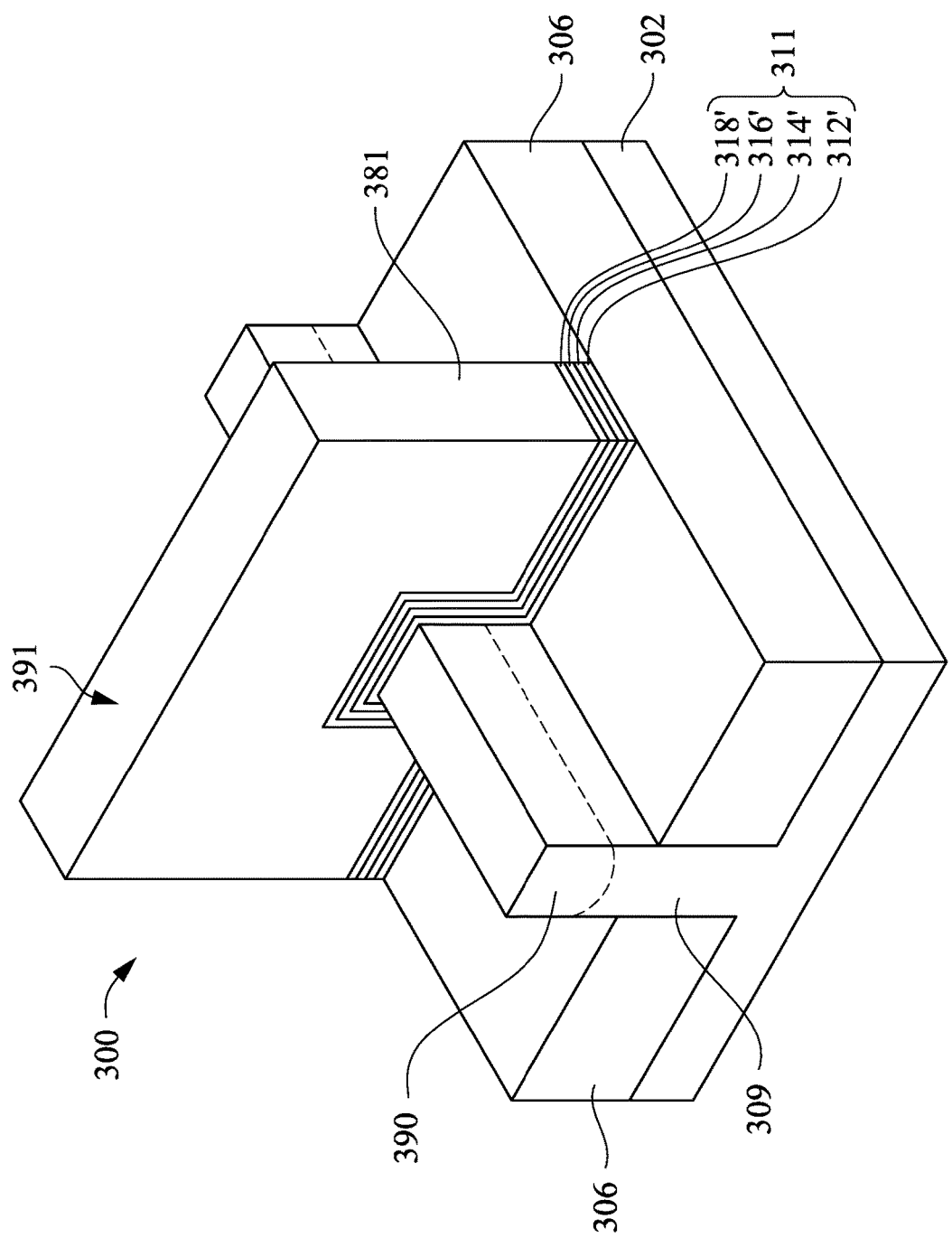

Reference is made to FIG. 15E. After the source/drain regions 390 are formed, a metal layer 380 may be formed over the dielectric stack 310. Then, the dielectric stack 310 and the metal layer 380 is patterned using suitable lithography and etching techniques, and a portion of the patterned dielectric stack 310 under the gate electrode 381 can serve as a gate dielectric stack 311. The gate dielectric stack 311 includes the patterned layers 312', 314', 316', and 318'. A combination of the gate dielectric stack 311 and the gate electrode 381 thereon can be equivalently referred to as a gate structure 391. The resulting structure is shown in FIG. 15F. The gate structure 391 extends across the semiconductor fin 309. The gate structure 391 has a longitudinal axis that is substantially perpendicular to the longitudinal axes of the semiconductor fin 309.

Figure 15G:
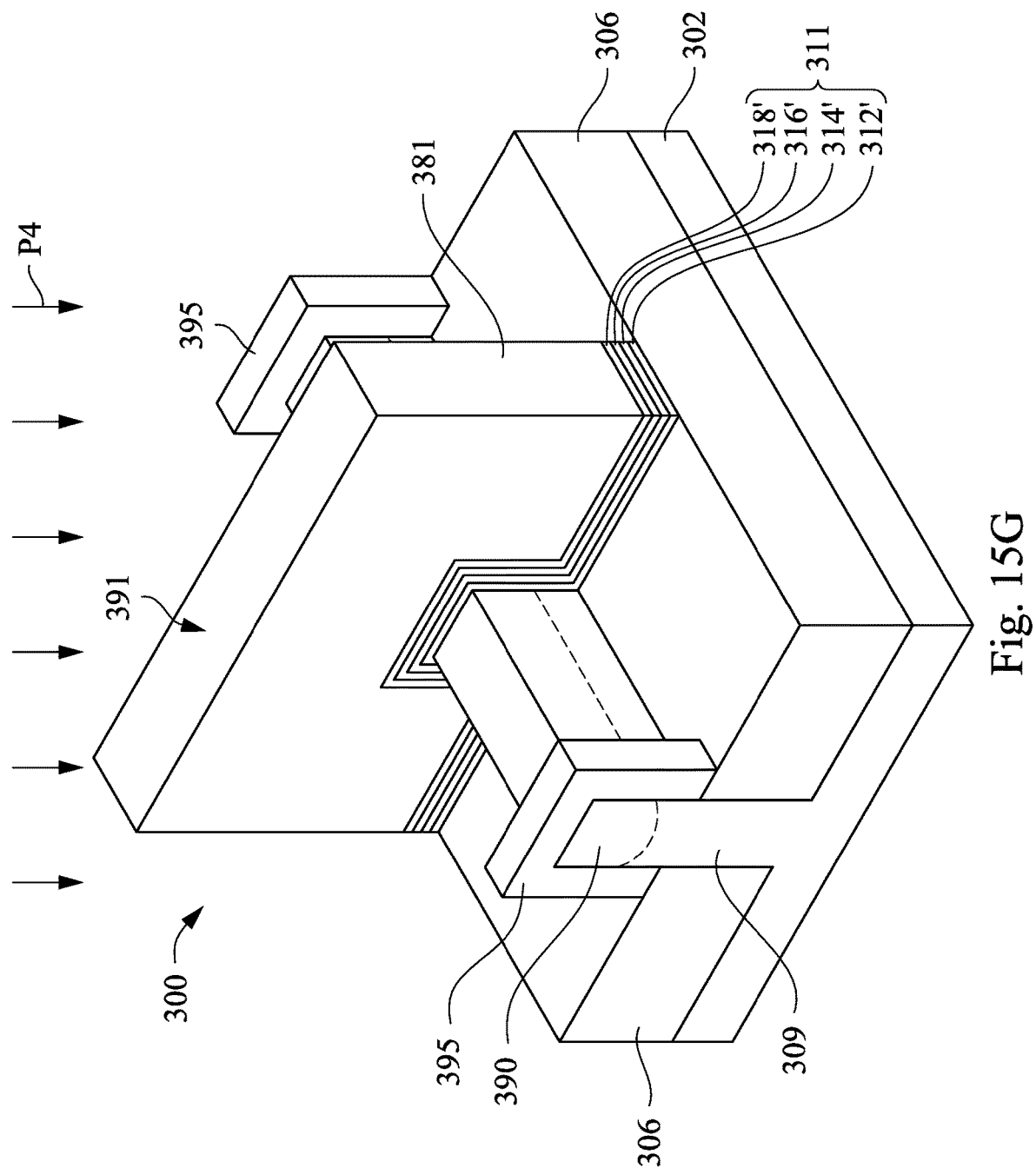

Reference is made to FIG. 15G. Source/drain contacts 395 are formed on the source/drain regions 390. In some embodiments, formation of the source/drain contacts 395 involves forming contact layers over the source/drain regions 390 using lift-off techniques, and performing an anneal process P4 on the contact layers to form an ohmic contact between the contact layers, as described previous with respect to, for example, FIGS. 7-9A.

Figure 16A:
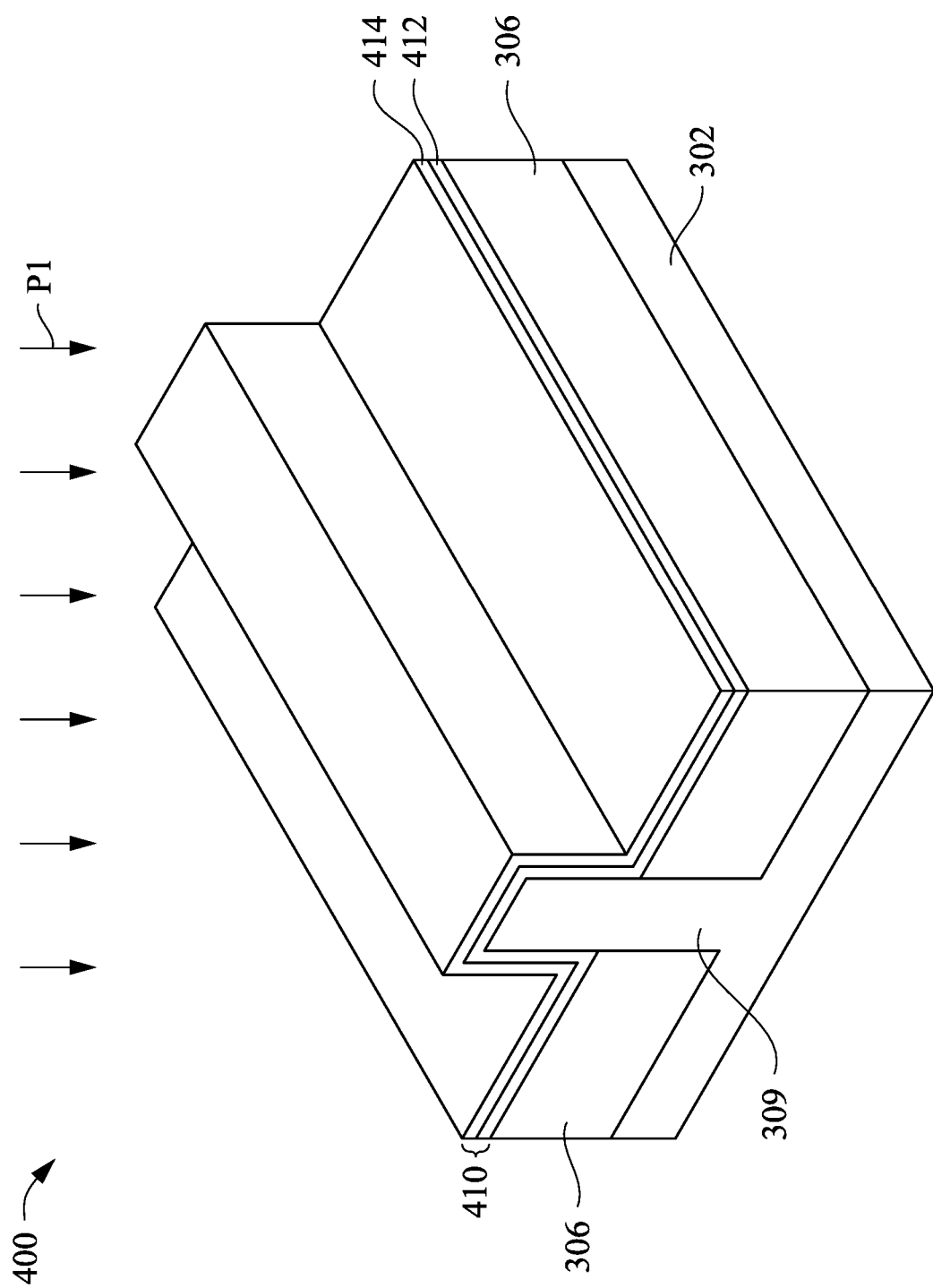
FIGS. 16A-16C are perspective views of a FinFET device at various stages of fabrication in accordance with some embodiments of the present disclosure.
Figure 16B:
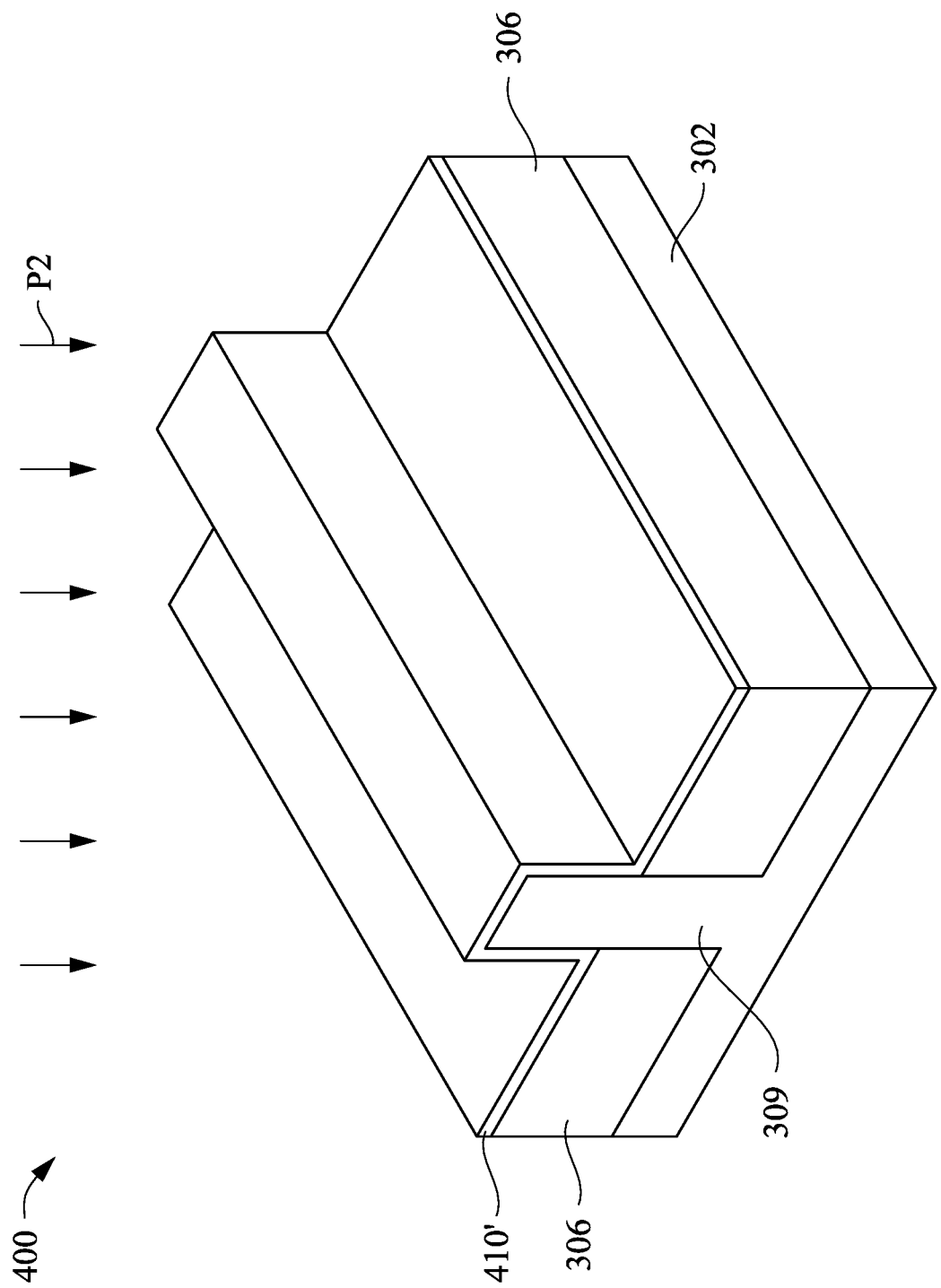
Figure 16C:
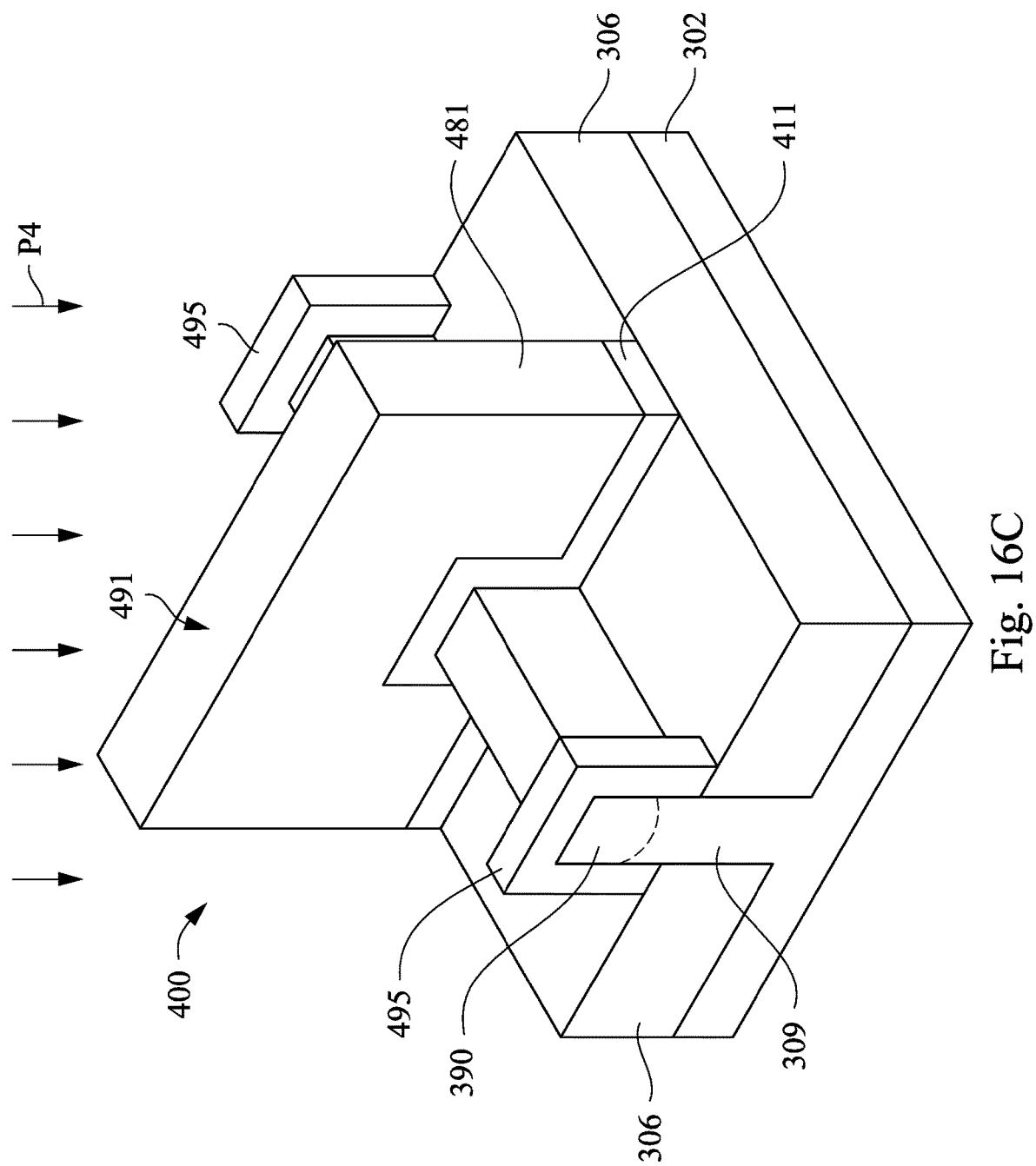

FIGS. 16A-16C are perspective views of a FinFET device 400 device at various stages of fabrication in accordance with some embodiments of the present disclosure.

Operations for forming the FinFET device 400 before the structure shown in FIG. 16A are substantially the same as the operations for forming the FinFET device 300 shown in FIG. 15, and the related detailed descriptions may refer to the foregoing paragraphs and are not discussed again herein. The differences between the present embodiments and the embodiments in FIGS. 15B-15G are operations of forming the dielectric stack.

Reference is made to FIG. 16A. A dielectric stack 410 is conformally formed over the semiconductor fin 309 and the STI regions 306. In some embodiments, the dielectric stack 410 is a bi-layered structure and includes a first layer 412 and a second layer 414 which are made of different high-k dielectric materials. For example, the first layer 412 is made of $Y_2O_3$ and the second layer 414 is made of $Al_2O_3$. In some embodiments, the dielectric stack 410 may be substantially the same as the dielectric stack 210 shown in FIG. 10 and thus is not repeatedly described for the sake of brevity.

As shown in FIG. 16A, in some embodiments, the first layer 412 is disposed between the semiconductor fin 309 and the second layer 414 and is in contact with the semiconductor fin 309. The second layer 414 is separated from the semiconductor fin 309 and is in contact with the first layer 412.

In some embodiments, an atomic layer deposition (ALD) process P1 is employed to form the first and second layers 412. As a result, the thickness of the layer 412 can be controlled using cycle times of the ALD process P1. In some embodiments, the ALD process P1 may include a plurality of cycles (e.g., about 10 cycles to about 20 cycles) to form the first layer 412 with a thickness ranging from about 2.1 nm to about 2.5 nm, but the present disclosure is not limited thereto. For example, the ALD process P1 may include about 16 cycles. After the deposition of the first layer 412 made of $Y_2O_3$, the second layer 414 made of $Al_2O_3$ is deposited on the first layer 412 performed by another ALD process P1. In some embodiments, the ALD process P1 may include a plurality of cycles (e.g., about 50 cycles to about 60 cycles) to form the second layer 414 with a thickness ranging from about 4.8 nm to about 5.2 nm, but the present disclosure is not limited thereto. For example, the ALD process P1 may include about 56 cycles. Although the thicknesses of the first and second layers 412 and 414 are different, they are both less than about 10 nm, which in turn will be advantageous for dielectric enhancement using an annealing process P2 performed in a following stage (as shown in FIG. 16B). In some embodiments, the first and second layers 412 and 414 are in-situ formed in the same process apparatus (i.e., performed in the same ALD chamber). In some embodiments, the first and second layers 412 and 414 are ex-situ formed in different process apparatuses (i.e., performed in different ALD chambers).

Reference is made to FIG. 16B. After the dielectric stack 410 shown in FIG. 16A is formed, an annealing process P2 is performed on the dielectric stack 410. In this way, the resulting dielectric layer 410' can have a higher dielectric constant than the un-annealed dielectric stack 410. Moreover, the annealing process P2 will result in inter-diffusion between the first and second dielectric layers 412 and 414. In some embodiments, the inter-diffusion may result in merging the first and second dielectric layers 412 and 414 as the dielectric layer 410' without a distinguishable interface. Detailed conditions of the annealing process P2 and the resultant dielectric constant enhancement are discussed previous with respect to FIGS. 11A and 11B, and thus not repeated for the sake of brevity.

Reference is made to FIG. 16C. After the dielectric layer 410' is formed, a gate structure 491 is formed over the semiconductor fin 309. The gate structure 491 includes a gate dielectric 411 and a gate electrode 481. The gate structure 491 extends across the semiconductor fin 309 and has a longitudinal axis that is substantially perpendicular to the longitudinal axes of the semiconductor fin 309. Formation of the gate structure 491 is the same as formation of the gate structure 391 as shown in FIG. 15G, and thus detailed description thereof is not repeated for the sake of brevity.

Following Embodiments are associated with gate-all-around (GAA) devices comprising gate dielectrics with improved dielectric constant as discussed previously. The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 17, 18, 19A, 20A, 21A, 22A, 23A, and 24A and FIGS. 25-27 are perspective views and cross-section views of a gate-all-around (GAA) device 500 respectively at various stages of fabrication in accordance with some embodiments of the present disclosure. FIGS. 19B, 20B, 21B, 22B, 23B, and 24B are cross-section views along line B'-B' in FIGS. 19A, 20A, 21A, 22A, 23A, and 24A respectively. FIG. 24C is a cross-section view along ling C'-C' in FIG. 24A. FIG. 24D is a top view of the GAA device 500 in FIG. 24A.

Figure 17:
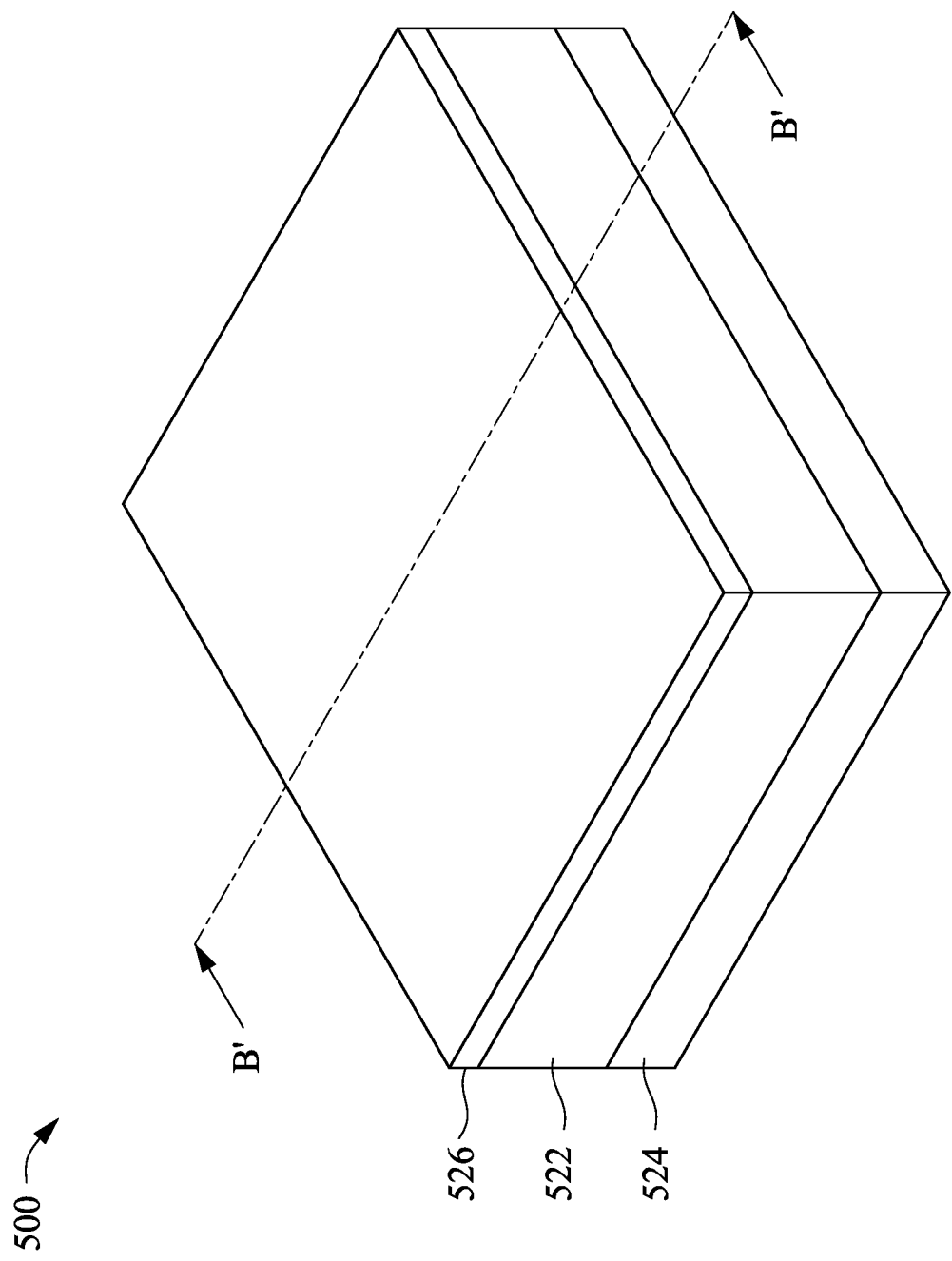
FIGS. 17, 18, 19A, 20A, 21A, 22A, 23A, and 24A and FIGS. 25-27 are perspective views and cross-section views of a gate-all-around (GAA) device respectively at various stages of fabrication in accordance with some embodiments of the present disclosure.

Reference is made to FIG. 17. An intermediate structure is shown having an insulating layer 522 formed on an underlying layer 524. A semiconductor layer 526 is formed on the insulating layer 522. This type of structure is sometimes referred to as a silicon-on-insulator substrate and is commonly available as a starting material.

The underlying layer 524 will often be a silicon wafer, for example. However, the underlying layer 524 may be another type of layer, including but not limited to: an elemental semiconductor, such as germanium; an alloy semiconductor, such as silicon-germanium; or a compound semiconductor, such as gallium arsenide or indium phosphide, for example.

The insulating layer 522 in some embodiments may be referred to as a "buried oxide" layer. However, the insulating layer 522 may be composed of a material or a combination of materials from a large variety of materials, including but not limited to: silicon dioxide, silicon nitride, aluminum oxide, plastic, or polymer, for example.

The semiconductor layer 526 may be composed of a material or a combination of materials from a large variety of materials, including but not limited to: any semiconductor material, silicon, carbon, elemental semiconductor material (e.g., germanium), alloy semiconductor material (e.g., silicon-germanium, silicon-germanium-carbon), compound semiconductor material (e.g., indium phosphide, gallium arsenide), plastic, or polymer, for example.

Figure 18:
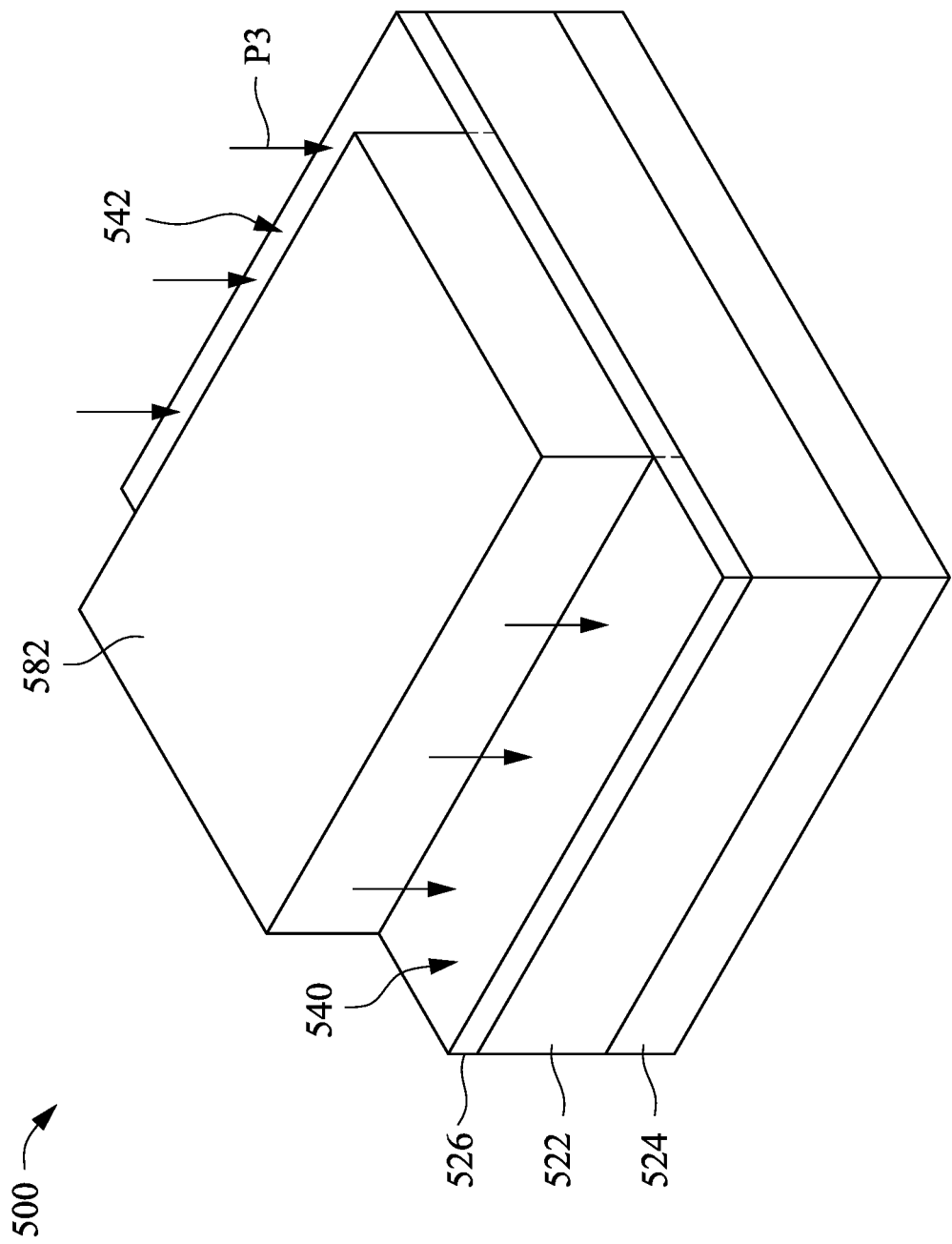

Reference is made to FIG. 18. In the illustrative embodiments, a patterned photoresist 582 is formed on the semiconductor layer 526. Source/drain regions 540 and 542 are then formed by an ion implantation process P3 using the patterned photoresist 582 as a mask. After the performing of the implantation process P3, the patterned photoresist 582 is removed using, for example, acetone. In some embodiments, after removing the patterned photoresist 582, the dopants in the source/drain regions 540 and 542 can be activated using, for example, an anneal process.

Figure 19A:
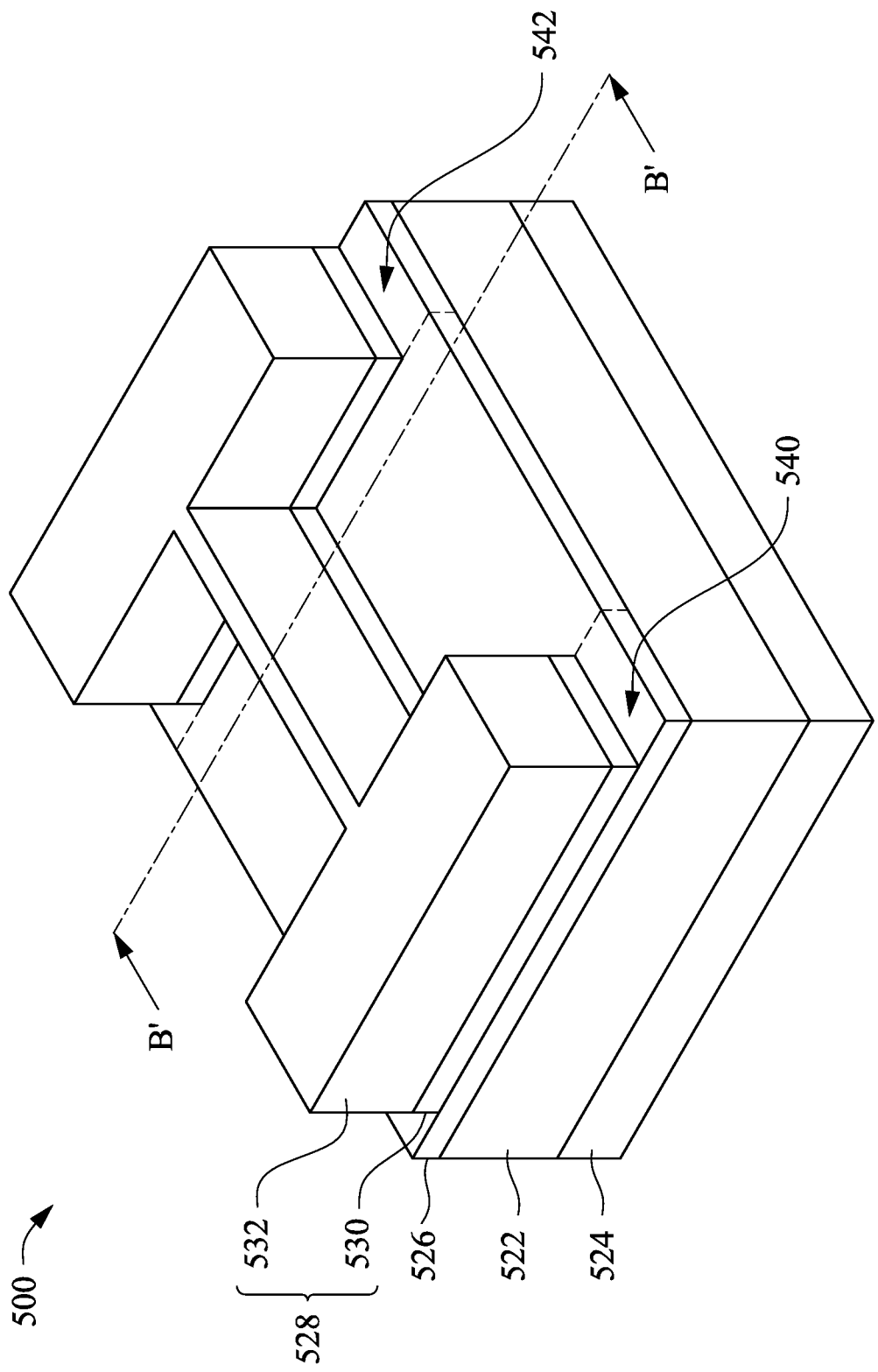
Figure 19B:
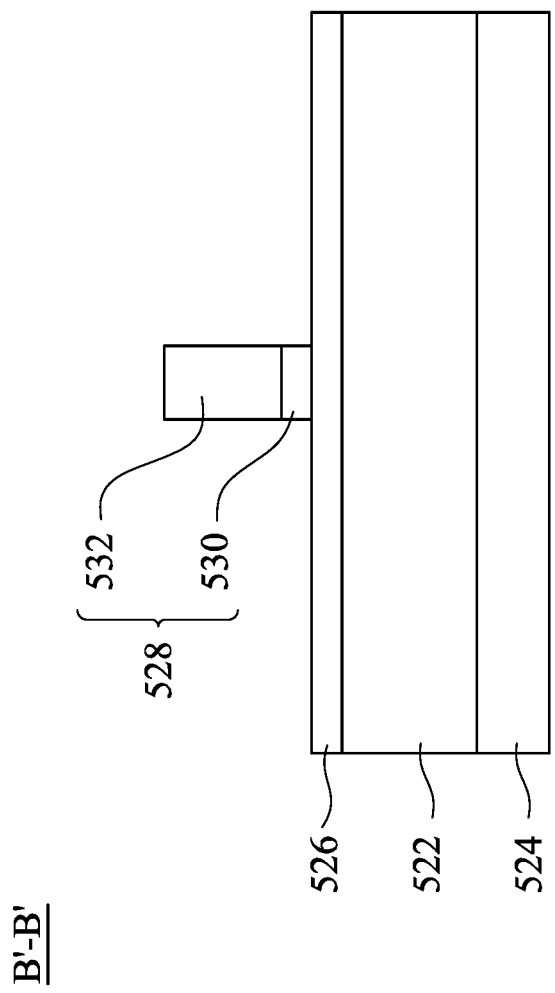

Reference is made to FIGS. 19A and 19B. A patterned active region mask 528 is formed on the semiconductor layer 526. The mask 528 may be formed from a pad silicon oxide layer 530 and a silicon nitride layer 532, for example. With the mask 528 in place having a pattern desired to be formed in the semiconductor layer 526, the semiconductor layer 526 is anisotropically etched (e.g., dry plasma etching) to conform the semiconductor layer 526 to the pattern of the mask 528. The resulting structure is shown in FIGS. 20A and 20B.

Figure 20A:
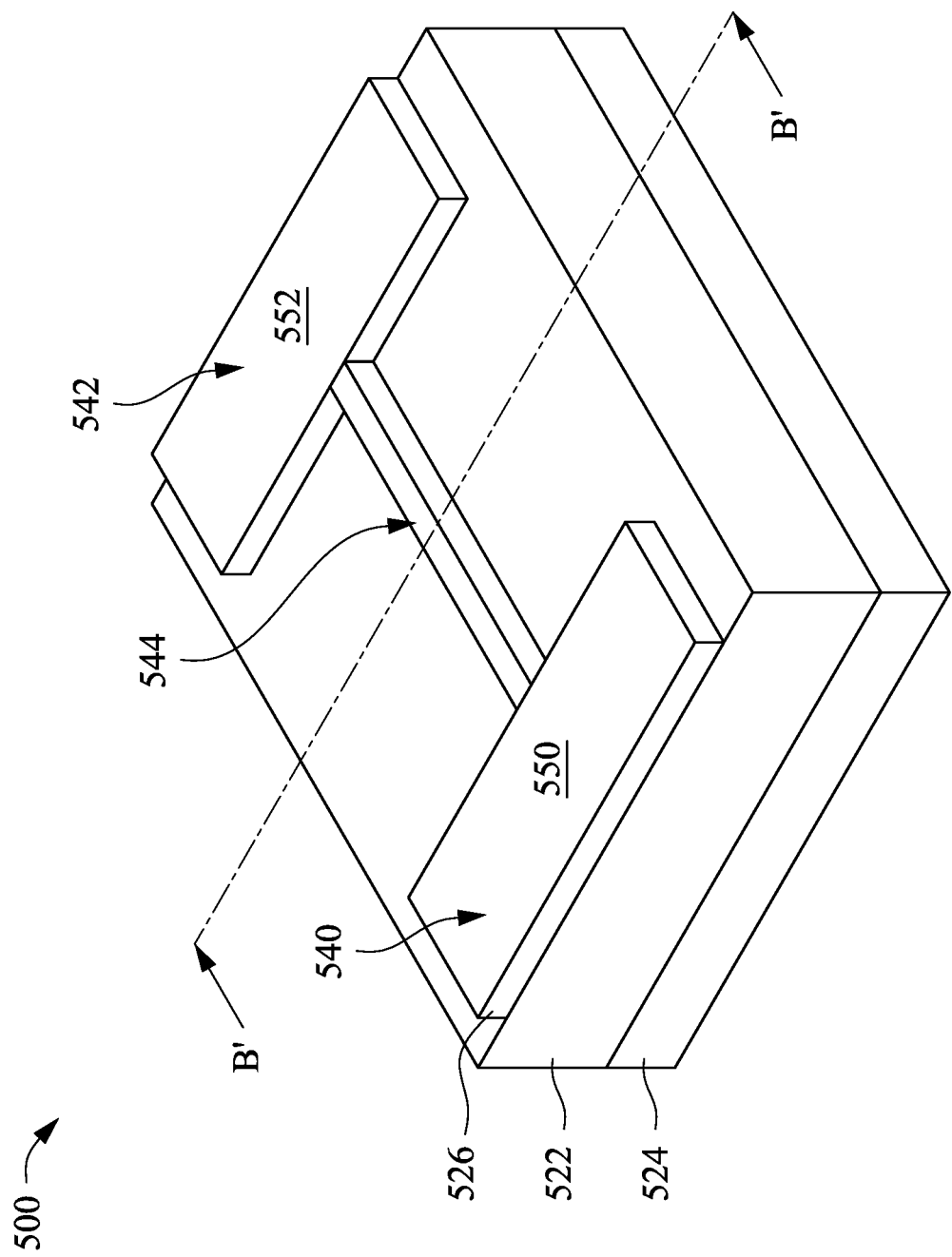

Reference is made to FIGS. 20A and 20B. The mask 528 has been removed and the patterned semiconductor layer 526 remains in the form of an H-shaped, thin silicon island. However, in other embodiments (not shown), the patterned semiconductor layer 526 may have other shapes (e.g., U-shaped, V-shaped, I-shaped, L-shaped, etc.). The patterned silicon layer 526 has a source region 540, a drain region 542, and a channel region 544. The channel region 544 extends between the source region 540 and the drain region 542. As shown in FIG. 20A, the channel region 544 has a width that is narrower than contact portions 550 and 552 of the source/drain regions 540 and 542, respectively.

Figure 21A:
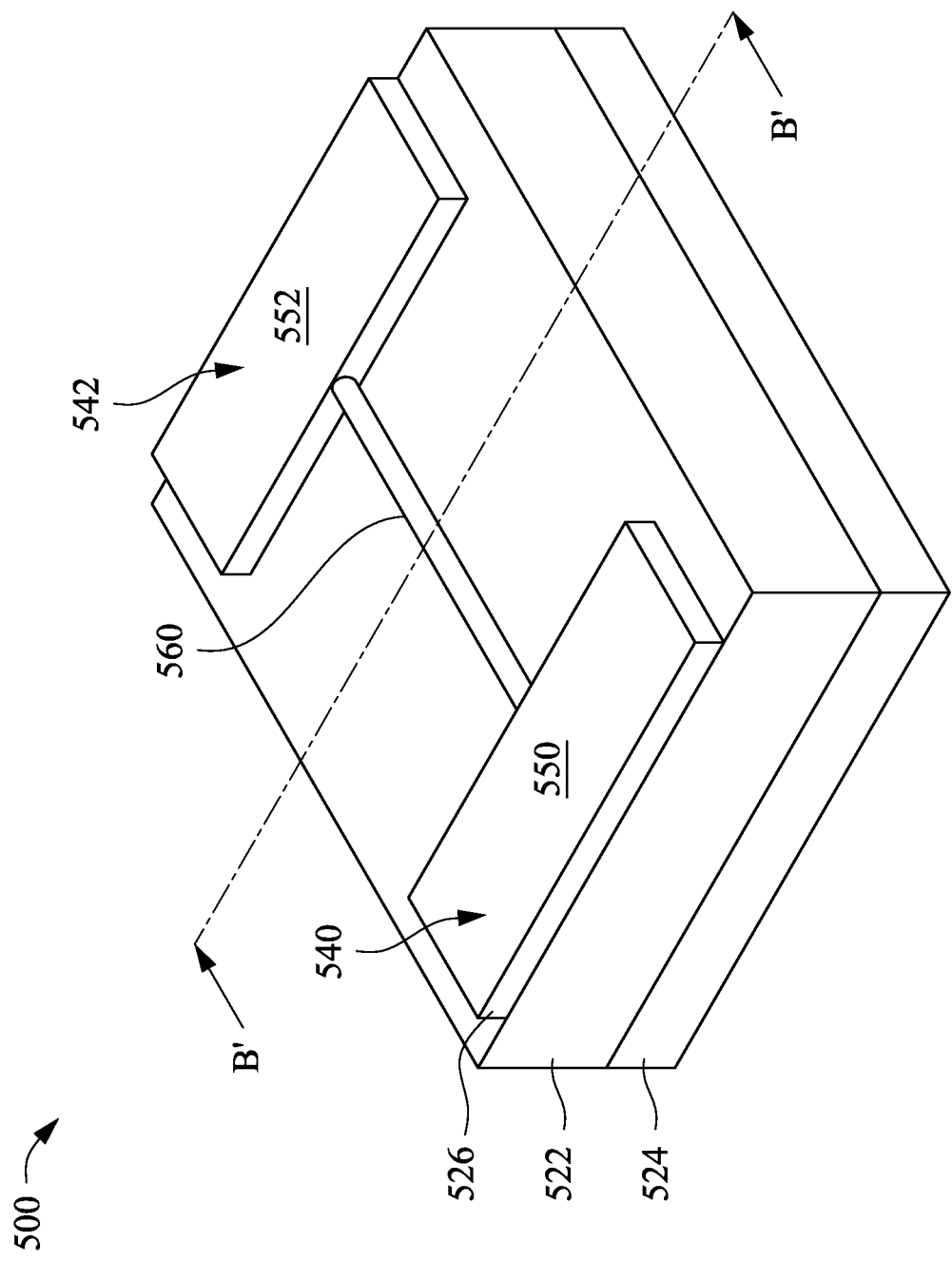
Figure 21B:
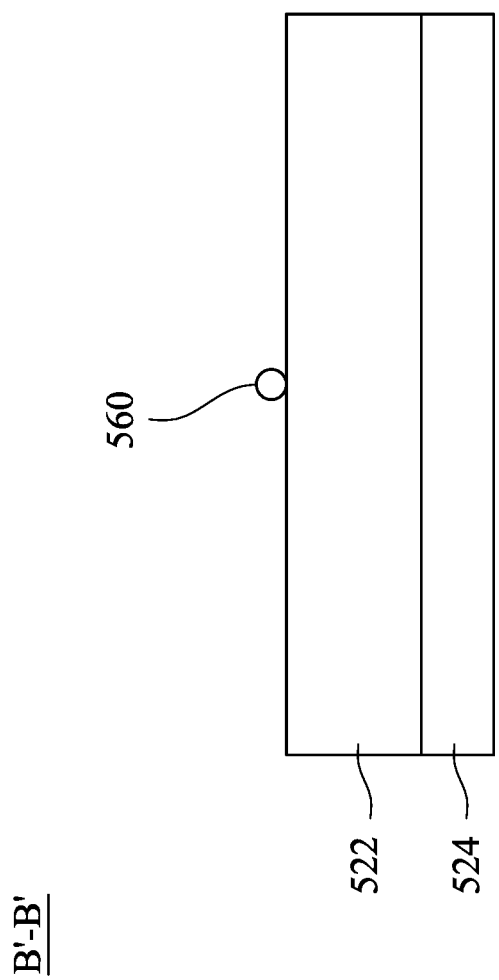

Reference is made to FIGS. 21A and 21B. Next, the silicon atoms in the patterned semiconductor layer 526 are re-arranged by annealing the semiconductor layer 526 at elevated temperatures. The re-arrangement is induced by surface migration of silicon atoms driven by a tendency to minimize surface tension. During the annealing, the re-arrangement of the atoms at the narrow channel region 544 causes the corners of the channel region 544 to be rounded, as shown in FIGS. 21A and 21B, to transform the channel region 544 into a nano-rod structure 560. If carried out long enough and/or under sufficient heat, the resulting nano-rod structure 560 may be rounded having a circular-shaped cross-section, as shown in FIG. 21B. The contact portions 550 and 552 of the source/drain regions 540 and 542 will also likely experience slight shape changes, such as rounding of at least some of their corners. But because the contact portions 550 and 552 are much wider than the channel region, these contact portions 550 and 552 will still be substantially flat in shape or with only a slight curvature. The contact pad portions of the source/drain regions serve to provide a portion onto which metallic or conductive materials form electrical connection with the source/drain regions. It is understood that the contact pad is an optional feature of this disclosure. If the contact pad portions of the source/drain regions are omitted, the patterned semiconductor layer may be I-shaped, for example. In this case, the electrical connection between the metallic or conductive material and the source/drain regions may be formed directly on the nano-rod structure.

Example parameters for the annealing process used to round the corners of the channel region 544 will be described next. The temperature for the annealing process may range from about 600° C. to about 1200° C. The anneal time may range from about 1 second to about 2 hours. The pressure in the reaction chamber (not shown) used for the annealing process may vary, depending in part upon the environment within the reaction chamber. The reaction chamber may be a chemical vapor deposition (CVD) epitaxial reactor, for example. The annealing process may occur in a reaction chamber having an environment of hydrogen gas ($H_2$) at a partial pressure ranging from about $1.0\times10^{-9}$ torr to about 800 torr. In another embodiment, the annealing environment may be evacuated (i.e., a vacuum environment) at a pressure ranging from about $1.0\times10^{10}$ torr to about $1.0\times10^{-3}$ torr. In still another embodiment, the annealing environment may be nitrogen gas ($N_2$) at a pressure ranging from about $1.0\times10^{-9}$ torr to about 800 torr. The annealing environment may also be one of the following environments (but not limited to): an environment of a mixed gas including hydrogen and argon; an environment of a mixed gas including hydrogen and nitrogen; an environment with other gases in addition to hydrogen to form a mixed gas ambient; or an environment of an inert gas, for example.

Figure 22A:
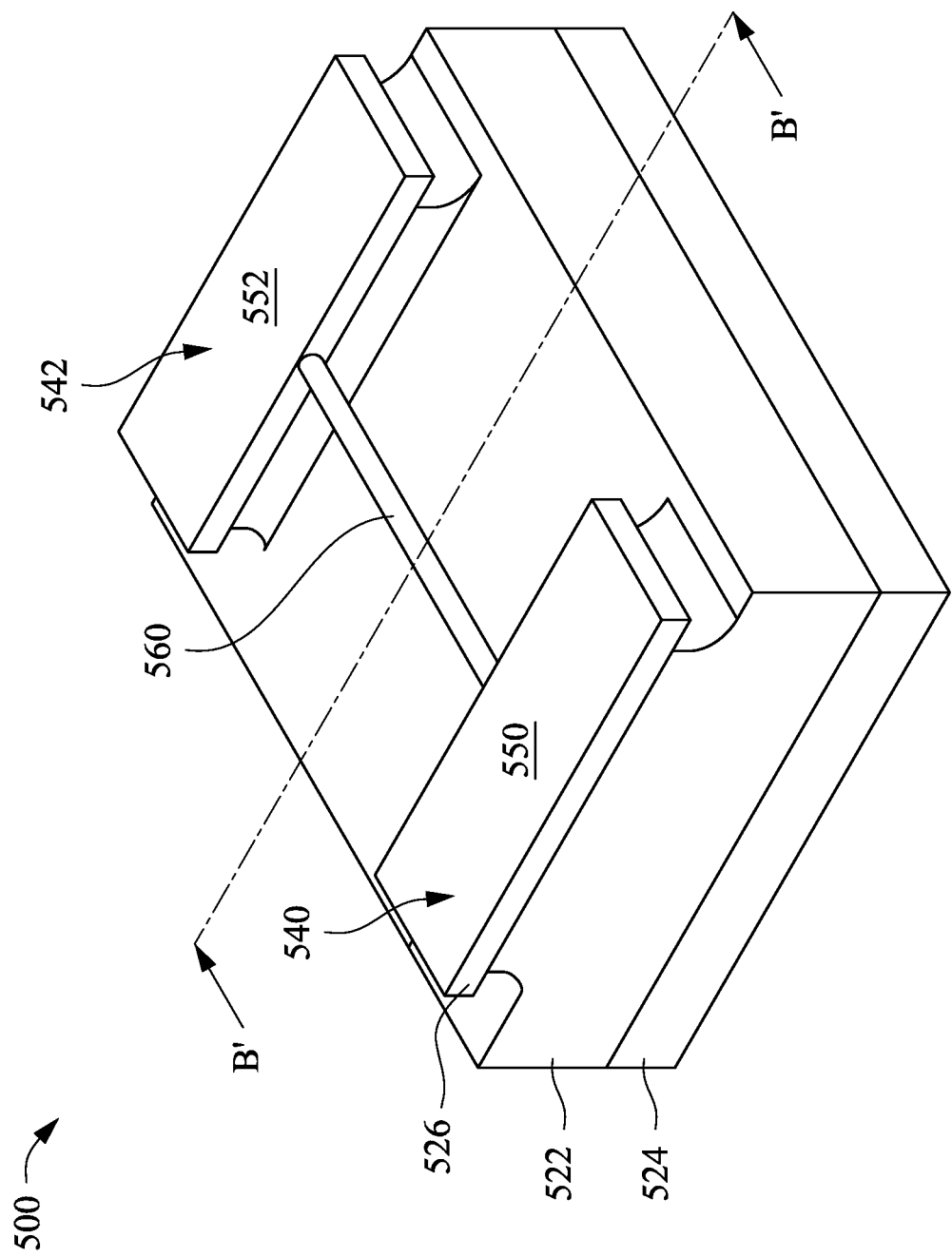
Figure 22B:
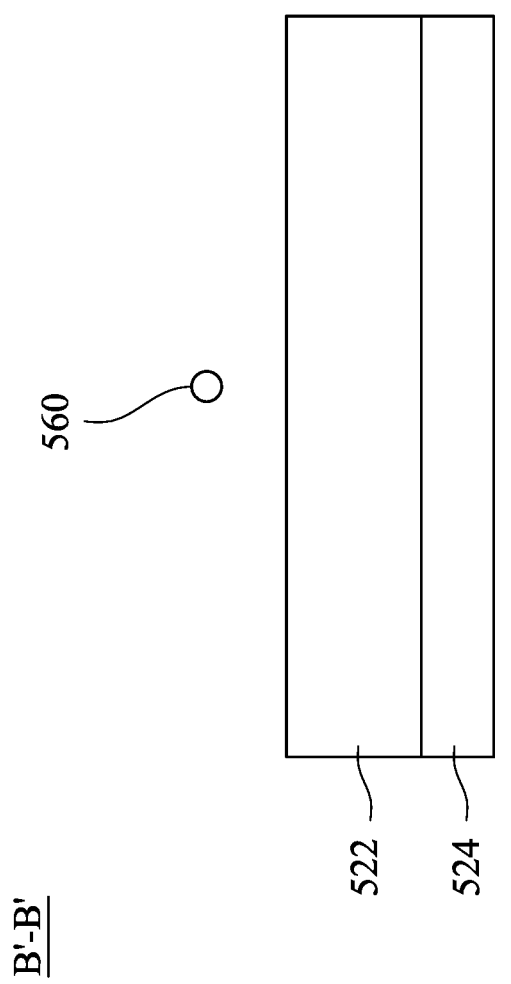

Reference is made to FIGS. 22A and 22B. After forming the nano-rod structure 560, the insulating layer 522 may be etched to expose the bottom surface of the nano-rod 560, as shown in FIGS. 22A and 22B. The nano-rod 560 is supported by the contact portions 550 and 552 of the source/drain regions 540 and 542. The use of the annealing process of the present disclosure to form a nano-rod structure 560 (described above) may also be applied to a non-wrap-around gate design (i.e., where the gate electrode only covers three sides of the gate channel, or where the gate electrode does not wrap around the gate channel).

Figure 23A:
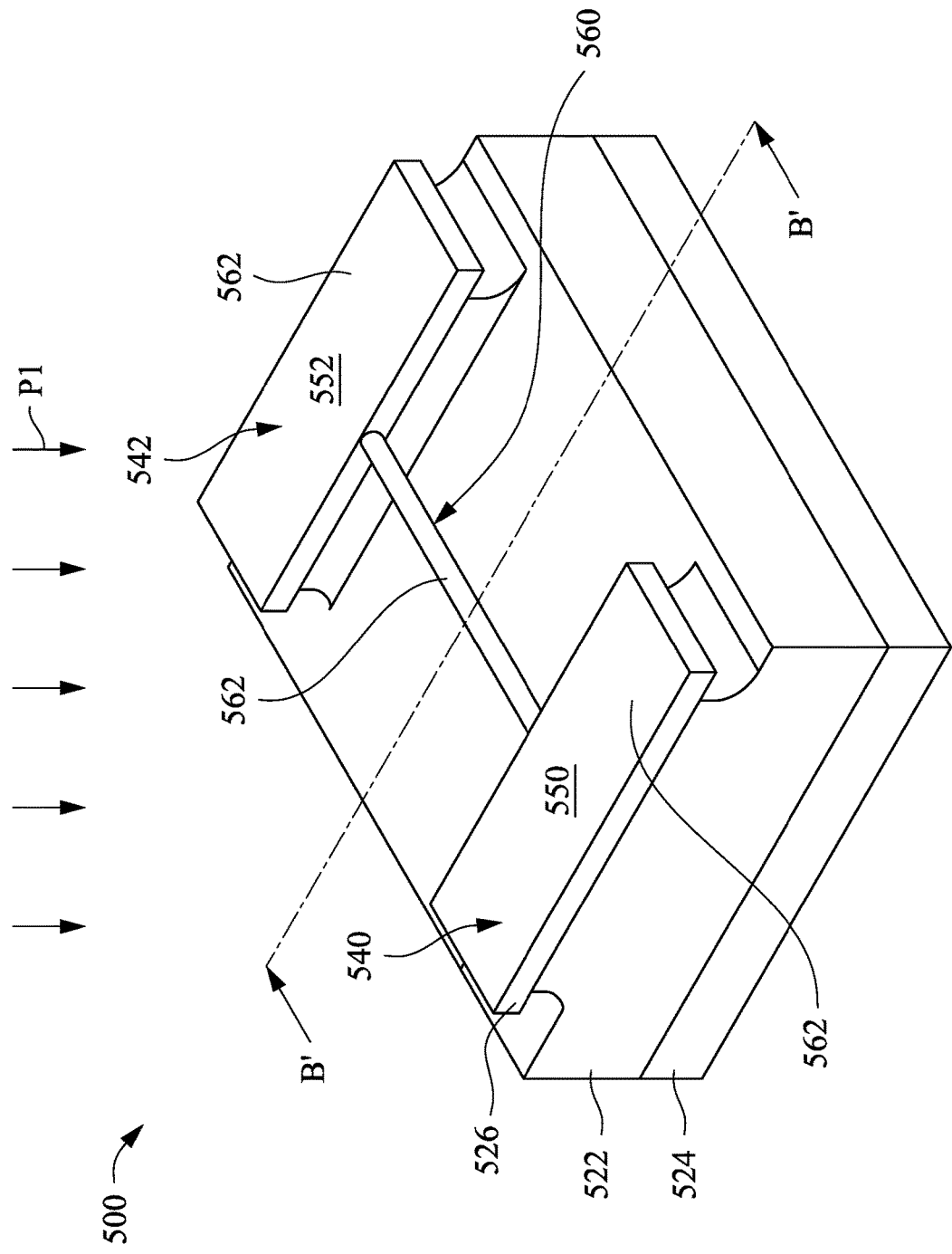
Figure 23B:
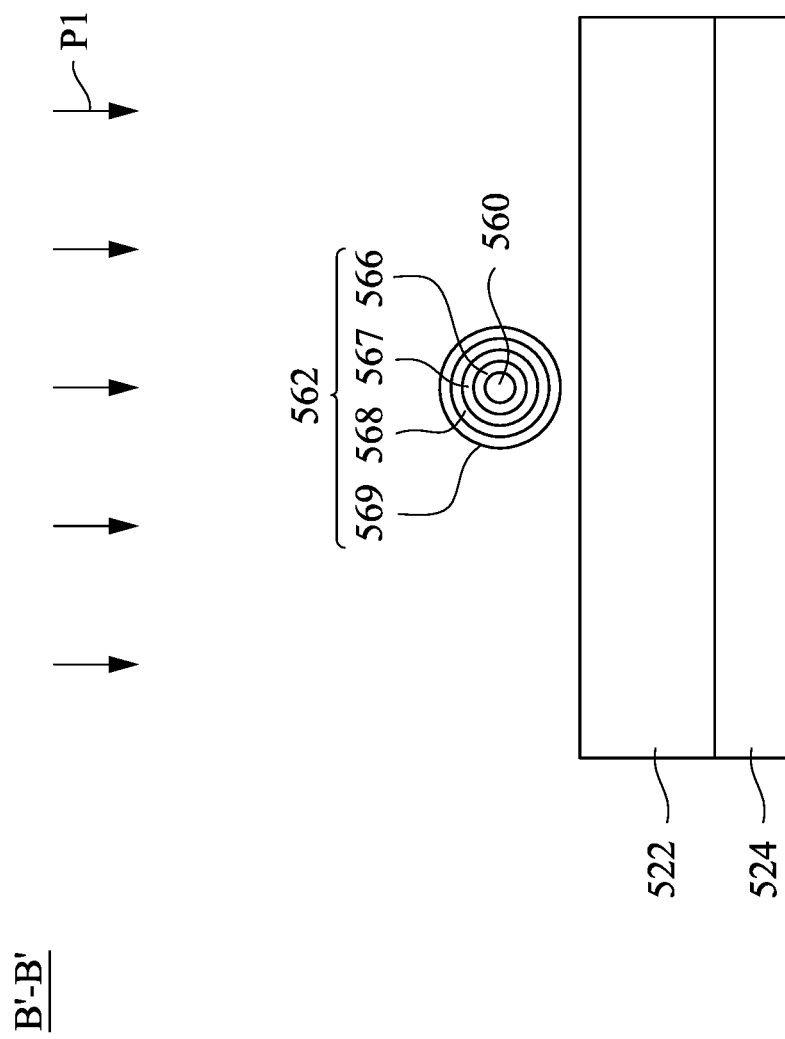

Reference is made to FIGS. 23A and 23B. After the exposing of the bottom surface of the nano-rod 560, a dielectric stack 562 is formed on the surface of and abuts the nano-rod structure 560 (as well as on the other exposed portions of the semiconductor layer 526) using ALD processes P1, as shown in FIGS. 23A and 23B. As shown in FIG. 23B, because the nano-rod 560 is exposed on all sides after etching away part of the insulating layer 522, the dielectric stack 562 may be formed around the nano-rod surface. The dielectric stack 562 can be substantially the same as the dielectric stack 110 shown in FIG. 1A respectively and thus are not repeatedly described for the sake of brevity. Each dielectric layer 566, 567, 568, 569 of the dielectric stack 110 has a thickness less than about 5 Å, so that the polarizability of the dielectric stack can be enhanced, which in turn will improve the dielectric constant of the dielectric stack 562, as discussed previously.

Figure 24A:
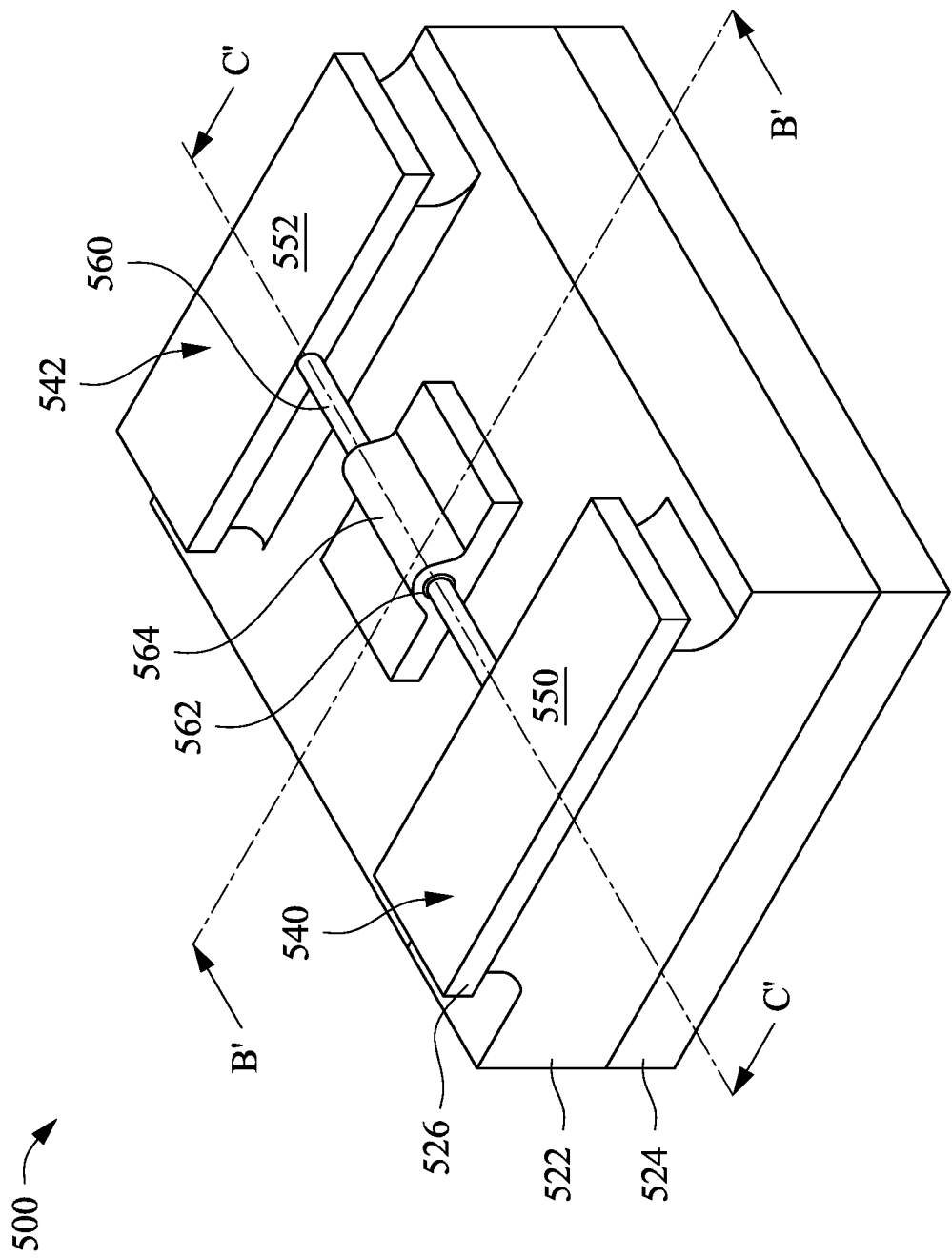
Figure 24B:
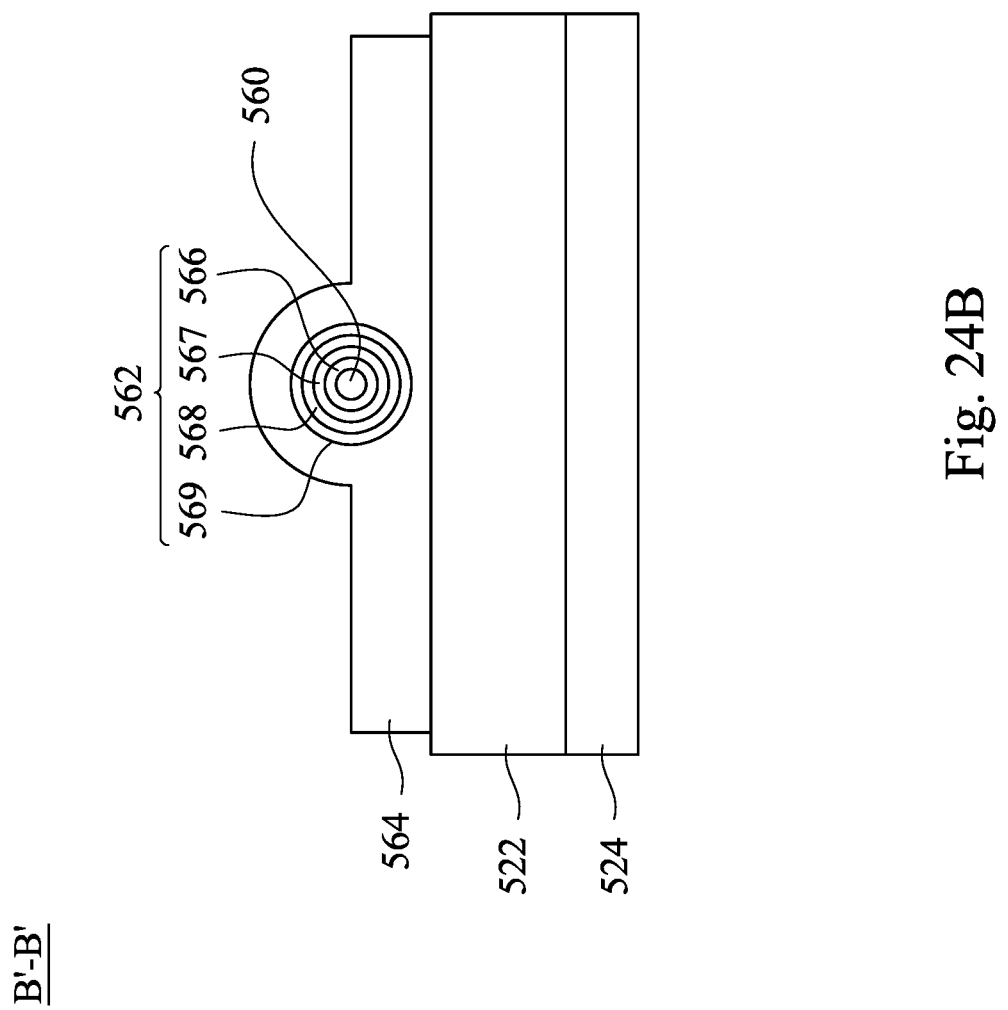
Figure 24C:
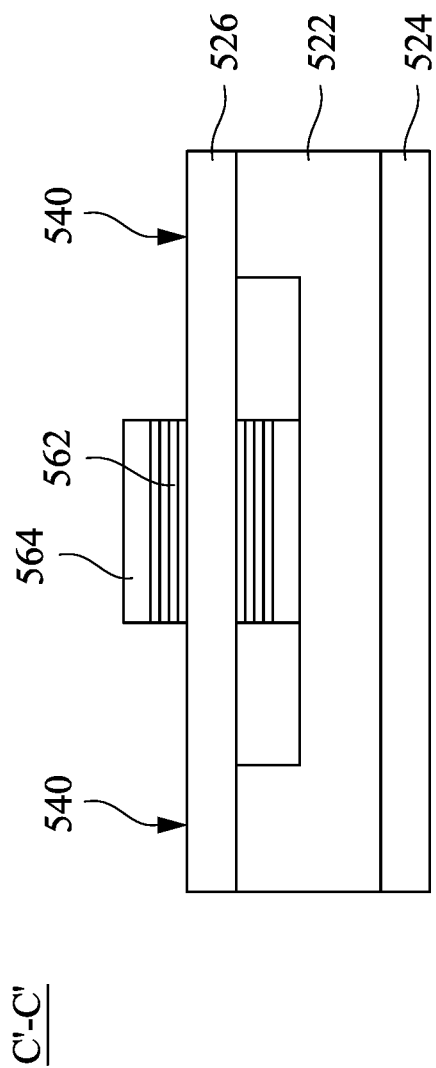
FIG. 24C is a cross-section view along ling C'-C' in FIG. 24A.
Figure 24D:
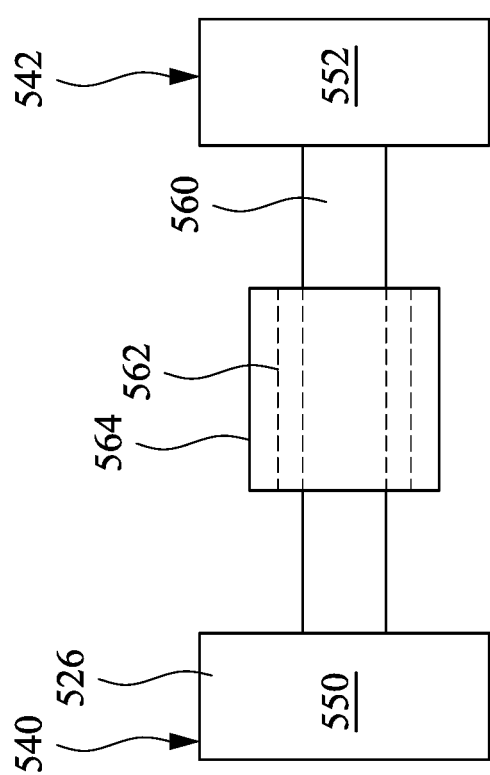
FIG. 24D is a top view of the GAA device in FIG. 24A.

Reference is made to FIGS. 24A-24D. A gate electrode material (e.g., metal) is then deposited, masked, and etched to form the gate electrode 564, as shown in FIGS. 24A and 24B As shown in FIG. 24B, because the nano-rod 560 is elevated above the insulating layer 522 (at least where the channel will be formed), the gate electrode 564 may be formed around the nano-rod 560. During or after the etching of the gate electrode material to form the patterned gate electrode 564, the dielectric stack 562 may be removed from the source/drain regions, as shown in FIG. 24A.

Figure 25:
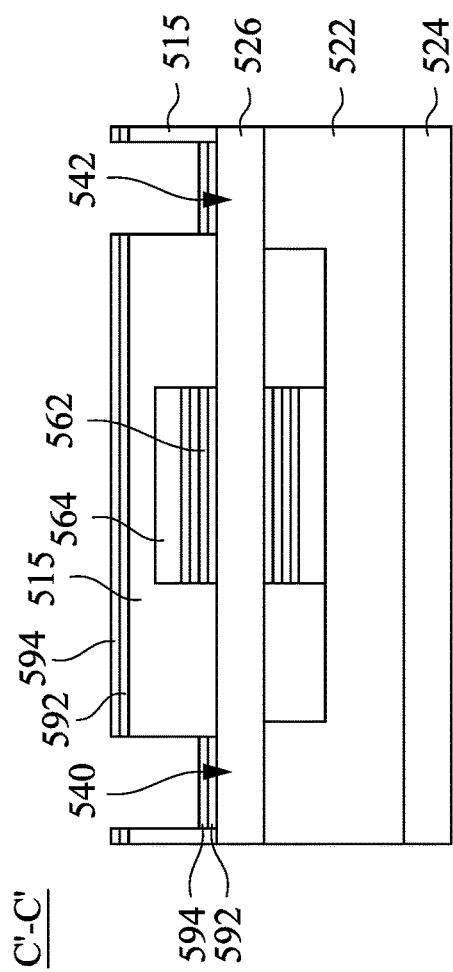
Figure 26:
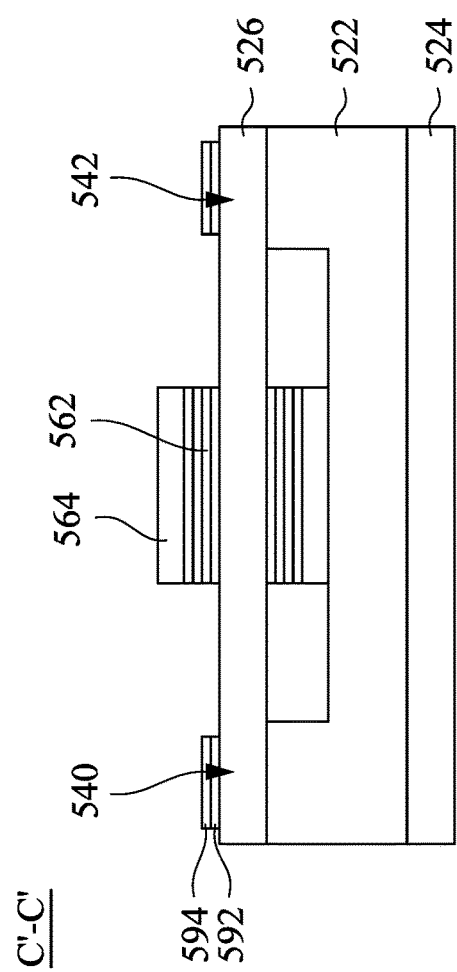

Reference is made to FIGS. 25 and 26. Source/drain contact layers 592 and 594 are formed on the source/drain regions 540 and 542 using a lift-off process. As shown in FIG. 25, a resist 515 is coated on the insulating layer 522 and is patterned to expose the source/drain regions 540 and 542. The source/drain contact layers 592 and 594 are deposited over the resist 515 and on the source/drain regions 540 and 542. In some embodiments, the resist 515 and source/drain contact layers 592 and 594 may be substantially the same as the resist 115 and source/drain contact layers 192 and 194 shown in FIG. 7 and thus are not repeatedly described for the sake of brevity.

In some embodiments, the GAA device 500 is then immersed into a tank of appropriate solvent that will react with the resist 515. The resist 515 swells, dissolves, and lifts off the source/drain contact layers 592 and 594 on the surface of the resist 515, leaving portions of the source/drain contact layers 592 and 594 over the source/drain regions 540 and 542. The resulting structure is shown in FIG. 26.

Figure 27:
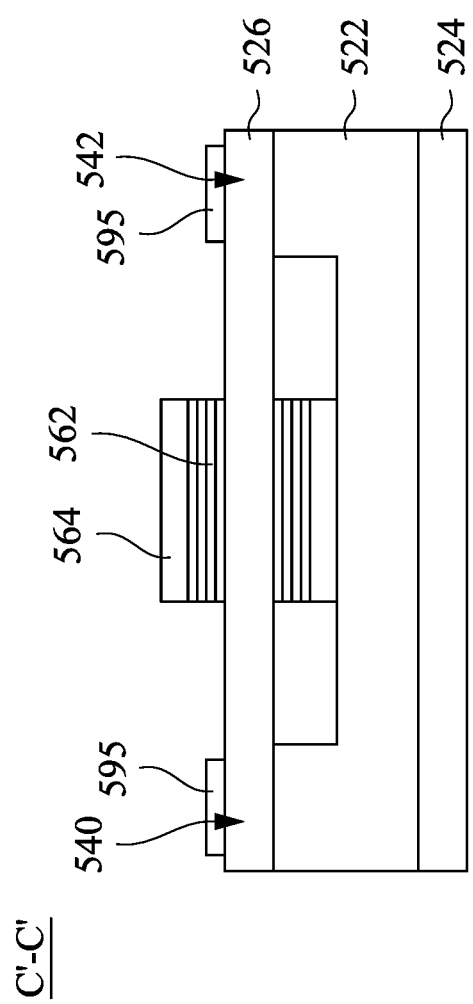

Reference is made to FIG. 27. After the source/drain contact layers 592 and 594 are formed, an anneal process P4 is performed on the source/drain contact layers 592 and 594 and thus results in forming an ohmic contact between the source/drain contact layers 592 and 594. The resulting source/drain contact layers 592 and 594 can be in combination referred to as source/drain contacts 595 over the source/drain regions 540 and 542.

Figure 28A:
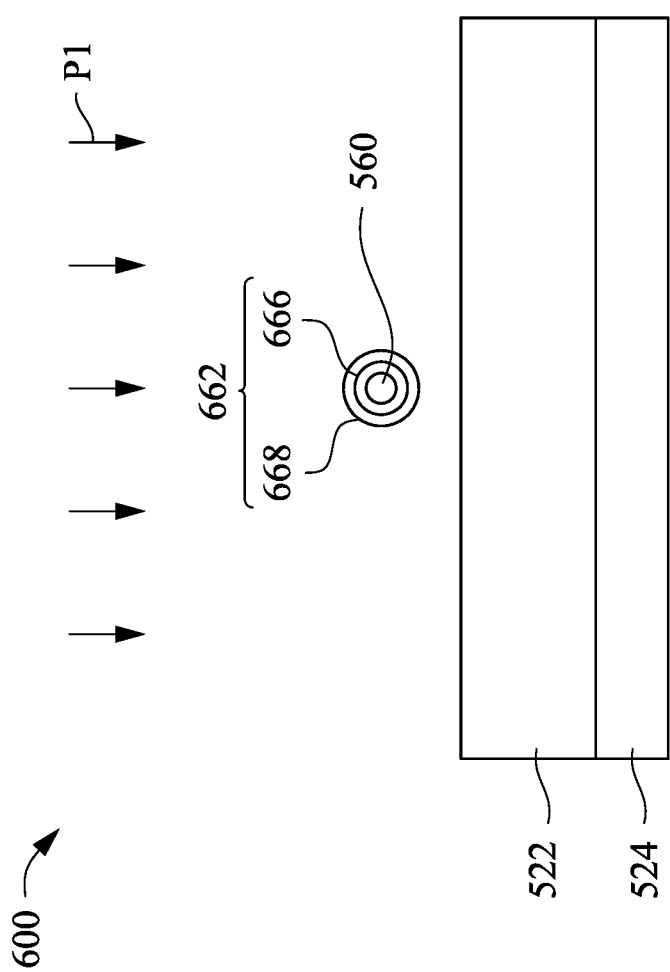
FIGS. 28A-28C are cross-section views of a GAA device at various stages of fabrication in accordance with some embodiments of the present disclosure.
Figure 28B:
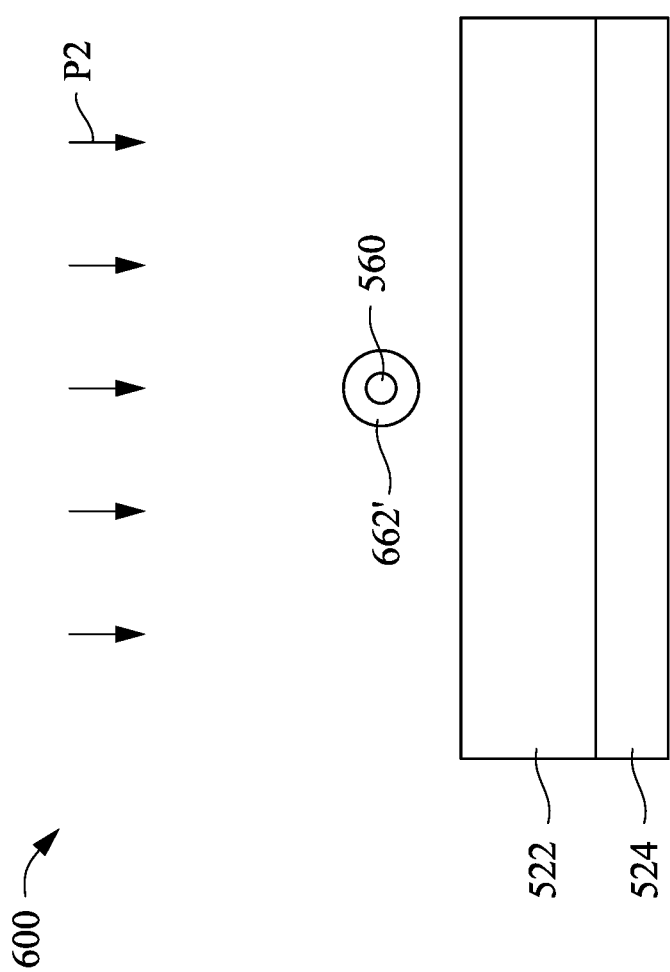
Figure 28C:
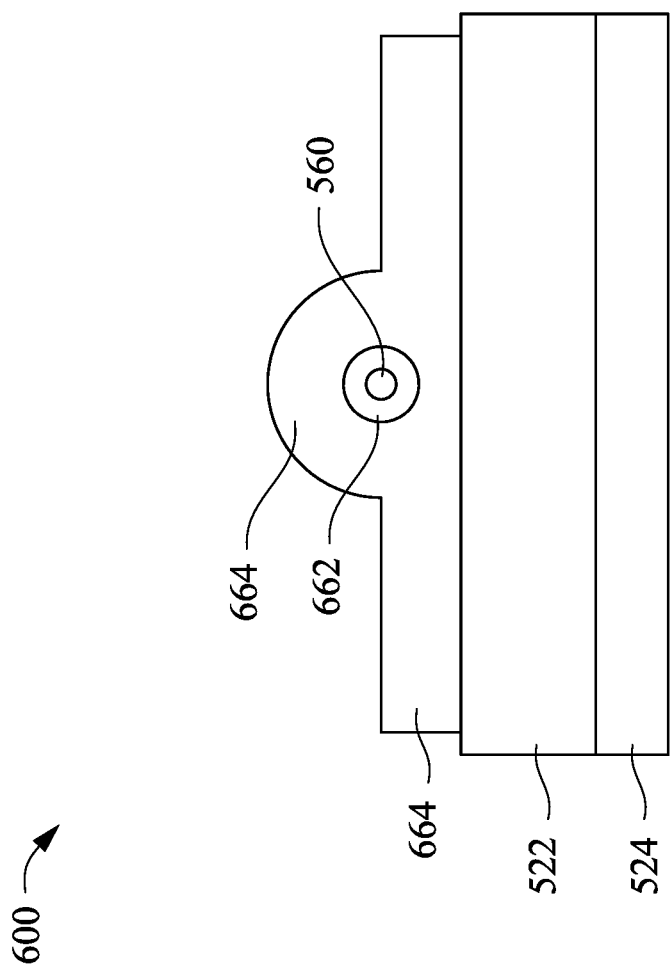

FIGS. 28A-28C are cross-section views of a GAA device 600 at various stages of fabrication in accordance with some embodiments of the present disclosure.

Operations for forming the GAA device 600 before the structure shown in FIG. 28A are substantially the same as the operations for forming the GAA device 500 shown in FIGS. 17-22B, and the related detailed descriptions may refer to the foregoing paragraphs and are not discussed again herein. The differences between the present embodiments and the embodiments in FIGS. 23A-27 are operations of forming a gate dielectric.

Reference is made to FIG. 28A. A dielectric stack 662 is formed on the surface of and about the nano-rod structure 560 shown in FIGS. 22A and 22B. In FIG. 23B, because the nano-rod 560 is exposed on all sides after etching away part of the insulating layer 522, the dielectric stack 662 may be formed around the nano-rod surface. In some embodiments, the dielectric stack 662 is a bi-layered structure and includes a first layer 666 and a second layer 668 which are made of different high-k dielectric materials. For example, the first layer 661 is made of $Y_2O_3$ and the second layer 668 is made of $Al_2O_3$. In some embodiments, the dielectric stack 662 may be substantially the same as the dielectric stack 210 shown in FIG. 10 and thus is not repeatedly described for the sake of brevity.

As shown in FIG. 28A, in some embodiments, the first layer 666 is disposed between the nano-rod structure 560 and the second layer 668 and is in contact with the nano-rod structure 560. The second layer 668 is separated from the nano-rod structure 560 and is in contact with the first layer 666.

In some embodiments, an atomic layer deposition (ALD) process P1 is employed to form the first and second layers 666. As a result, the thickness of the layer 666 can be controlled using cycle times of the ALD process P1. In some embodiments, the ALD process P1 may include a plurality of cycles (e.g., about 10 cycles to about 20 cycles) to form the first layer 666 with a thickness ranging from about 2.1 nm to about 2.5 nm, but the present disclosure is not limited thereto. For example, the ALD process P1 may include about 16 cycles. After the deposition of the first layer 666 made of $Y_2O_3$, the second layer 668 made of $Al_2O_3$ is deposited on the first layer 666 performed by the ALD process P1. In some embodiments, the ALD process P1 may include a plurality of cycles (e.g., about 50 cycles to about 60 cycles) to form the second layer 668 with a thickness ranging from about 4.8 nm to about 5.2 nm, but the present disclosure is not limited thereto. For example, the ALD process P1 may include about 56 cycles. Although the thicknesses of the first and second layers 666 and 668 are different, they are both less than about 10 nm, which in turn will be advantageous for dielectric enhancement using an annealing process P2 performed in a following stage (as shown in FIG. 14B). In some embodiments, the first and second layers 666 and 668 are in-situ formed in the same process apparatus (i.e., performed in the same ALD chamber). In some embodiments, the first and second layers 666 and 668 are ex-situ formed in different process apparatuses (i.e., performed in different ALD chambers).

Reference is made to FIG. 28B. After the gate dielectric stack layer 662 shown in FIG. 28A is formed, an annealing process P2 is performed on the gate dielectric stack layer 662. In this way, the resulting dielectric layer 662' can have a higher dielectric constant than the un-annealed dielectric stack 662. Moreover, the annealing process P2 will result in inter-diffusion between the first and second dielectric layers 666 and 668. In some embodiments, the inter-diffusion may result in merging the first and second dielectric layers 666 and 668 as the dielectric layer 662' without a distinguishable interface. Detailed conditions of the annealing process P2 and the resultant dielectric constant enhancement are discussed previous with respect to FIGS. 11A and 11B, and thus not repeated for the sake of brevity.

Reference is made to FIG. 28C. A gate electrode material is then deposited, masked, and etched to form the gate electrode 664 as the gate electrode 664. The gate electrode 664 may be formed around the nano-rod 560. During or after the etching of the gate electrode material to form the patterned gate electrode 664, the gate dielectric stack layer 662' may be removed from the source/drain regions.

Figure 29A:
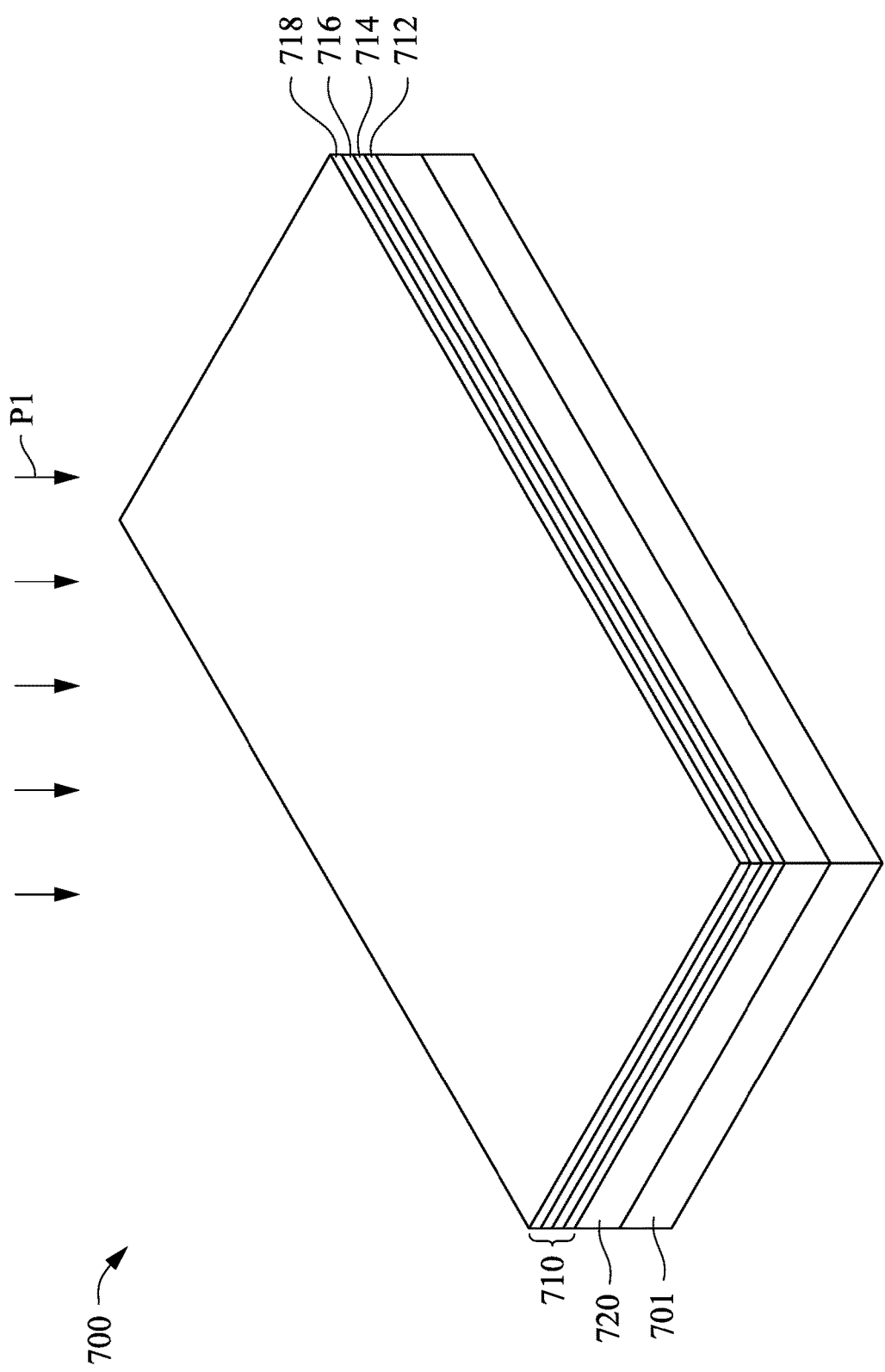
FIGS. 29A, 29B, and 29C are perspective views of a top gate TI FET (Topological insulator Field-effect transistor) at various stages of fabrication in accordance with some embodiments of the present disclosure.
Figure 29B:
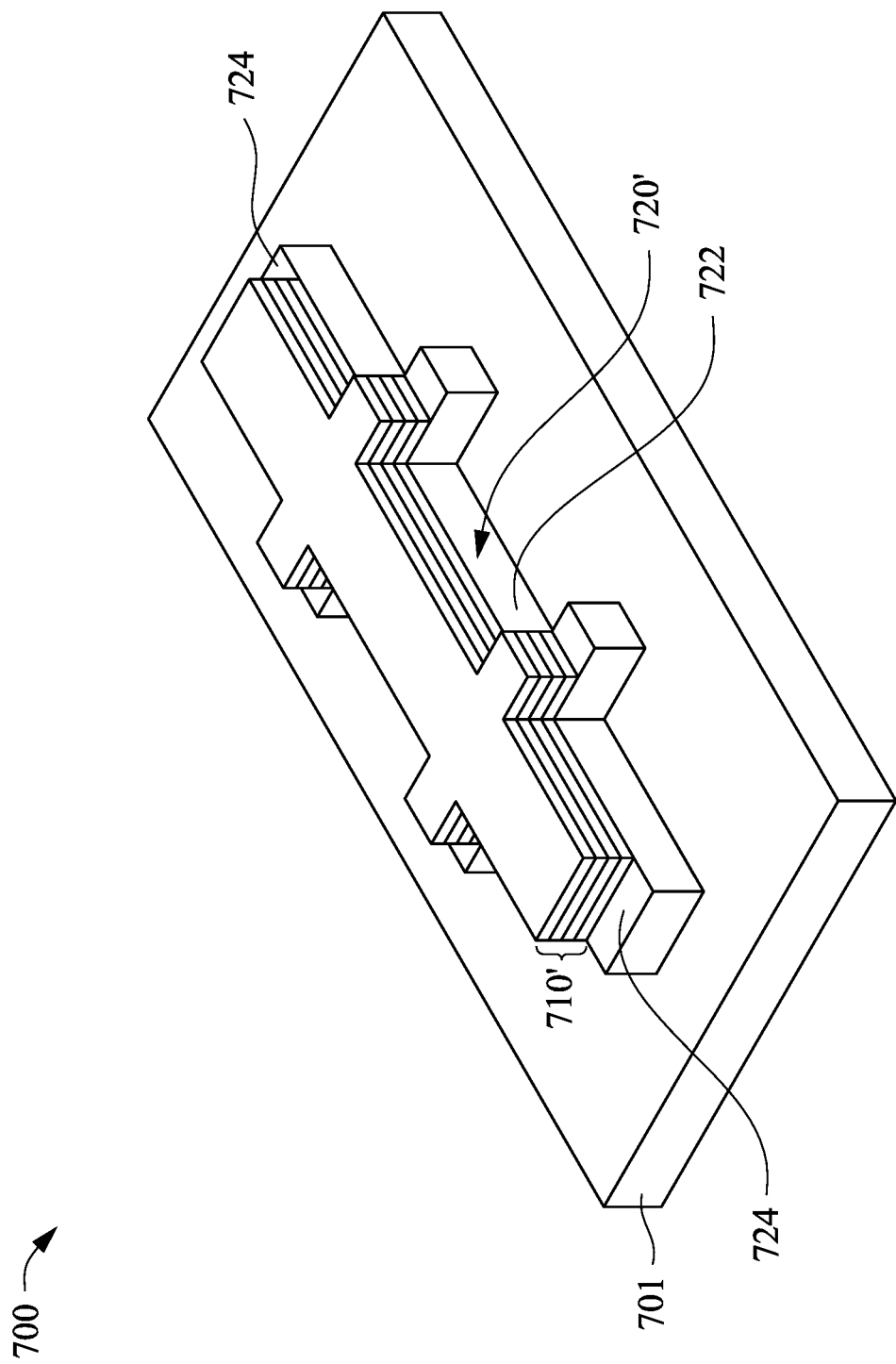
Figure 29C:
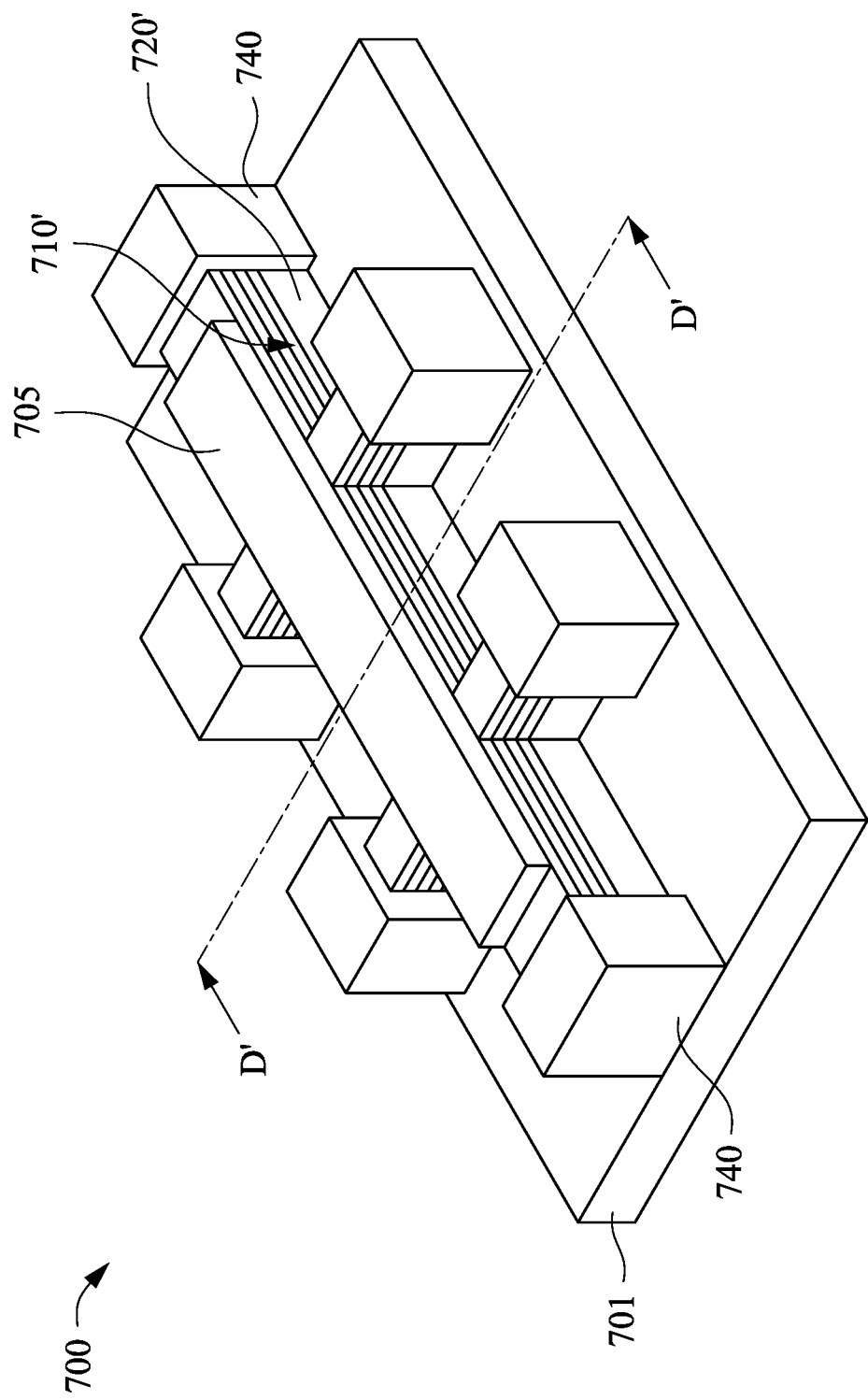
Figure 29D:
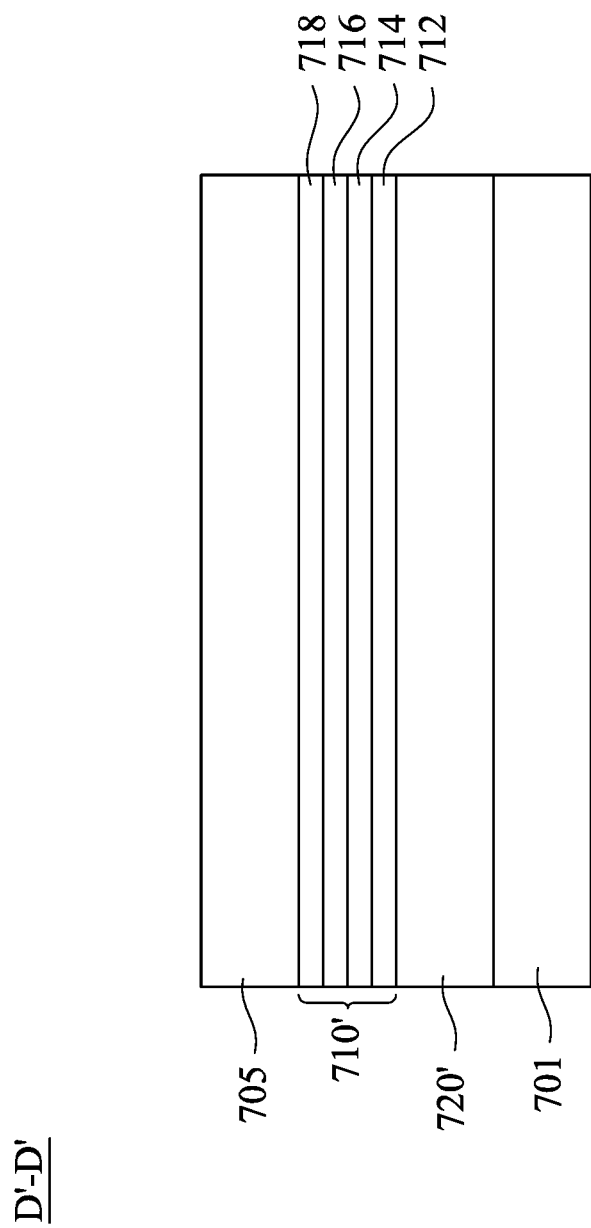
FIG. 29D is a cross-section view along line D'-D' in FIG. 29C.

FIGS. 29A, 29B, and 29C are perspective views of a top gate TI FET 700 at various stages of fabrication in accordance with some embodiments of the present disclosure. FIG. 29D is a cross-section view along line D'-D' in FIG. 29C.

Reference is made to FIG. 29A. There is illustrated a substrate 701, an active layer 720, and a dielectric stack 710. In some embodiments, the substrate 701 may include bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include sapphire, multilayered substrates, gradient substrates, or hybrid orientation substrates. Any suitable substrate may be utilized.

The active layer 720 may be formed over the substrate 701 and will be used to form a channel and source/drain areas (not illustrated in FIG. 29A but illustrated and discussed below with respect to FIG. 29B) for a single top gate TI FET 700 (also not illustrated in FIG. 29A as being completed but illustrated and described below with respect to FIG. 29C). In some embodiments, the active layer 720 may be a topological insulator material wherein the material has a bulk structure with an insulating or semiconducting (gapped) structure as well as conducting (gapless) edges or surfaces due to non-trivial topology of a band structure caused by interactions between spin and orbital degrees of freedom. In particular embodiments in which the active layer 720 is a topological insulating material, the active layer 720 may be a material such as $Bi_2Se_3$, $Bi_2Te_3$, $Sb_2Te_3$, or tetradymite-like ternary compounds with a structure such as $M_2X_2Y$ such as $Bi_2Te_2Se$, $Bi_2Te_2S$, $Bi_2Se_2S$, $Sb_2Te_2Se$, $Sb_2Te_2S$, or the like. However, any suitable topological insulator may be utilized.

Additionally, with respect to the materials utilized for the active layer 720, the material of the active layer 720 will have a critical thickness, wherein the thickness of the material of the active layer 720 will determine the properties of the material of the active layer 720 and the properties of the material for the active layer 720 will change as the thickness of the material for the active layer 720 changes. For example, in a particular embodiment in which $Bi_2Se_3$ is utilized as the material for the active layer 720, the $Bi_2Se_3$ will have a critical thickness of six quintuple layers (e.g., layers of Se—Bi—Se—Bi—Se), below which the $Bi_2Se_3$ will have properties of a semiconductor material and above which the $Bi_2Se_3$ will have properties of a topological insulator which has bulk insulator properties along with conductive surface states.

The active layer 720 may be formed using a process such as an epitaxial growth process. In a particular embodiment in which the active layer 720 is formed from a material such as $Bi_2Se_3$, the epitaxial growth process may proceed at a temperature of between about 100° C. and about 500° C., and at a pressure less than about $2.0 \times 10^{-9}$ Torr, using any suitable source or sources for bismuth and selenium, such as evaporated high-purity Bi (99.99%) and Se (99.99%). However, any suitable growth or deposition process, such as an atomic layer deposition process or the like, may also be used. Additionally, the epitaxial growth process may be continued for a time that grows the active layer 720 to a thickness less than the critical thickness.

After the active layer 720 is formed, a dielectric stack 710 is formed over the active layer 720 using ALD processes P1. In some embodiments, the dielectric stack 710 is a multi-layered structure. The dielectric stack 710 can be substantially the same as the dielectric stack 110 shown in FIG. 1A respectively and thus are not repeatedly described for the sake of brevity. Each dielectric layer 712, 714, 716, 718 of the dielectric stack 710 has a thickness less than about 5 Å, so that the polarizability of the dielectric stack can be enhanced, which in turn will improve the dielectric constant of the dielectric stack 710, as discussed previously.

Reference is made to FIG. 29B. After the dielectric stack 710 is formed, the active layer 720 and the dielectric stack 710 may be patterned to form the active region 720' and the gate dielectric stack 710', and the resulting structure is shown in FIG. 29B. The active region 720' includes a channel region 722 and source/drain regions 724. The channel region 722 is between the gate dielectric stack 710' and the substrate 701. The source/drain regions 724 are partially exposed by the gate dielectric stack 710'.

Reference is made to FIGS. 29C and 29D. After the active region 720' and the gate dielectric stack 710' are formed, a metal layer is formed on the gate dielectric stack 710' and is patterned to form the gate electrode 705, and a metal contacts 740 are further formed on the active region 720'.

Figure 30A:
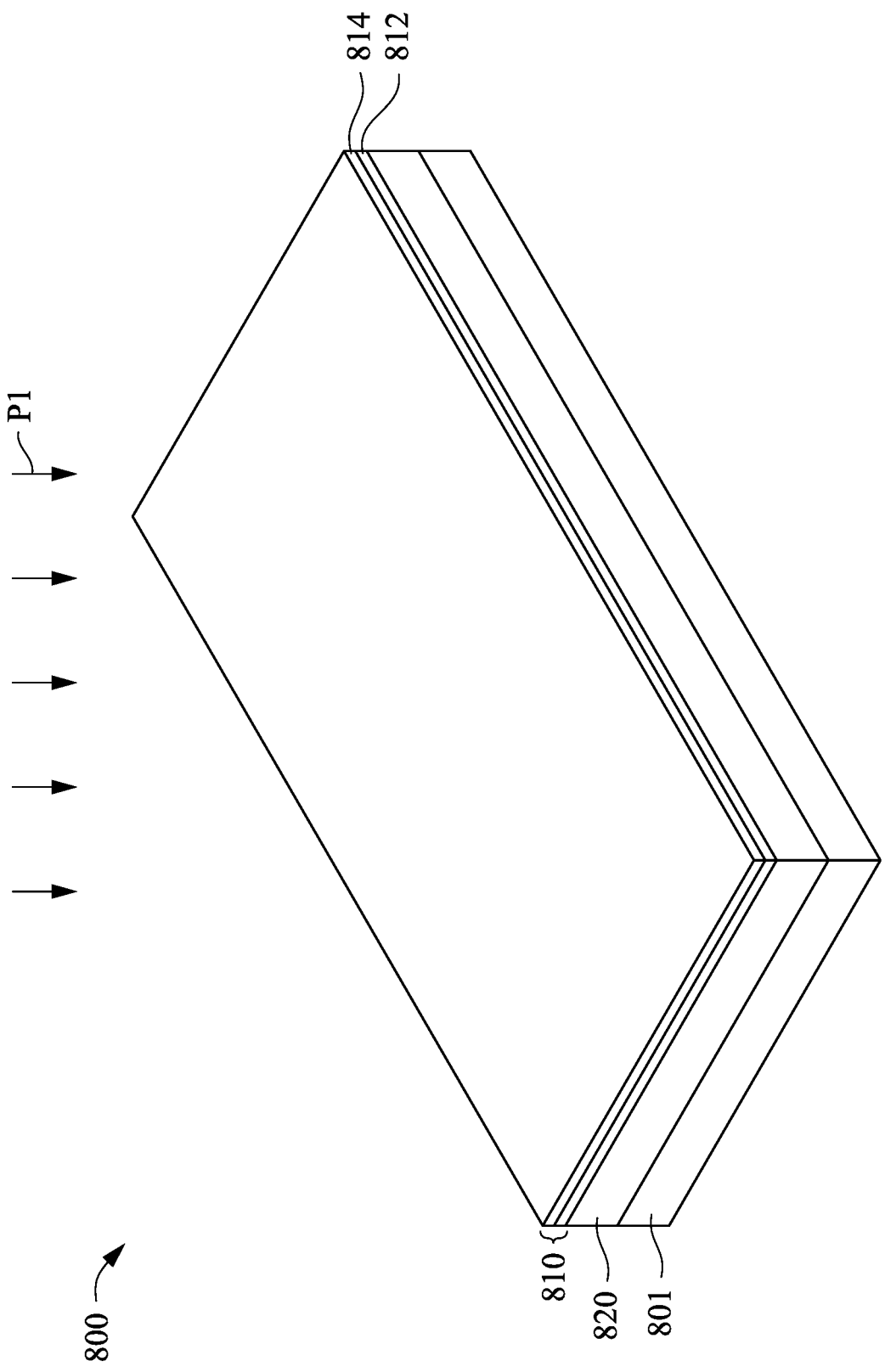
FIGS. 30A, 30B, and 30C are perspective views of the top gate TI FET at various stages of fabrication in accordance with some embodiments of the present disclosure.
Figure 30B:
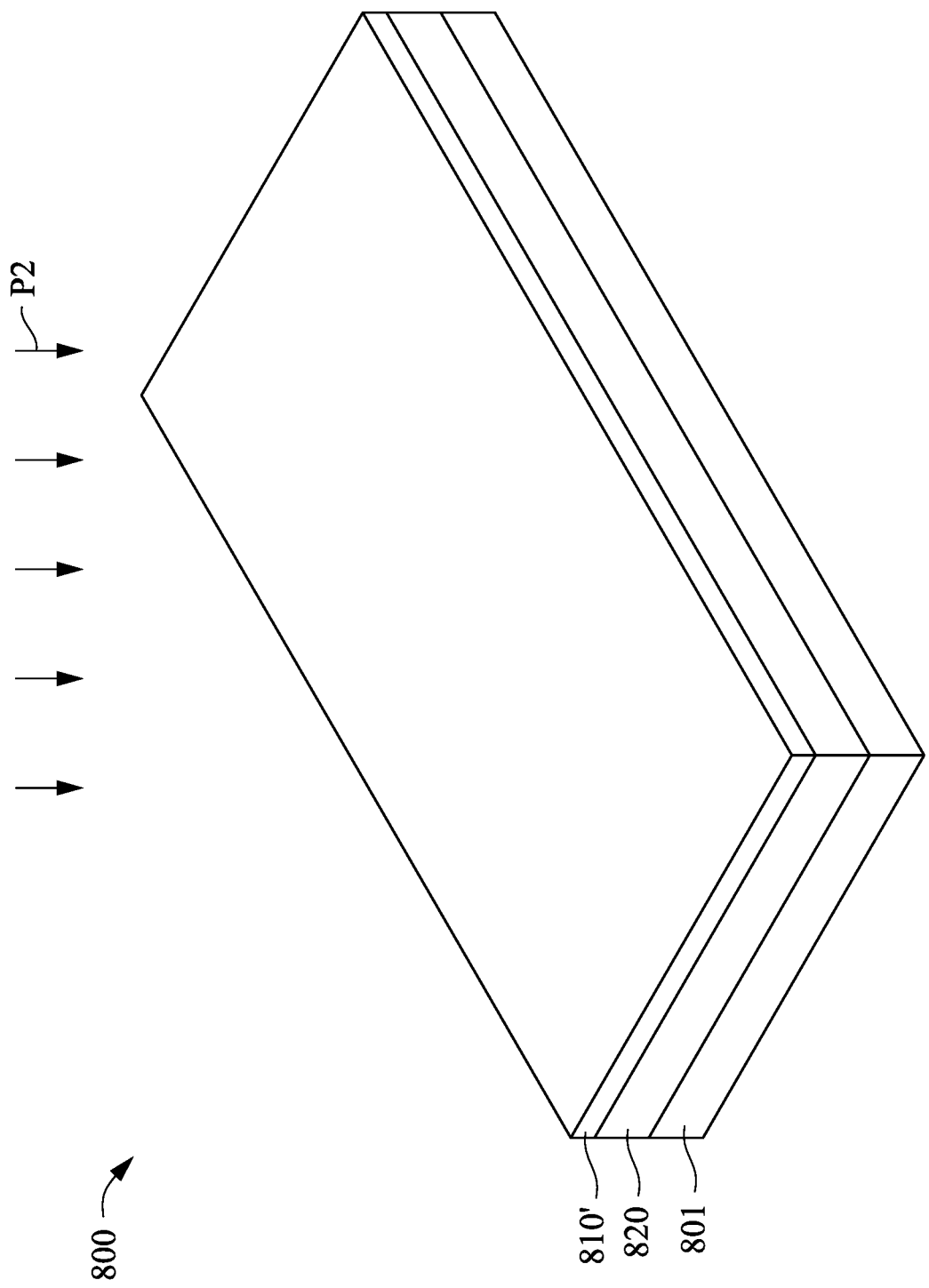
Figure 30C:
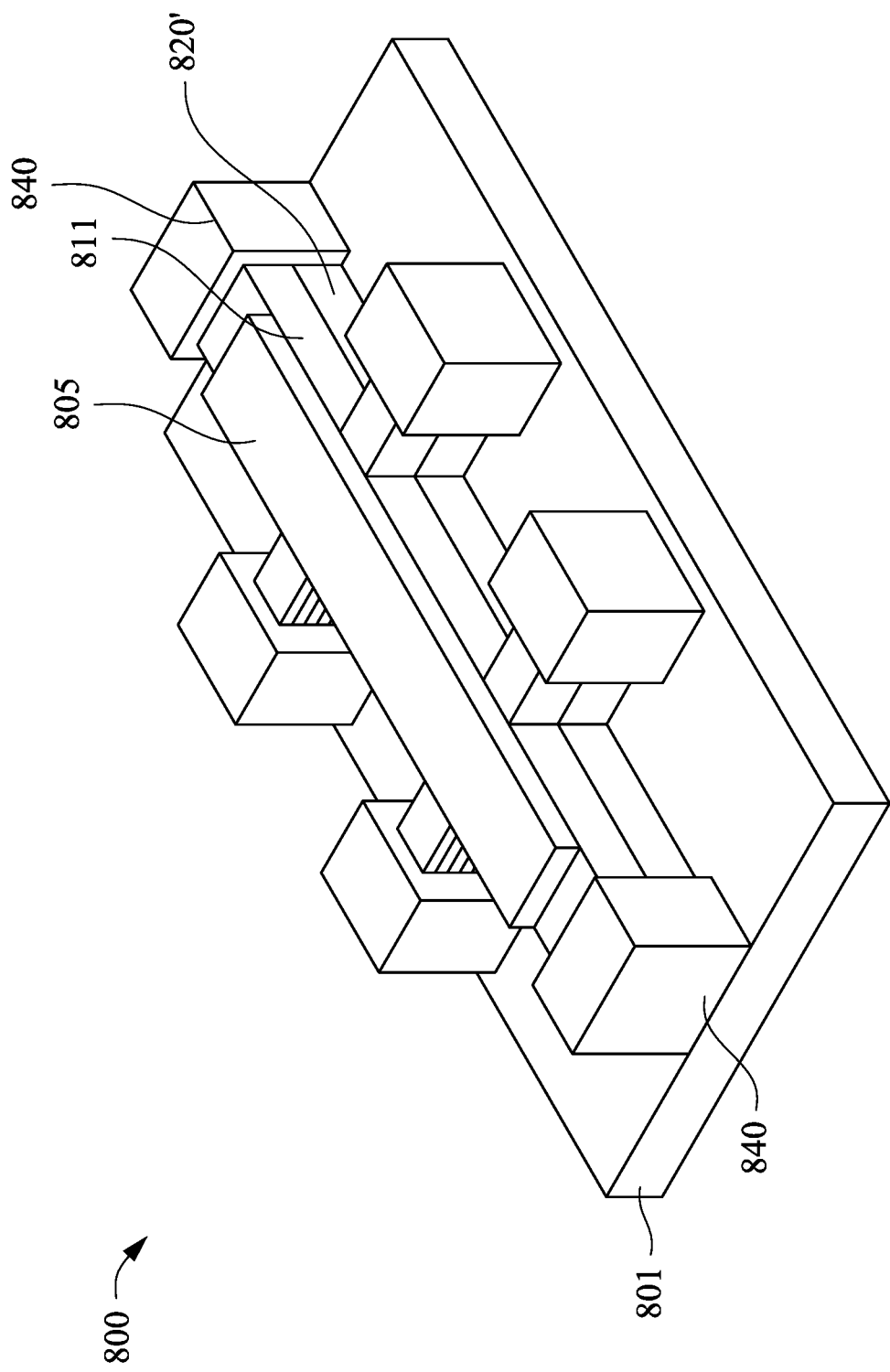

FIGS. 30A, 30B, and 30C are perspective views of the top gate TI FET 800 at various stages of fabrication in accordance with some embodiments of the present disclosure.

Reference is made to FIG. 30A. An active layer 820 is formed on a substrate 801. The substrate 801 and/or the active layer 820 is made of material that substantially the same as the substrate 801 and/or the active layer 820 shown in FIG. 29A and thus is not repeatedly described for the sake of brevity. Then, a dielectric stack 810 is formed over the active layer 820. In some embodiments, the dielectric stack 810 is a bi-layered structure and includes a first layer 812 and a second layer 814 which are made of different high-k dielectric materials. For example, the first layer 661 is made of $Y_2O_3$ and the second layer 668 is made of $Al_2O_3$. In some embodiments, the dielectric stack 662 may be substantially the same as the dielectric stack 210 shown in FIG. 10 and thus is not repeatedly described for the sake of brevity.

As shown in FIG. 30A, in some embodiments, the first layer 812 is disposed between the active layer 820 and the second layer 814 and is in contact with the active layer 820. The second layer 814 is separated from the active layer 820 and is in contact with the first layer 812.

In some embodiments, an atomic layer deposition (ALD) process P1 is employed to form the first and second layers 812. As a result, the thickness of the layer 812 can be controlled using cycle times of the ALD process P1. In some embodiments, the ALD process P1 may include a plurality of cycles (e.g., about 10 cycles to about 20 cycles) to form the first layer 812 with a thickness ranging from about 2.1 nm to about 2.5 nm, but the present disclosure is not limited thereto. For example, the ALD process P1 may include about 16 cycles. After the deposition of the first layer 812 made of $Y_2O_3$, the second layer 814 made of $Al_2O_3$ is deposited on the first layer 812 performed by another ALD process P1. In some embodiments, the ALD process P1 may include a plurality of cycles (e.g., about 50 cycles to about 60 cycles) to form the second layer 814 with a thickness ranging from about 4.8 nm to about 5.2 nm, but the present disclosure is not limited thereto. For example, the ALD process P1 may include about 56 cycles. Although the thicknesses of the first and second layers 666 and 668 are different, they are both less than about 10 nm, which in turn will be advantageous for dielectric enhancement using an annealing process P2 performed in a following stage (as shown in FIG. 30B). In some embodiments, the first and second layers 812 and 814 are in-situ formed in the same process apparatus (i.e., performed in the same ALD chamber). In some embodiments, the first and second layers 812 and 814 are ex-situ formed in different process apparatuses (i.e., performed in different ALD chambers).

Reference is made to FIG. 30B. After the forming of the dielectric stack 810, an annealing process P2 is performed on the dielectric stack 810. In this way, the resulting dielectric layer 810' can have a higher dielectric constant than the un-annealed dielectric stack 810. Moreover, the annealing process P2 will result in inter-diffusion between the first and second dielectric layers 812 and 814. In some embodiments, the inter-diffusion may result in merging the first and second dielectric layers 812 and 814 as the dielectric layer 810' without a distinguishable interface. Detailed conditions of the annealing process P2 and the resultant dielectric constant enhancement are discussed previous with respect to FIGS. 11A and 11B, and thus not repeated for the sake of brevity.

Reference is made to FIG. 30C. After the dielectric layer 810' is formed, the active layer 820 and the dielectric layer 810' may be patterned to form the active region 820' and the gate dielectric 811, and the resulting structure is shown in FIG. 30C. After the active region 820' and the gate dielectric 811 are formed, a metal layer is formed on the gate dielectric 811 and is patterned to form the gate electrode 805, and metal contacts 840 are further formed on the active region 820'.

FIG. 31A is a top view of a back gate TI FET 900 in accordance with some embodiments of the present disclosure. FIGS. 31B and 31C are different side views of the back gate TI FET 900 in accordance with some embodiments of the present disclosure.

Reference is made to FIGS. 31A-31C. There is illustrated a gate electrode 905, a dielectric stack 910, an active region 920, and metal contacts 940. In some embodiments, the gate electrode 905, the active region 920, the dielectric stack 910, and the metal contacts 940 are made of material substantially the same as that of the gate electrode 705, the active region 720', the gate dielectric stack 710', and the metal contacts 740 shown in FIGS. 29A-29G and thus are not repeatedly described for the sake of brevity.

The dielectric stack 910 is formed over the gate electrode 905. In some embodiments, the dielectric stack 910 may be a bi-layered structure or a multilayered structure, and any adjacent two of the layers in the dielectric stack 910 are different from each other. Take FIGS. 31B and 31C as exemplary examples, the dielectric stack 910 includes high-k dielectric layers 912, 914, 916, and 918. In the embodiment, the layer 912 is made of $Y_2O_3$, the layer 914 is made of $Al_2O_3$, the layer 916 is made of $Y_2O_3$, and the layer 918 is made of $Al_2O_3$, but the present disclosure is not limited thereto. In some embodiments, ALD processes P1 are employed to form the layers 912, 914, 916, and 918 of the dielectric stack 910.

Figure 32:
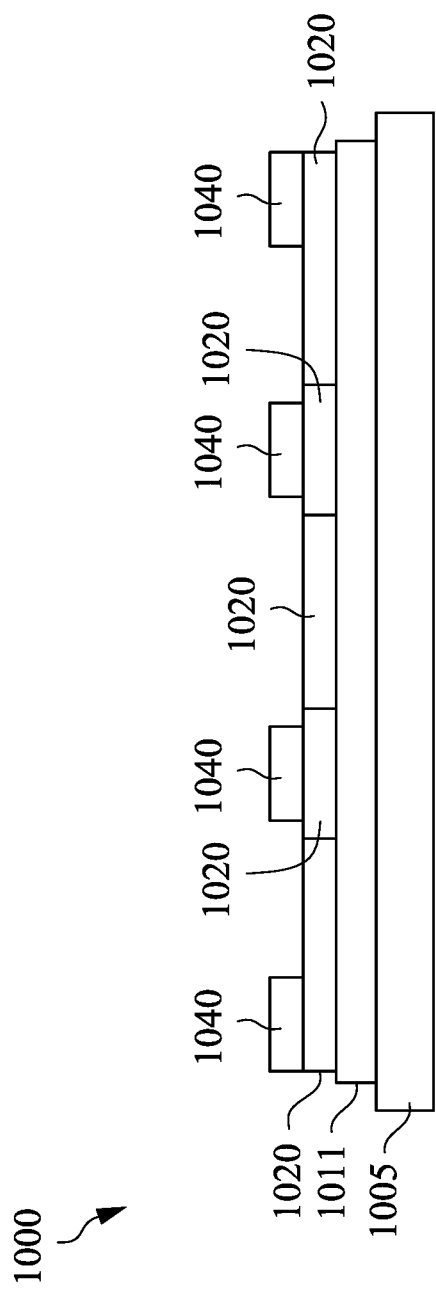
FIG. 32 is a side view of a back gate TI FET in accordance with some embodiments of the present disclosure.

FIG. 32 is a side view of a back gate TI FET (Topological insulator Field-effect transistor) 1000 in accordance with some embodiments of the present disclosure. Reference is made to FIG. 32. There is illustrated a gate electrode 1005, a gate dielectric 1011, an active region 1020, and metal contacts 1040. In some embodiments, the gate electrode 1005, the active layer 1020, the gate dielectric stack 1010, and the metal contacts 1040 are made of material substantially the same as that of the gate electrode 805, the active region 820', the gate dielectric stack 811, and the metal contacts 840 shown in FIGS. 30A-30C and thus are not repeatedly described for the sake of brevity.

The gate dielectric 1011 is formed over the gate electrode 1005. In some embodiments, the forming of the gate dielectric 1011 is to form a dielectric stack (may also refer to as a bi-layered formation) over the gate electrode 1005 firstly. The dielectric stack includes a plurality of layers which are made of high-k dielectric. In some embodiments, the dielectric stack includes a first layer made of $Y_2O_3$ and a second layer 814 made of $Al_2O_3$ formed by using atomic layer deposition (ALD) processes. Then, after the forming of the dielectric stack, an annealing process is performed on the dielectric stack to improve dielectric constant.

As shown in FIG. 32, the active region 1020 may be formed over the gate dielectric 1011 and will be used to form a channel and source/drain areas. The metal contacts 1040 are formed on the active region 1020.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that the gate dielectric formed of multiple high-k materials exhibits less absorption of moisture compared to the gate dielectric formed of a single high-k material. Another advantage is that the band gap of the gate dielectric formed of multiple high-k materials is tunable by controlling thickness ratio between these high-k materials. Another advantage is that the dielectric constant of the gate dielectric stack can be improved by controlling each layer of the gate dielectric stack thinner than 5 Å and/or by annealing the dielectric stack. Another advantage is that inter-diffusion between $Al_2O_3$ layer and GaAs substrate can be prevented by interposing another high-k dielectric layer between the $Al_2O_3$ layer and GaAs substrate, so as to improve thermal stability of an interface between high-k dielectrics and semiconductor.

In some embodiments, a method for manufacturing a semiconductor device includes forming a first high-k dielectric layer on a semiconductor substrate; forming a second high-k dielectric layer on the first high-k dielectric layer, in which the second high-k dielectric layer includes a material different from a material of the first high-k dielectric layer; annealing the first and second high-k dielectric layers, such that the first and second high-k dielectric layers are inter-diffused; and forming a gate electrode over the second high-k dielectric layer.

In some embodiments, a method for manufacturing a semiconductor device includes forming a first high-k dielectric layer on a semiconductor substrate, in which the first high-k dielectric layer has a thickness less than about 5 Å; forming a second high-k dielectric layer on the first high-k dielectric layer, in which the second high-k dielectric layer comprises a material different from a material of the first high-k dielectric layer; and forming a gate electrode over the second high-k dielectric layer.

In some embodiments, a semiconductor device includes a semiconductor substrate, a gate electrode, and a gate dielectric stack. The gate electrode is disposed over the semiconductor substrate. The gate dielectric stack is disposed between the gate electrode and the semiconductor substrate and includes a first high-k dielectric layer and a second high-k dielectric layer between the first high-k dielectric layer and the semiconductor substrate, in which the second high-k dielectric layer includes a material different from that of the first high-k dielectric layer. The second high-k dielectric layer has a thickness less than about 5 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a first high-k dielectric layer on and in direct contact with a semiconductor substrate;
    forming a second high-k dielectric layer on the first high-k dielectric layer, wherein the second high-k dielectric layer comprises a material different from a material of the first high-k dielectric layer;
    annealing the first and second high-k dielectric layers, such that the first and second high-k dielectric layers are inter-diffused; and
    forming a gate electrode over the second high-k dielectric layer.

2. The method of claim 1, wherein annealing the first and second high-k dielectric layers is performed prior to forming the gate electrode.

3. The method of claim 1, further comprising:
    forming a source/drain region in the semiconductor substrate after annealing the first and second high-k dielectric layers.

4. The method of claim 1, wherein forming the first high-k dielectric layer comprises a first atomic layer deposition (ALD) process, forming the second high-k dielectric layer comprises a second ALD process, and a number of deposition cycles of the first ALD process is less than a number of deposition cycles of the second ALD process.

5. The method of claim 1, wherein forming the second high-k dielectric layer is performed such that the second high-k dielectric layer has a thickness greater than a thickness of the first high-k dielectric layer.

6. The method of claim 1, wherein a dielectric constant of the first high-k dielectric layer is greater than a dielectric constant of the second high-k dielectric layer.

7. The method of claim 1, wherein the first high-k dielectric layer is in contact with the second high-k dielectric layer.

8. The method of claim 1, wherein the first high-k dielectric layer is an aluminum-free high-k dielectric layer, and the second high-k dielectric layer is an aluminum-containing high-k dielectric layer.

9. The method of claim 8, wherein the semiconductor substrate is a gallium arsenide (GaAs) substrate in contact with the aluminum-free high-k dielectric layer.

10. The method of claim 8, wherein the semiconductor substrate is a GaAs substrate separated from the aluminum-containing high-k dielectric layer.

11. A method for manufacturing a semiconductor device, the method comprising:
    forming a first high-k dielectric layer on a III-V compound-containing semiconductor substrate, wherein the first high-k dielectric layer has a thickness less than about 5 A;
    forming a second high-k dielectric layer that is an aluminum-containing high-k dielectric layer on the first high-k dielectric layer, wherein the second high-k dielectric layer comprises a material different from a material of the first high-k dielectric layer;
    forming a third high-k dielectric layer on the second high-k dielectric layer; and
    forming a gate electrode over the third high-k dielectric layer.

12. The method of claim 11, wherein a dielectric constant of the first high-k dielectric layer is greater than a dielectric constant of the second high-k dielectric layer.

13. The method of claim 11, wherein the first high-k dielectric layer is an aluminum-free high-k dielectric layer.

14. The method of claim 11, further comprising:
    forming a fourth high-k dielectric layer over the third high-k dielectric layer.

15. The method of claim 14, wherein the third high-k dielectric layer has the same material as the first high-k dielectric layer.

16. The method of claim 11, further comprising:
    implanting the III-V compound-containing semiconductor substrate with a dopant through the first and second high-k dielectric layers to form a source/drain region; and
    after implanting the III-V compound-containing semiconductor substrate, patterning the first and second high-k dielectric layers to expose the source/drain region.

17. The method of claim 11, wherein forming the first high-k dielectric layer on the III-V compound-containing semiconductor substrate is performed such that the first high-k dielectric layer is in direct contact with the III-V compound-containing semiconductor substrate.

18. A semiconductor device, comprising:
- a semiconductor substrate;
- a source/drain region within the semiconductor substrate;
- a gate electrode over the semiconductor substrate;
- a gate dielectric stack between the gate electrode and the semiconductor substrate and comprising a first high-k dielectric layer and a second high-k dielectric layer between the first high-k dielectric layer and the gate electrode, wherein the second high-k dielectric layer has a thickness less than about 5 Å, and the gate dielectric stack laterally extends past a first side of the source/drain region;
- a multilayer-dielectric stack at substantially the same level as the gate dielectric stack and laterally extending past a second side of the source/drain region opposite the first side of the source/drain region; and
- a source/drain contact over the source/drain region and laterally between the gate dielectric stack and the multilayer-dielectric stack.

19. The semiconductor device of claim 18, wherein the first high-k dielectric layer is aluminum-free.

20. The semiconductor device of claim 18, wherein the first high-k dielectric layer has a thickness less than about 5 Å.

* * * * *